United States Patent
Lee et al.

(10) Patent No.: US 11,280,935 B2
(45) Date of Patent: Mar. 22, 2022

(54) MULTIPHASE FLOW IN POROUS MEDIA

(71) Applicant: Schlumberger Technology Corporation, Sugar Land, TX (US)

(72) Inventors: Seong Lee, Houston, TX (US); Yalchin Efendiev, College Station, TX (US); Hamdi Tchelepi, Belmong, CA (US)

(73) Assignees: CHEVRON U.S.A. INC., San Ramon, CA (US); SCHLUMBERGER TECHNOLOGY CORPORATION, Sugar Land, TX (US)

( * ) Notice: Subject to any disclaimer, the term of this patent is extended or adjusted under 35 U.S.C. 154(b) by 596 days.

(21) Appl. No.: 15/571,255

(22) PCT Filed: Apr. 29, 2016

(86) PCT No.: PCT/US2016/029924
§ 371 (c)(1),
(2) Date: Nov. 1, 2017

(87) PCT Pub. No.: WO2016/178934
PCT Pub. Date: Nov. 10, 2016

(65) Prior Publication Data
US 2018/0329112 A1 Nov. 15, 2018

Related U.S. Application Data

(60) Provisional application No. 62/155,799, filed on May 1, 2015.

(51) Int. Cl.
*G01V 99/00* (2009.01)
*E21B 49/08* (2006.01)
*G06F 30/23* (2020.01)

(52) U.S. Cl.
CPC .............. *G01V 99/00* (2013.01); *E21B 49/08* (2013.01); *G01V 2210/66* (2013.01); *G06F 30/23* (2020.01)

(58) Field of Classification Search
None
See application file for complete search history.

(56) References Cited

U.S. PATENT DOCUMENTS

| | | | |
|---|---|---|---|
| 6,272,934 | B1 | 8/2001 | Rajan et al. |
| 8,949,096 | B2 | 2/2015 | Jolliff |
| 2003/0060988 | A1* | 3/2003 | Ginzburg ............... G06F 30/23 |
| | | | 702/50 |
| 2004/0167757 | A1 | 8/2004 | Struijs |
| 2004/0176937 | A1 | 9/2004 | Jenny et al. |

(Continued)

FOREIGN PATENT DOCUMENTS

EP 2732135 1/2013

OTHER PUBLICATIONS

Kozdon et al., Multi-D Upwinding for Multi Phase Transport in Porous Media, , Feb. 2-4, 2009, 2009 SPE Reservoir Simulation Symposium (Year: 2009).*

(Continued)

*Primary Examiner* — Brent A. Fairbanks

(57) ABSTRACT

A method can include receiving information associated with a geologic environment; based at least in part on the information, computing values associated with multiphase fluid flow in the geologic environment using a viscous flow upwind scheme and a buoyancy flow upwind scheme; and outputting at least a portion of the computed values.

14 Claims, 34 Drawing Sheets

(56) References Cited

U.S. PATENT DOCUMENTS

| | | | | |
|---|---|---|---|---|
| 2006/0184346 | A1* | 8/2006 | Panga | E21B 43/26 |
| | | | | 703/9 |
| 2008/0208539 | A1* | 8/2008 | Lee | G06F 30/23 |
| | | | | 703/1 |
| 2009/0319242 | A1 | 12/2009 | Lee et al. | |
| 2010/0057413 | A1 | 3/2010 | Lee et al. | |
| 2010/0088076 | A1* | 4/2010 | Koutsabeloulis | E21B 43/00 |
| | | | | 703/2 |
| 2012/0000669 | A1 | 1/2012 | Wu et al. | |
| 2012/0065950 | A1 | 3/2012 | Lu | |
| 2018/0010433 | A1* | 1/2018 | Wu | E21B 43/25 |

OTHER PUBLICATIONS

Baker, "Three-Phase Relative Permeability Correlations," SPE Conference Paper 1988, Tulsa, OK, pp. 539-553.

Bell, et al., "Conservation laws of mixed type describing three-phase flow in porous media," Society for Industrial and Applied Mathematics, Journal on Applied Mathematics, vol. 46, No. 6, pp. 1000-1017, Dec. 1986.

Brenier, et al., "Upstream Differencing for Multiphase Flow in Reservoir Simulation," SIAM Journal on Numerical Analysis, vol. 28, No. 3, pp. 685-696, Jun. 1991.

Crandal, et al., "Monotone Difference Approximations for Scalr Conservative Laws," Mathematics of Computation, vol. 34, No. 149, Jan. 1980, pp. 1-21.

Dietrich et al., "Three-Phase Oil Relative Permeability Models," SPE Conference Paper, New Orleans, LA, Oct. 1976.

Durlofsky, "A Triangle Based Mixed Finite Element—Finite Volume Technique for Modeling Two Phase Flow through Porous Media," Journal of Computational Physics vol. 105, Issue 2, Apr. 1993, pp. 252-266.

Enchery, et al., "Mathematical and Numerical Study of an Industrial Scheme for Two-Phase Flows in Porous Media under Gravity," Computational Methods in Applied Mathematics, vol. 2, 2002, No. 4, pp. 325-353.

Guzman et al., "Mathematical Properties of Three-Phase Flow Equations," SPE Journal, vol. 2, Sep. 1997, pp. 291-300.

Hamon et al., "Analysis of Hybrid Upwinding for Fully-Implicit Simulations of Three-Phase Flow with Gravity," SIAM Journal on Numerical Analysis, 2016, vol. 54, No. 3, pp. 1682-1712.

Heiba, et al., "Statistical Network Theory of Three-Phase Relative Permeabilities," SPE Conference Paper, Tulsa, OK, 1984, pp. 121-134.

Jackson et al., "Elliptic Regions and Stable Solutions for Three-Phase Flow in Porous Media," Transport in Porous Media, vol. 48, pp. 249-269, 2002.

Jaffre, "Flux calculation at the interface between two rock types for two phase flow in porous media," Transport in Porous Media, vol. 21, pp. 195-207, 1995.

Jenny, et al., "Unconditionally convergent nonlinear solver for hyperbolic conservation laws with s-shaped flux functions," Journal of Computational Physics, vol. 228, Issue 20, Nov. 2009, pp. 7497-7512.

Juanes et al., "Relative Permeabilities for Strictly Hyperbolic Models of Three-Phase Flow in Porous Media," Transport in Porous Media, vol. 57, Issue 2, pp. 125-152, 2004.

Kwok, et al., "Convergence of implicit monotone schemes with applications in multiphase flow in porous media," SIAM Journal on Numerical Analysis, 2008, vol. 46, No. 5, pp. 2662-2687.

Lee, et al., "Hybrid upwind discretization of nonlinear multiphase flow with gravity," Advances in Water Resources, vol. 82, Aug. 2015, pp. 27-38.

Oak, et al., "Three-Phase Relative Permeability of Berea Sandstone," Journal of Petroleum Technology, pp. 1057-1061, 1990.

Peaceman, "Fundamentals of Numerical Reservoir Simulation," Elsevier Science Publication, New York, 1977.

Sammon, "An Analysis of Upstream Differencing," SPE Reservoir Engineering, Aug. 1988, pp. 1053-1056.

Sanders, "On convergence of monotone finite difference schemes with variable differencing," Mathematics of Computation, vol. 40, 1983, pp. 91-106.

Stone, "Estimation of Three-Phase Relative Permeability and Residual Oil Data," Journal of Canadian Petroleum Technology, vol. 12, 1973, pp. 53-61.

Trangenstein, "Three-phase flow with gravity," Contemporary Mathematics, vol. 100, 1989, pp. 147-159.

Wang, et al., "Trust-region based solver for nonlinear transport in heterogeneous porous media," Journal of Computational Physics, vol. 253, Nov. 15, 2013, pp. 114-137.

Younis, et al., "Adaptively Localized Continuation-Newton-Method-Nonlinear Solvers That Converges All the Time," SPE Journal, pp. 526-544, 2010.

Adimuthi, et al., "Godunov-type methods for conservative laws with a flux function discontinuous in space," Society for Industrial and Applied Mathematics Journal on Numerical Analysis, vol. 42, No. 1, pp. 179-208, 2004.

Coats, "A Note on IMPES and Some IMPES-Based Simulation Models," SPE Journal, 5 (3), Sep. 2000, pp. 245-251.

Jenny, et al., "An adaptive fully implicit multi-scale finite-vol. algorithm for multi-phase flow in porous media," Journal of Computational Physics, vol. 217, Issue 2, 2006, pp. 627-641.

Leveque, "Numerical Methods for Conservation Laws," Birkhauser Verlag, Basel, 1992.

Mishra, et al., "On the upstream mobility scheme for two-phase flow in porous media," Computational Geosciences, 14, pp. 105-124, 2010.

Tchelepi, et al., "Adaptive Multiscale Finite-Volume Framework for Reservoir Simulation," SPE Journal, Jun. 2007, pp. 188-195.

Tveit et al., "Errors in the upstream mobility scheme for countercurrent two-phase flow in heterogeneous porous media," Computational Geosciences, Jun. 2012, vol. 16, Issue 3, pp. 809-825.

International Search Report and Written Opinion for the equivalent International patent application PCT/US2016/029924 dated Aug. 16, 2016.

International Preliminary Report on Patentability for the equivalent International patent application PCT/US2016/029924 dated Nov. 16, 2017.

Li and Tchelepi, Numerical Trust Region Newton Solver for Multiphase Transport in Porous Media Based on Detailed Nonlinear Analysis, SPE-173267-MS, Feb. 23-25, 2015 (24 pages).

Li and Tchelepi "Nonlinear Analysis of Newton-based Solvers for Multiphase Transport in Porous Media with Viscous and Buoyancy Forces", Conference Proceedings, ECMORXIV—14th European Conference on the Mathematics of Oil Recovery, Sep. 2014, vol. 2014, p. 1-15 (https://doi.org/10.3997/2214-4609.20141768) (15 pages).

S. K. Godunov, "A difference method for numerical calculation of discontinuous solutions of the equations of hydrodynamics", Mat. Sb. (N.S.), 47(89):3 (1959), 271-306: English language translation by I. Bohachevsky (48 pages).

K. Aziz, Antonin Settari, Petroleum Reservoir Simulation, Springer Netherlands, 1979—476 pages, attached are title page, preface and first page of table of contents (4 pages).

Norwegian Search Report dated Mar. 4, 2021 in counterpart Norwegian Application No. 20171860.

Norwegian Search Report dated Mar. 4, 2021 in counterpart Norwegian Application No. 20171860. Corrected office action provided by Norway agent via email dated Aug. 23, 2021.

* cited by examiner

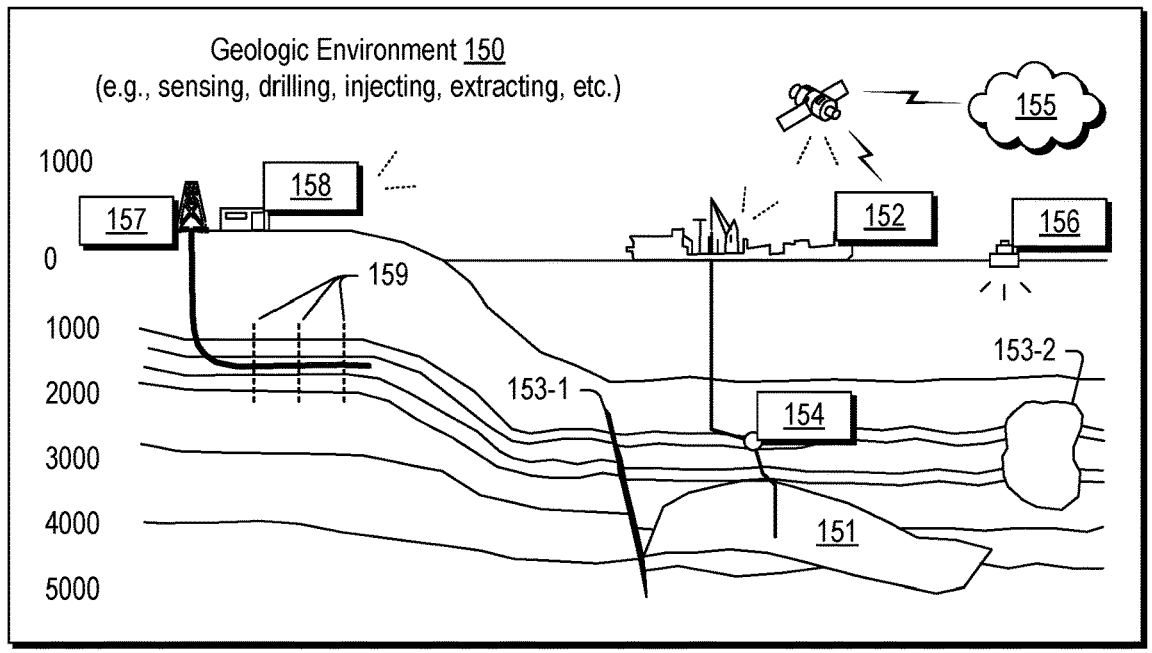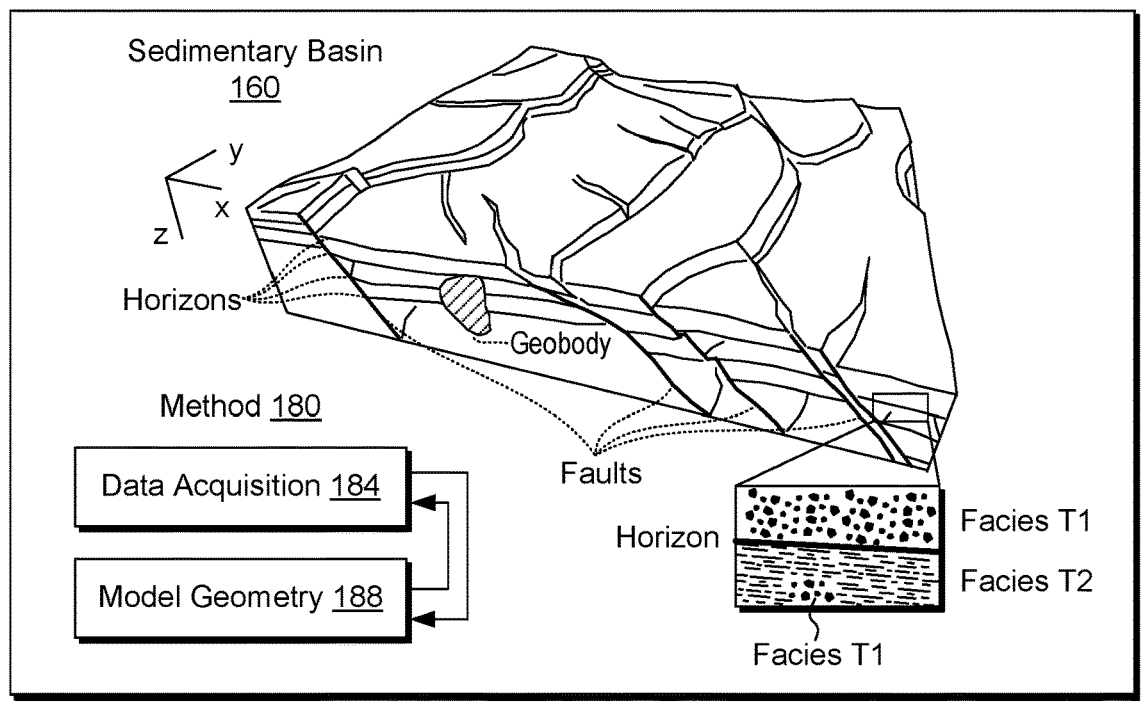
Fig. 1

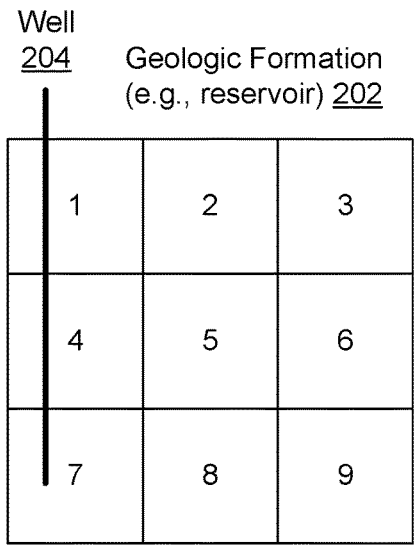

Full Matrix for Reservoir and Well 206

| | P S | P S | P S | P S | P S | P S | P S | P S | P S | P |
|---|---|---|---|---|---|---|---|---|---|---|
| 1 | X X<br>X X | X X<br>X X | | X X<br>X X | | | | | | X<br>X |
| 2 | X X<br>X X | X X<br>X X | X X<br>X X | | X X<br>X X | | | | | |
| 3 | | X X<br>X X | X X<br>X X | | | X X<br>X X | | | | |
| 4 | X X<br>X X | | | X X<br>X X | X X<br>X X | | X X<br>X X | | | X<br>X |
| 5 | | X X<br>X X | | X X<br>X X | X X<br>X X | X X<br>X X | | X X<br>X X | | |
| 6 | | | X X<br>X X | | X X<br>X X | X X<br>X X | | | X X<br>X X | |
| 7 | | | | X X<br>X X | | | X X<br>X X | X X<br>X X | | X<br>X |
| 8 | | | | | X X<br>X X | | X X<br>X X | X X<br>X X | X X<br>X X | |
| 9 | | | | | | X X<br>X X | | X X<br>X X | X X<br>X X | |
| | X X | | | X X | | | X X | | | X |

 Diagonal Terms

 Off Diagonal Terms

Fig. 2

Method 310
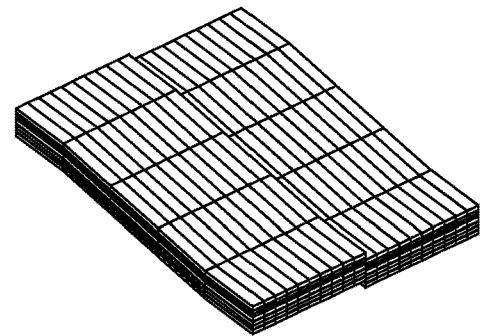
GRID, EDIT Sections
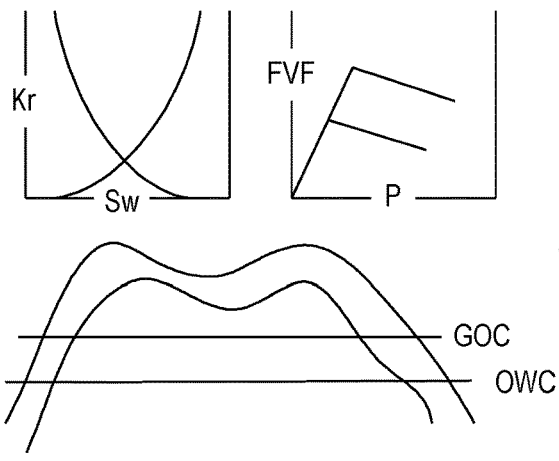
PROPS, REGIONS, SOLUTION Sections
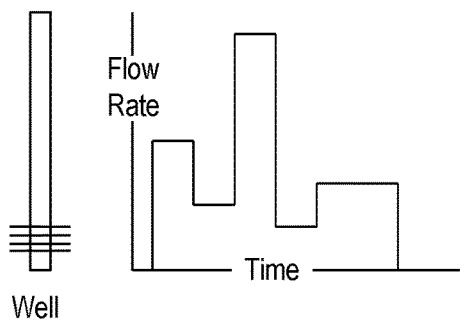
SCHEDULE Section
320
Calculate Pore Volumes, Transmissibilities, Depths and NNCs.
340
Initialize, calculate initial saturations, pressures and fluids in place
360
Define wells and surface facilities. Advance through time by material balance for ind. cells with wells as sinks or sources
Fig. 3

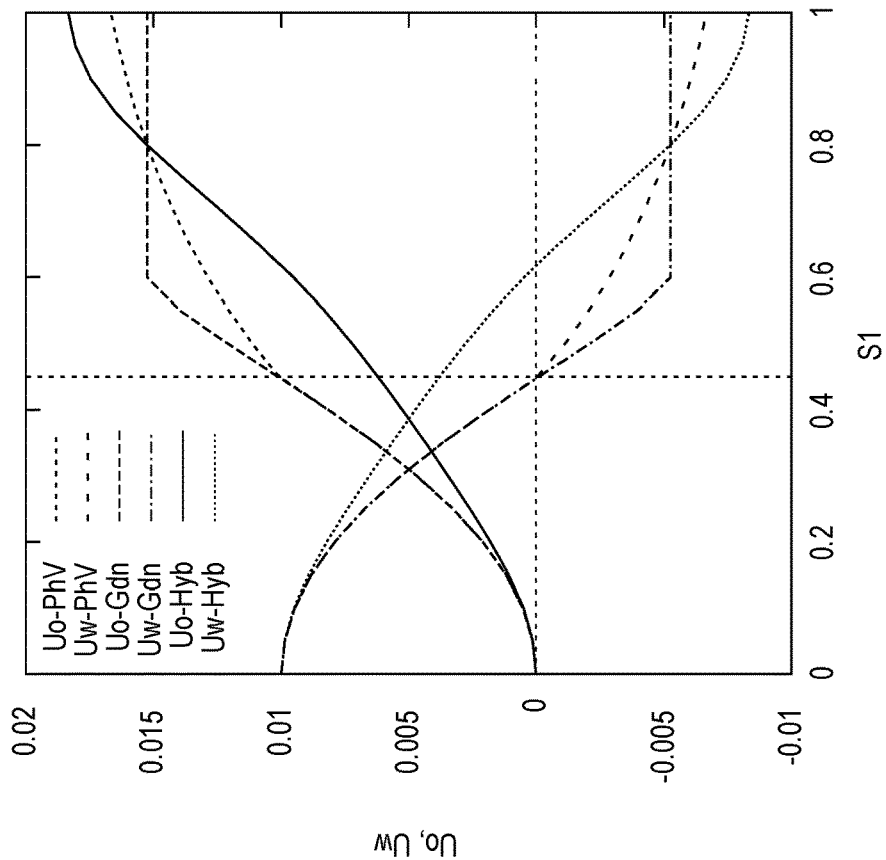
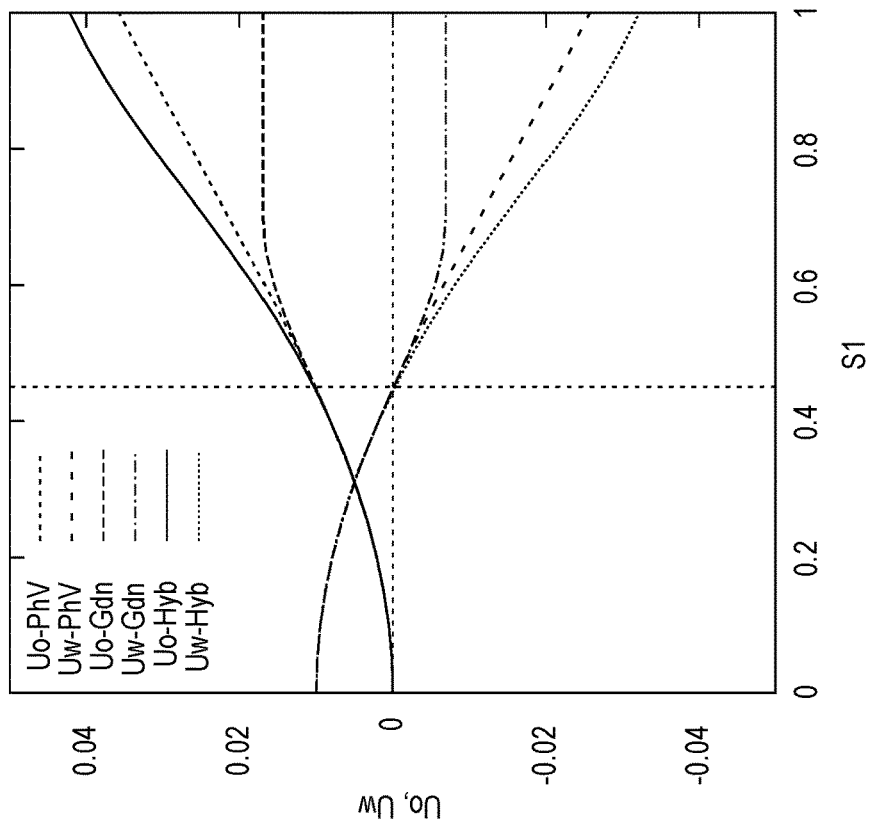
Fig. 11A
Fig. 11B

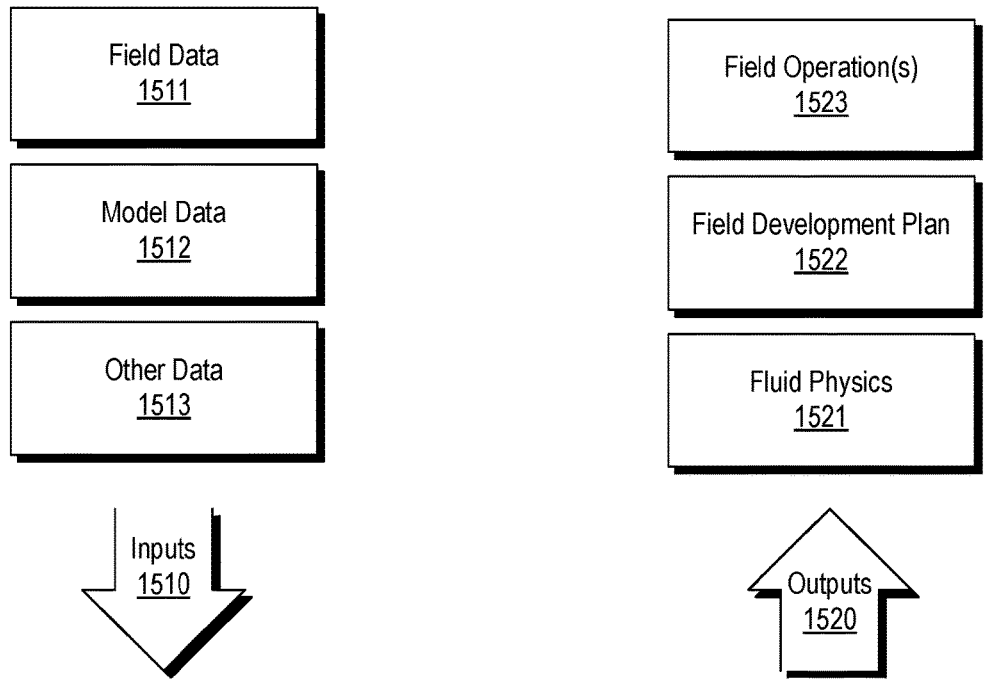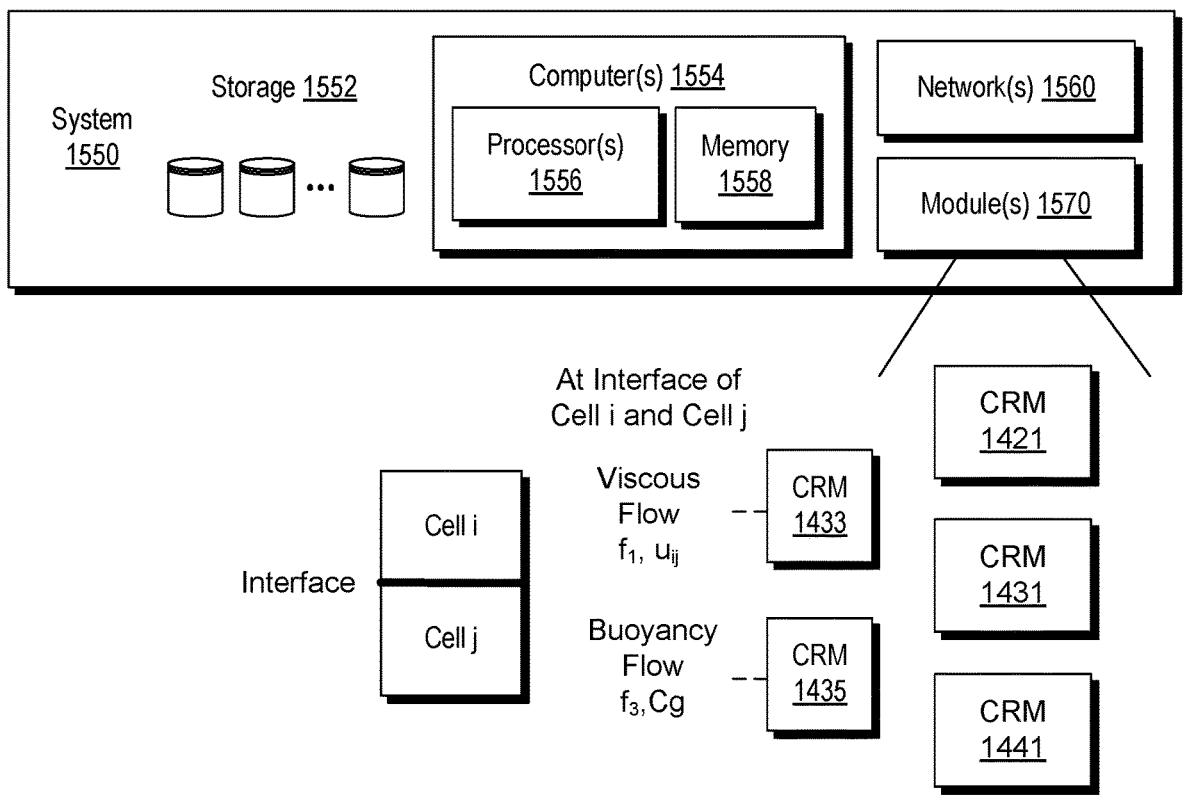
Fig. 15

MULTIPHASE FLOW IN POROUS MEDIA

RELATED APPLICATIONS

This application claims priority to and the benefit of a U.S. Provisional Application having Ser. No. 62/155,799, filed 1 May 2015, which is incorporated by reference herein.

BACKGROUND

A geologic environment can include one or more fluids that may be in, adjacent to, etc., one or more porous media. For example, one or more fluids may exist in reservoir rock. Depending on conditions such as pressure, temperature, etc., fluid or fluids may exist in multiple phases (e.g., consider liquid and gas phases). Porous media may be characterized, for example, by one or more properties, such as, for example, permeability. As an example, fluid may be move or flow within a geologic environment due to one or more types of forces (e.g., pressure forces, buoyancy forces, etc.). For example, an operation may include drilling a bore into reservoir rock characterized by one or more permeabilities and flowing one or more fluids from the reservoir rock to the bore or, for example, flowing one or more fluids from the bore to the reservoir rock. Modeling of physical phenomena may assist in planning, executing, etc., one or more operations.

SUMMARY

A method can include receiving information associated with a geologic environment; based at least in part on the information, computing values associated with multiphase fluid flow in the geologic environment using a viscous flow upwind scheme and a buoyancy flow upwind scheme; and outputting at least a portion of the computed values. A system can include a processor; memory operatively coupled to the processor; and one or more modules stored in the memory that include processor-executable instructions to instruct the system to receive information associated with a geologic environment; based at least in part on the information, compute values associated with multiphase fluid flow in the geologic environment using a viscous flow upwind scheme and a buoyancy flow upwind scheme; and output at least a portion of the computed values. One or more computer-readable storage media can include processor-executable instructions where the instructions include instructions to: receive information associated with a geologic environment; based at least in part on the information, compute values associated with multiphase fluid flow in the geologic environment using a viscous flow upwind scheme and a buoyancy flow upwind scheme; and output at least a portion of the computed values. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 1 illustrates examples of geologic environments;

FIG. 2 illustrates an example of a geologic environment and an associated matrix;

FIG. 3 illustrates an example of a method;

FIGS. 11A and 11B illustrate example plots of phase velocities associated with a two cell model and specified boundary conditions;

FIG. 15 illustrates an example of a system;

DETAILED DESCRIPTION

Figure 4B:
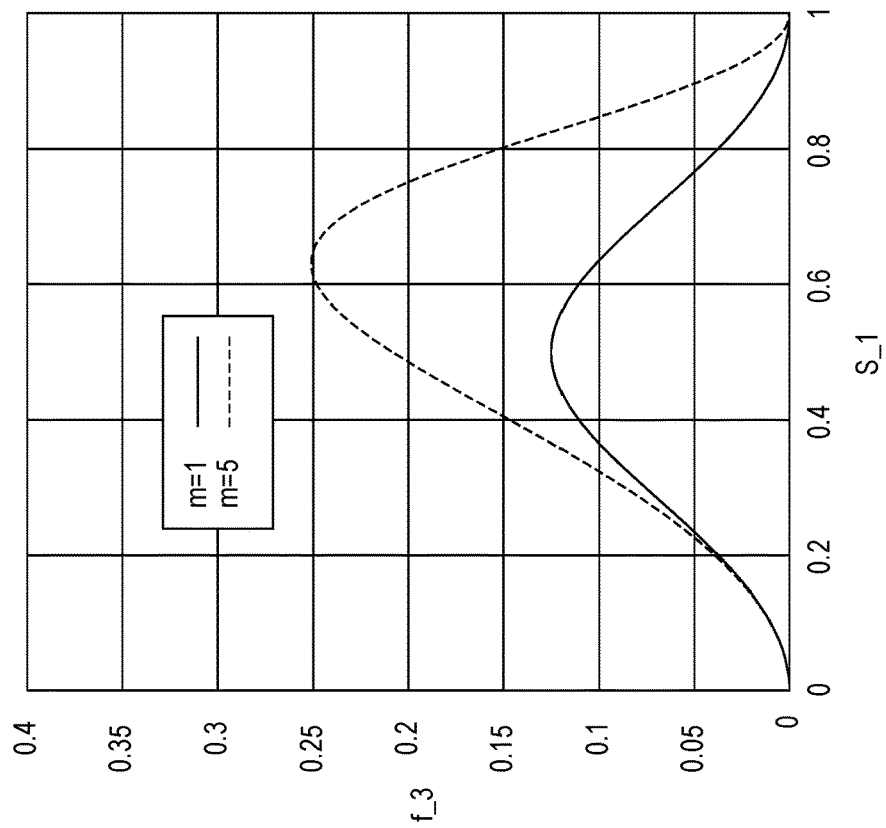
FIGS. 4A and 4B illustrate example plots of fractional flow.

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

FIG. 1 shows an example of a geologic environment 150 that may include layers (e.g., stratification) that include a reservoir 151 and one or more other features such as a fault 153-1, a geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via drilling and completing a well, fracturing, injecting, extracting, monitoring, etc.). As an example, the equipment 157 and/or 158 may include components, a system, systems, etc. for fracturing, seismic sensing, analysis of seismic data, assessment of one or more fractures, etc.

As an example, a system may be used to perform one or more workflows. A workflow may be a process that includes a number of worksteps. A workstep may operate on data, for example, to create new data, to update existing data, etc. As an example, a workflow may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL™ software, for example, that operates on seismic data, seismic attribute(s), etc. As an example, a workflow may be a process implementable in the OCEAN™ framework. As an example, a workflow may implement one or more simulator such as, for example, the ECLIPSE™ simulator as a reservoir simulator or the INTERSECT™ reservoir simulator (Schlumberger Limited, Houston Tex.). As an example, a workflow may include one or more worksteps that access a module such as a plug-in (e.g., external executable code, etc.).

FIG. 1 also shows an example of a sedimentary basin 160 (e.g., a geologic environment), an example of a method 180 for model building (e.g., for a simulator, etc.).

As an example, reservoir simulation, petroleum systems modeling, etc. may be applied to characterize various types of subsurface environments, including environments such as those of FIG. 1.

In FIG. 1, the sedimentary basin 160, which is a geologic environment, includes horizons, faults, one or more geobodies and facies formed over some period of geologic time. These features are distributed in two or three dimensions in space, for example, with respect to a Cartesian coordinate system (e.g., x, y and z) or other coordinate system (e.g., cylindrical, spherical, etc.). As shown, the model building method 180 includes a data acquisition block 184 and a model geometry block 188. Some data may be involved in building an initial model and, thereafter, the model may optionally be updated in response to model output, changes in time, physical phenomena, additional data, etc. As an example, data for modeling may include one or more of the following: depth or thickness maps and fault geometries and timing from seismic, remote-sensing, electromagnetic, gravity, outcrop and well log data. Furthermore, data may include depth and thickness maps stemming from facies variations (e.g., due to seismic unconformities) assumed to following geological events ("iso" times) and data may include lateral facies variations (e.g., due to lateral variation in sedimentation characteristics).

To proceed to modeling of geological processes, data may be provided, for example, data such as geochemical data (e.g., kerogen type, organic richness, etc.), timing data (e.g., from paleontology, radiometric dating, magnetic reversals, rock and fluid properties, etc.) and boundary condition data (e.g., heat-flow history, surface temperature, paleowater depth, etc.).

In basin and petroleum systems modeling, quantities such as temperature, pressure and porosity distributions within the sediments may be modeled, for example, by solving partial differential equations (PDEs) using one or more numerical techniques. Modeling may also model geometry with respect to time, for example, to account for changes stemming from geological events (e.g., deposition of material, erosion of material, shifting of material, etc.).

A commercially available modeling framework marketed as the PETROMOD™ framework (Schlumberger Limited, Houston, Tex.) includes features for input of various types of information (e.g., seismic, well, geological, etc.) to model evolution of a sedimentary basin. The PETROMOD™ framework provides for petroleum systems modeling via input of various data such as seismic data, well data and other geological data, for example, to model evolution of a sedimentary basin. The PETROMOD™ framework may predict if, and how, a reservoir has been charged with hydrocarbons, including, for example, the source and timing of hydrocarbon generation, migration routes, quantities, pore pressure and hydrocarbon type in the subsurface or at surface conditions. In combination with a framework such as the PETREL™ framework, the ECLIPSE™ simulator, the INTERSECT™ simulator, etc., workflows may be constructed to provide basin-to-prospect scale exploration solutions. Data exchange between frameworks can facilitate construction of models, analysis of data (e.g., PETROMOD™ framework data analyzed using PETREL™ framework capabilities, ECLIPSE™ simulator capabilities, the INTERSECT™ simulator capabilities, etc.), and coupling of workflows.

As mentioned, for application of a numerical technique, equations may be discretized using a grid that includes nodes, cells, etc. To represent features in a geologic environment, a structural model may assist with properly locating nodes, cells, etc. of a grid for use in simulation using one or more numerical techniques. As an example, a structural model may itself include a mesh, which may, at times be referred to as a grid.

As to numerical techniques, a numerical technique such as the finite difference method can include discretizing a 1D differential heat equation for temperature with respect to a spatial coordinate to approximate temperature derivatives (e.g., first order, second order, etc.). Where time is of interest, a derivative of temperature with respect to time may also be provided. As to the spatial coordinate, the numerical technique may rely on a spatial grid that includes various nodes where a temperature will be provided for each node upon solving the heat equation (e.g., subject to boundary conditions, generation terms, etc.). Such an example may apply to multiple dimensions in space (e.g., where discretization is applied to the multiple dimensions). Thus, a grid may discretize a volume of interest (VOI) into elementary elements (e.g., cells or grid blocks) that may be assigned or associated with properties (e.g. porosity, rock type, etc.), which may be germane to simulation of physical processes (e.g., fluid flow, reservoir compaction, etc.).

As another example of a numerical technique, consider the finite element method where space may be represented by one dimensional or multi-dimensional "elements". For one spatial dimension, an element may be represented by two nodes positioned along a spatial coordinate. For multiple spatial dimensions, an element may include any number of nodes. Further, some equations may be represented by certain nodes while others are represented by fewer nodes (e.g., consider an example for the Navier-Stokes equations where fewer nodes represent pressure). The finite element method may include providing nodes that can define triangular elements (e.g., tetrahedra in 3D, higher order simplexes in multidimensional spaces, etc.) or quadrilateral elements (e.g., hexahedra or pyramids in 3D, etc.), or polygonal elements (e.g., prisms in 3D, etc.). Such elements, as defined by corresponding nodes of a grid, may be referred to as grid cells.

Yet another example of a numerical technique is the finite volume method. For the finite volume method, values for model equation variables may be calculated at discrete places on a grid, for example, a node of the grid that includes a "finite volume" surrounding it (e.g., consider a "center" node of a grid block that represents a finite volume). The finite volume method may apply the divergence theorem for evaluation of fluxes at surfaces of each finite volume such that flux entering a given finite volume equals that leaving to one or more adjacent finite volumes (e.g., to adhere to conservation laws). For the finite volume method, nodes of a grid may define grid cells (e.g., grid blocks).

FIG. 2 shows an example of a geologic formation 202 and a well 204 and an example of a corresponding matrix 206 (e.g., a Jacobian matrix of derivatives, etc.). As shown, the geologic formation 202 is spatially discretized into nine cells that are regularly ordered in space as three layers with three cells in each layer. In the simplistic representation of the geologic formation 202 of FIG. 2, the cells are numbered 1 to 9 and their corresponding equations for pressure (P) and saturation (S) can be represented readily in the matrix 206 as diagonal terms and various off diagonal terms that may define a band-width (e.g., a banded matrix). For example, cell 1 has neighboring cells 2 and 4 that result in off diagonal terms (see, e.g., the entries in column 1, rows 2 and 4). In the example of FIG. 2, the presence of the well 204 introduces additional terms to the system of equations for the geologic formation 202. As shown, these additional terms appear along a border of the matrix 206 as associated with cells 1, 4 and 7. Thus, the matrix 206 includes diagonal terms and various off diagonal terms that may collectively define a band-width as well as border terms that may define a border width.

As explained with respect to FIG. 2, characteristics of a spatial grid (e.g., structured, unstructured, etc.) can dictate how equations are setup in a simulator (e.g., matrix size, condition, sparseness, etc.), which may impact computational resource demands, computation time, convergence, etc. As an example, a structured grid may provide a matrix (e.g., a Jacobian matrix) that may be less sparse, more "organized", etc., when compared to a matrix associated with an unstructured grid. Based on such factors, a reservoir simulator may be configured to perform simulations of geologic formations represented by structured grids.

FIG. 3 shows an example of a method 310 that includes a calculation block 320 for calculating pore volumes, transmissibilities, depths and NNCs, an initialization and calculation block 340 for initializing and calculating initial saturations, pressure and fluids in place, and a definition and time progression block 360 for defining one or more wells and surface facilities and advancing through time, for example, via material balances for individual cells of a grid cell model of a geologic formation (e.g., with the one or more wells as individual sinks and/or sources).

As an example, a grid cell model can include grid cells where properties are defined with respect to a position or positions of a grid cell. For example, a property may be defined as being at a centroid of a grid cell. As an example, consider cell properties such as porosity (e.g., a PORO parameter), permeability in an x-direction (e.g., a PERMX parameter), permeability in a y-direction (e.g., a PERMY parameter), permeability in a z-direction (e.g., a PERMZ parameter) and net-to-gross ratio (e.g., NTG) being defined as averages for a cell at a center of a cell. In such an example, the directions x, y and z may correspond to directions of indices (e.g., I, J and K) of a grid that may model a geologic formation.

As to the initialization and calculation block 340, for an initial time (e.g., t0), saturation distribution within a grid model of a geologic formation and pressure distribution within the grid model of the geologic formation may be set to represent an equilibrium state (e.g., a static state or "no-flow" state), for example, with respect to gravity. As an example, to approximate the equilibrium state, calculations can be performed. As an example, such calculations may be performed by one or more modules. As an example, a reservoir simulator may include a module for initialization using data to compute capillary and fluid gradients, and hence fluid saturation densities in individual cells of a grid model that represents a geologic formation.

Initialization aims to define fluid saturations in individual cells such that a "system" being modeled is in an equilibrium state (e.g., where no external forces are applied, it can be that no fluid flow takes place in a reservoir, a condition that may not be obeyed in practice). As an example, consider oil-water contact and assume no transition zone, for example, where water saturation is unity below an oil-water contact and at connate water saturation above the contact. A cell (e.g., or grid cell) may represent a point or points in space for purposes of simulating a geologic formation. Where an individual cell represents a volume and where that individual cell includes, for example, a center point for definition of properties, within the volume of that individual cell, the properties may be constant (e.g., without variation within the volume). In such an example, that individual cell includes one value per property, for example, one value for water saturation. As an example, an initialization process can include selecting a value for individual properties of individual cells.

As an example, saturation distribution may be generated based on one or more types of information. For example, saturation distribution may be generated from seismic information and saturation versus depth measurements in one or more boreholes (e.g., test wells, wells, etc.).

As mentioned, a reservoir simulator may advance in time. As an example, a numeric solver may be implemented that can generate a solution for individual time increments (e.g., points in time). As an example, a solver may implement an implicit solution scheme and/or an explicit solution scheme, noting that an implicit solution scheme may allow for larger time increments than an explicit scheme. Times at which a solution is desired may be set forth in a "schedule". For example, a schedule may include smaller time increments for an earlier period of time followed by larger time increments.

A solver may implement one or more techniques to help assure stability, convergence, accuracy, etc. For example, when advancing a solution in time, a solver may implement sub-increments of time; however, an increase in the number of increments can increase computation time. As an example, an adjustable increment size may be used, for example, based on information of one or more previous increments.

As an example, a numeric solver may implement one or more of a finite difference approach, a finite element approach, a finite volume approach, etc. As an example, the ECLIPSE® reservoir simulator can implement central differences for spatial approximation and forward differences in time. As an example, a matrix that represents grid cells and associated equations may be sparse, diagonally banded and blocked as well as include off-diagonal entries.

As an example, a solver may implement an implicit pressure, explicit saturation (IMPES) scheme. Such a scheme may be considered to be an intermediate form of explicit and implicit techniques. In an IMPES scheme, saturations can be updated explicitly while pressure is solved implicitly. Another type of scheme is a fully implicit scheme (e.g., fully implicit method, FIM). Examples of variations of such schemes include sequential FIM schemes, sequential explicit schemes, etc. Various types of schemes exist, which may be implemented using one or more types of numerical techniques (e.g., finite difference, finite element, finite volume, etc.).

As governing equations tend to be non-linear (e.g., compositional, black oil, etc.), a Newton-Raphson type of technique may be implemented, which includes determining derivatives, iterations, etc. For example, a solution may be found by iterating according to the Newton-Raphson scheme where such iterations may be referred to as non-linear iterations, Newton iterations or outer iterations. Where one or more error criteria are fulfilled, the solution procedure has converged, and a converged solution has been found. Thus, within a Newton iteration, a linear problem is solved by performing a number of linear iterations, which may be referred to as inner iterations.

As an example, a solution scheme may be represented by the following pseudo-algorithm:

```
// Pseudo-algorithm for Newton-Raphson for systems
initialize(v);
do {
    //Non-linear iterations
    formulate_non_linear_system(v);
    make_total_differential(v);
    do {
        // Linear iterations:
        update_linear_system_variables(v);
    }
    while((linear_system_has_not_converged(v));
    update_non_linear_system_after_linear_convergence(v);
}
while((non_linear_system_has_not_converged(v))
```

As an example, a solver may perform a number of inner iterations (e.g., linear) and a number of outer iterations (e.g., non-linear). As an example, a number of inner iterations may be of the order of about 10 to about 20 within an outer iteration while a number of outer iterations may be about ten or less for an individual time increment.

As an example, a method can include a reception block for receiving data, a simulation block for simulating physical phenomena and an output block for outputting results. Such a method may include gridding (e.g., or meshing) a multidimensional space that represents a geologic environment and performing, for example, one or more processes, techniques, etc., to generate a solution or solutions as to physical phenomena associated with the geologic environment. As an example, one or more field operations in a geologic environment may be undertaken based at least in part on such a solution or solutions (e.g., drilling, injecting, producing, fracturing, etc.).

As an example, multi-phase flow in a porous medium or media may be modeled via flow and transport equations, which can be nonlinear. As mentioned, a solution to a system of nonlinear equations may be achieved via an iterative technique; however, convergence to a reasonable solution may not be guaranteed.

A solution technique for a system of nonlinear equations can include discretization of one or more domains, for example, in space and/or time. Discretization may be achieved via a spatial grid and, for example, time stepping. For example, a system of equations may be solved for unknowns that are specified in space via a grid (e.g., grid cell centers, grid cell nodes, etc.). As another example, a system of equations may be solved for unknown locations in space and/or time, for example, via an inverse technique.

As an example, a solution technique may involve an upwind scheme. An upwind scheme may be considered as a class of numerical discretization techniques. As an example an upwind scheme may be applied to solve a system of equations that includes one or more hyperbolic partial differential equations (PDEs). A hyperbolic PDE of order n may be considered to be a well-posed initial value problem, for example, for a first n 1 derivatives. As an example, a conservation law may be modeled at least in part via a system of equations that includes one or more hyperbolic PDEs where the conservation law states, for example, that a particular measurable property of an isolated physical system does not change as the physical system evolves over time.

As an example, an upwind scheme may implement an adaptive or solution-sensitive finite difference stencil to numerically simulate a direction of propagation of information in a flow field. For example, an upwind schemes can attempt to discretize a system of equations that includes one or more hyperbolic PDEs by using differencing biased in a direction determined by signs of characteristic speeds.

While hyperbolic PDEs are mentioned, a system of equations may include one or more other types of equations. As an example, a system of equations may include one or more elliptic PDEs, one or more parabolic PDEs and/or one or more hyperbolic PDEs. With respect to multiphase fluid flow, a pressure equation may be elliptic with respect to pressure (e.g., P), noting that where density varies, the equation may be parabolic. As an example, a saturation equation for saturation (e.g., S) can be parabolic and, for example, can be hyperbolic where capillary pressure is ignored.

In modeling multiphase fluid flow, "total velocity" may be used in a pressure formulation, which tends to be smoother than phase velocities, where total velocity may be computed as a sum of individual phase velocities. For example, a two-phase scenario can include two individual phase velocities, a three-phase scenario can include three individual phase velocities, etc. As an example, a scenario may model change of phase, for example, consider modeling flow with change of phase. As an example, a scenario may model flow with respect to gravity, for example, where bouancy and/or other phenonmea are taken into account.

As an example, reservoir simulation can include modeling flow in a porus medium or media. As an example, a reservoir model may include relatively porus media and media that may be relatively impermeable, which may, for example, bound one or more porus media.

As an example, a reservoir simulation can include discretizing a model with respect to space and/or time. In such an example, the discretization scheme (e.g., or schemes) can impact numerical stability of a time-stepping algorithm. Where gravity is taken into account, multi-phase flow can be, for example, co-current and/or counter-current depending on the relative strength of viscous and gravitational forces.

As an example, a method may implement one or more upstream formulations, for example, in a finite volume method in the presence of gravity. For example, consider implementation of an upwind scheme that employs a hybrid form for viscous and buoyancy flows. In such an example, the viscous part can include co-current flow and a buoyancy part that is counter-current with zero total velocity.

As an example, a method can aim to diminish non-convergence risk as to an iterative solution technique, which may occur with phase-velocity-based upwind approaches that incur discontinuous transmissibility functions in transitions between co-current and counter-current flows. As an example, a hybrid upwind scheme may yield relatively smooth, consistent discretization of transport equations in the presence of gravity. As described in various examples, a hybrid upwind scheme can provide a continuous transition of transmissibilities between co-current and counter-current flows, which, in turn, helps to ensures numerical convergence of an iterative solution technique for transport equations.

Various examples of equations are presented below that pertain to examples of two-phase flow and that pertain to examples of three-phase flow (e.g., multiphase flow scenarios). For convenience, various equations are labeled "A" as to examples of two-phase flow and various equations are labeled "B" as to examples of three-phase flow. Various equations may be implemented in a scheme or schemes for multiphase flow, for example, multiphase flow in a geologic environment that can include one or more reservoirs.

A1. Introduction

For oil/gas reservoir simulation, numerical stability (e.g., instability indicated by a non-converging solution) can limit time step size. A small time step translates to more iterations as well as more numerical digitization error; whereas, a larger time step translate to fewer iterations, perhaps a more rapid solution, however, possibly with less accuracy (e.g., where a "jump" in time may fail to follow physical phenomena).

Non-linear coupling exists in flow and transport problems, where numerical stability may not be well understood. To improve numerical stability, a reservoir simulators may employ a fully implicit formulation (FIM) of pressure and saturation. Such an approach may yield higher numerical diffusion in solution than, for example, an implicit pressure and explicit saturation formation (IMPES).

In reservoir simulation, where non-convergence is encountered in an iterative solution process of non-linear flow and transport equations, one approach to address such non-convergence involves aggressively reducing time-step size in an effort to achieve numerical convergence, which can have an accompanying reduction in numerical efficiency.

Techniques that attempt to provide for stable time stepping in practical reservoir simulation, include a trust-region that aims to ensure convergence in iterative algorithms and a sequential fully implicit solution algorithm for nonlinear transport problems that implements an unconditionally stable algorithm for two-phase flow in porous media without gravity effect (e.g., to apply arbitrary large time steps, if the gravity effect is negligible).

The effect of gravity and capillary pressure has been examined as its impact on numerical stability of Newton's method in solving non-linear transport equations for two-phase flow. For example, gravity and/or capillary pressure can induce counter-current flow that can incur a substantial numerical instability in reservoir simulation.

Pressure and saturation solutions from coupled flow and transport equations differ in their characteristics, as mentioned, pressure can be elliptic and saturation can be hyperbolic. As an example, given such differences, numerical algorithms may account for pressure and saturation in a somewhat "separate" manner.

As an example, a sequential fully implicit method (e.g., sequention FIM) can allows for exploration of various different algorithms for pressure and saturations. As an example, total velocity in a geologic environment may change quite slowly. As an example, a total velocity-fractional flow formulation can facilitate development of a stable-time-stepping algorithm. For example, in a multi-scale finite volume formulation phase velocities can be computed from the total velocity. As an example, a scheme can include calculating phase velocity based on upstream directions in a combination of viscous co-current flow and gravitational counter-current flow.

As an example, to provide for a stable numerical algorithm for a fully implicit scheme, a method can implement an upwind direction in the presence of gravity, for example, to account for flow direction, which may change from co-current to counter-current or vice-versa. In such an example, upwind direction changes may yield discontinuous derivatives of fractional flow in Newton iterations in solving the transport equation for saturation. As an example, upwind directions, for given total velocity and gravity effect, in a sequential fully implicit formulation may be implemented.

Among conservative algorithms to solve the conservation equations, a one-point upwind scheme may be employed in reservoir simulation. In such an example, the transmissibility in discretized conservation equations is computed from the properties of the cell in upwind. As an example, a phase velocity based upwind for multi-phase flow in porous media in the presence of gravity may be implemented in reservoir simulation.

As to gravity, various phenomena can depend on how a model is discretized. For example, in the presence of gravity, neighboring cell properties can be discontinuous, even in a discretized model with a relatively small cell size. For example, as co-current flow becomes counter-current due to a gravity effect, numerical difficulty may arise due to discontinuous transmissibility functions that are strongly dependent on upwind directions. Such phenomena (e.g., physical phenomena and numerical phenomena) may explain why a reservoir simulator experiences numerical difficulty in performing a simulation study.

Whether in a model or in a geologic environment, gravity force can induce localized flow redistribution (e.g., move lighter fluid upward and heavier fluid downward). In essence, this may be equated to an upwind direction as to a buoyancy force being fixed, for example, being independent of pressure and a main flow field. As an example, a consistent, smooth hybrid upwind method for multi-phase flow in the presence of gravity may leverage such an assumption.

In Section A2, below, the transport equation is presented with gravity as a general form of conservation equation. In Section A3, a hybrid upwind formulation for multi-phase flow in porous media in the presence of gravity is presented and the properties of fractional flow curves are examined. In Section A4, a derivation is presented for the total velocity and fractional flow formulation from the transport equations of two-phase flow in porous media. In Section A5, mathematical and numerical properties of hybrid upwind methods are examined, in comparison with the other phase-velocity-based upwind methods.

A2. Conservation Law

The nonlinear conservation law for two-phase flow with gravity can be expressed in a general form as $$\Phi \frac{\partial S_1}{\partial t} + \nabla \cdot (f_1(S_1, S_2)u + f_3(S_1, S_2)C_g) = -q_1, \quad (A1)$$

$$\Phi \frac{\partial S_2}{\partial t} + \nabla \cdot (f_2(S_1, S_2)u - f_3(S_1, S_2)C_g) = -q_2. \quad (A2)$$

Here, the variable $\Phi$ denotes porosity and t time. The subscripts 1 and 2 indicate the non-wetting phase (oil) and the wetting phase (water), respectively. The $f_1$, $f_2$ and $f_3$ are highly nonlinear fractional flow functions of $S_1$ and $S_2$, and $q_1$ and $q_2$ denote the source terms. The nonlinear functions $f_1$, $f_2$ and $f_3$ are derived from Darcy's equations of two-phase flow in porous media in Section A4.

The total velocity u is the sum of phase velocities:

$$u = u_1 + u_2, \quad (A3)$$

and $C_g$ is a constant that depends on physical properties (i.e., densities, gravity direction and permeability). In general, as the saturation has a unit constrain:

$$1 = S_1 + S_2, \quad (A4)$$

one equation from Eqs. (A1) and (A2) is independent.

In the presence of gravity, the phase velocities can be either co-current or counter-current. The functional dependency of fractional flow functions can be complex for counter-current flow because each phase may have a different upwind direction. The conservation equations, Eqs. (A1) and (A2), indicate that gravity increases the flux of the lighter fluid upward (e.g., in the opposite direction of gravity) and that of the heavier fluids downward (e.g., in the direction of gravity) and the sum of phase fluxes due to gravity effect remains approximately zero. Further, the flux term $f_3 C_g$ can be independent of the flow condition, i.e., u, and dependent on the saturation distribution. With recognition of such behavior (e.g., being acceptable for various conditions), a continuous, stable upwind discretization of the multi-phase conservation law with gravity can be formulated.

From this section, the oil-phase saturation is considered to be a primary variable and S without a phase index denotes $S_1$. The discretized conservation law, Eq. (A1), can be given by $$\frac{\Phi V_i}{\Delta t}(S_i^{n+1} - S_i^n) + \sum_{j \in \aleph_i} (f_{1,ij}(S_1, S_2)u_{ij} + f_{3,ij}(S_1, S_2)C_g) = -q_{1,i}, \quad (A5)$$

Here, $\aleph$ denotes the neighboring cells of cell i; and the subscript ij denotes the properties at the interface of cells i and j. The fractional flow functions are, in general, dependent on the saturation of the cell i, $S_i$, and that of the neighboring cell j, $S_j$. The phase saturations, $S_1$ and $S_2$ in $f_{1,ij}$ and $f_{3,ij}$ are kept to allow each phase flow to have a different upwind direction.

A3 Upwind Methods in Discretization

Reservoir simulation aims to achieve stable computation in the presence of heterogeneous permeability and complex physics associated with phase behavior and multi-phase flow. A fully implicit scheme (e.g., FIM) may be employed in practical studies, even though large numerical dispersion can be experienced. As an example, phase-velocity-based upwinds may be used in reservoir simulation.

Below, a phase-velocity-based upwind approach and Godunov's upwind approach are examined, noting that the latter may be implemented in reservoir simulation, which may, for example, converge to an entropy solution in an explicit scheme.

These two approach are not inherently $C^1$ continuous. As such, Newton's iterative method may experience difficulty in numerical convergence. To reduce risk of numerical non-convergence, a method can include implementing a hybrid upwind approach for multi-phase flow with gravity that, for example, employs different upwinds for viscous flux and gravitational flux. In such an approach, upwinds may include a first set of upwinds for viscous flux and a second set of upwinds for gravitational flux. For example, such an approach may associate one type of physical phenomenon with a first set of upwinds and a second type of physical phenomenon with a second, different set of upwinds.

As an example, a method can include implementing different upwinds for viscous flux and for gravitational flux via a hybrid upwind approach to achieve $C^1$ continuity. Such a method can be consistent with the phase-velocity-based upwind method for two limit cases, pure viscous flow and gravitational segregation. The mathematical properties of the hybrid upwind method are, in a detail, set forth in Section A5.

A3.1 Phase-Velocity-Based Upwinds

In the sequential fully implicit algorithm (e.g., sequential FIM), the saturation equations are iteratively solved with the total velocity fixed to preserve the conservation of mass (i.e., divergence free). The algorithm for co-current flow can be implemented by the total velocity and fractional flow formulation. However, for the case of counter-current flow, the original fractional flow that is dependent on a single saturation has to be modified to maintain mass conservation at the cell interface. If the relative permeability at the boundary of cells i and j is determined by the upstream saturation of phase α, the phase velocity at the cell boundary is given by:

$$u_{ij}^\alpha = -k \frac{k_{r,\alpha}(S_{ij}^\alpha)}{\mu_\alpha} (\Delta p + \rho_\alpha g \nabla H), \tag{A6}$$

where Δp is the pressure difference and ∀H is a unit vector in z direction. Here, the phase saturation at the interface of the cells i and j is defined by $$S_{ij}^\alpha = S_i^\alpha \text{ if } u_{ij}^\alpha \geq 0 \tag{A7}$$
$$= S_j^\alpha \text{ if } u_{ij}^\alpha < 0.$$

The fractional flow functions at the interface of the cells i and j are rewritten as $$f_{1,ij}(S_1, S_2) = f_1(S_{ij}^1, S_{ij}^2) \tag{A8}$$

$$f_{3,ij}(S_1, S_2) = f_3(S_{ij}^1, S_{ij}^2). \tag{A9}$$

Phase velocities can be co-current or counter-current depending on the flow and gravity directions. In practical reservoir simulation, the phase velocity is computed by the phase potential difference and the relative permeability of the phase saturation in upwind. This can simplify computation of the phase velocities at the cell interface. Nevertheless, as the phase velocity is a combined velocity from viscous and gravity forces, the upwind direction can easily be altered due to small potential differences from gravity equilibrium. In reservoir simulation, such discontinuous upwind changes can destabilize numerical convergence.

A3.2 Hybrid Upwind Method

In the previous subsection (A3.1), upwinds based on the phase velocity are set forth. In this subsection, an example of a different upwind method that is dependent on flow types (e.g., viscous and gravitational flows) is set forth. The flux at the boundary of cells i and j includes two parts: (1) $f_1 u_{ij}$ from viscous flow and (2) $f_3 Cg$ from gravitational force.

The viscous part employs the upwind from the total velocity, $u_{ij}$, direction and the gravitational part has a fixed upwinds for phases that are dependent on the gravity direction and the density difference in phases. The phase upwind cell due to the total velocity can be defined by $$S_{ij}^\alpha = S_i^\alpha \text{ if } u_{ij} \geq 0 \tag{A10}$$
$$= S_j^\alpha \text{ if } u_{ij} < 0$$

and due to the gravity is defined as $$S_{G,ij}^1 = S_j^1 \text{ and } S_{G,ij}^2 = S_i^2 \text{ if } (x_i - x_j) \cdot g \geq 0$$

$$S_{G,ij}^1 = S_i^1 \text{ and } S_{G,ij}^2 = S_j^2 \text{ if } (x_i - x_j) \cdot g < 0. \tag{A11}$$

The fractional flow functions can be given by $$f_{1,ij}(S_1, S_2) = f_1(S_{ij}^1, S_{ij}^2) \tag{A12}$$

$$f_{3,ij}(S_1, S_2) = f_3(S_{G,ij}^1, S_{G,ij}^2). \tag{A13}$$

Note that the upwinds on viscous part are dependent on the total velocity direction that may be changing slowly or staying in the same direction and the gravitational part has fixed upwinds that are independent of the flow field. This tends to make the hybrid upwind approach stable and consistent. Further its $C^1$-continuity can help with convergence of an iterative Newton solution of nonlinear transport equations. Note that two different upwinds with viscous flow and gravitational flow (e.g., viscous flux and gravitational flux) entail an adjustment term in the discretized Darcy's flow Eq. (A6):

$$u_{ij}^\alpha = k\lambda_{ij}^\alpha (\Delta p + \rho_\alpha g \nabla H) + \left(-\frac{\lambda_{ij}^1 \lambda_{ij}^2}{\lambda_{ij}^T} + \frac{\lambda_{g,ij}^1 \lambda_{g,ij}^2}{\lambda_{g,ij}^T}\right) \sum_\ell (\rho_\alpha - \rho_\ell). \tag{A14}$$

Figure 4A:
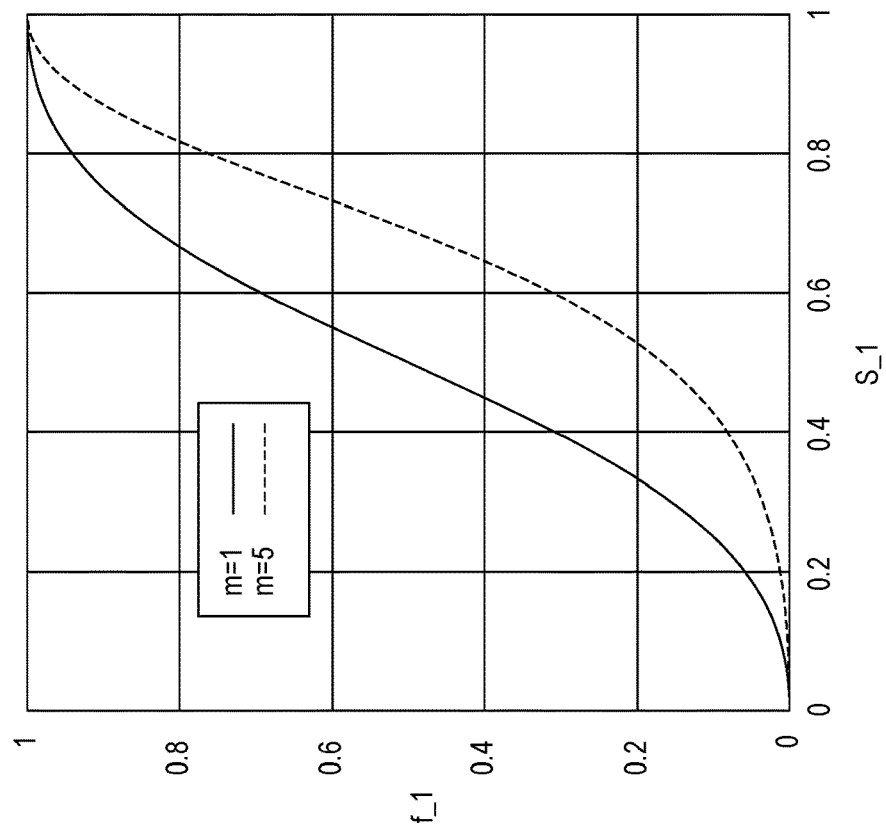

FIGS. 4A and 4B show plots of fractional flow for m=1 and m=5 (e.g., m being a viscosity ratio) where FIG. 4A is for $f_1$ and where FIG. 4B is for $f_3$.

Figure 5A:
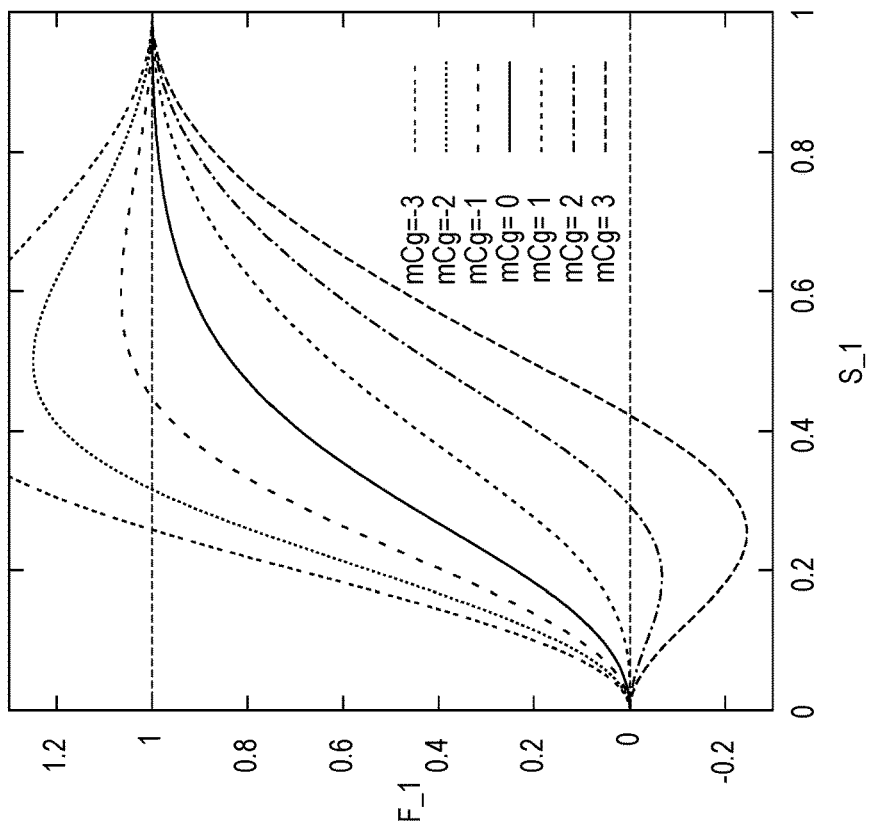
FIGS. 5A and 5B illustrate example plots of fractional flow.
Figure 5B:
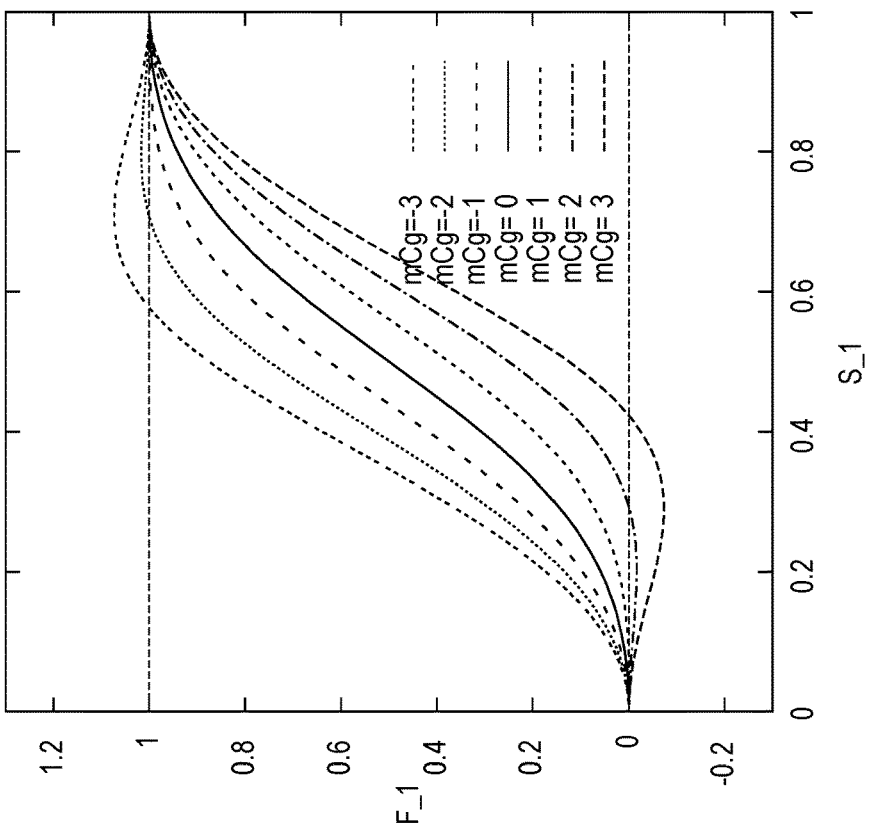

FIGS. 5A and 5B show plots of fractional flow curves for phase 1 where FIG. 5A is for m=1 and where FIG. 5B is for m=5 (e.g., m being a viscosity ratio).

A4. Two Phase Flow in Porous Media

Darcy's law for two phase flow with gravity can be written as $$u_1 = -kk_{r,1}\mu_1(\nabla p + \rho_1 g \nabla H) \tag{A15}$$

$$u_2 = -kk_{r,2}\mu_2(\nabla p \pm \rho_2 g \nabla H). \tag{A16}$$

From Eqs. (15)-(16) it is possible to derive $$u_1 = f_1(S)u + f_3(S)C_g \tag{A17}$$

$$u_2 = f_2(S)u - f_3(S)C_g, \tag{A18}$$

where S denotes the saturation of phase 1 (i.e., oil). The total velocity is defined as $$u = u_1 + u_2 \tag{A19}$$

and the fractional parameters are given by $$f_1 = k_{r,1}k_{r,1} + mk_{r,2} \tag{A20}$$

$$f_2 = mk_{r,2}k_{r,1} + mk_{r,2} \tag{A21}$$

$$f_3 = mk_{r,1}k_{r,2}k_{r,1} + mk_{r,2}. \tag{A22}$$

Here, m is the viscosity ratio, $\mu_1/\mu_2$. The velocity due to gravity force can be characterized by a variable, $C_g$, $$C_g = kg(\rho_2 - \rho_1)\mu_1 u_c \nabla H, \tag{A23}$$

where $u_c$ is a characteristic velocity and H is the height. Note that velocities u, $u_1$ and $u_2$ in Eqs. (A17) and (A18) are also non-dimensionalized with respect to $u_c$. Thus, variables may be nondimensionlized with respect to characteristic variables, $l_c$, $u_c$, $t_c(=l_c/u_c)$, and $p_c(=u_c l_c \mu_1/k)$.

The $f_1$ and $f_3$ with the viscosity ratio m=1 and 5 are plotted as a function of S in FIGS. 4A and 4B, respectively. The first fractional flow curve $f_1$ is a monotonic S-shaped function with one inflection point. The second fractional flow curve due to gravity force is a maximum point and two inflection points in the left and right had sides of the maximum point. When these two curves are combined to yield a total fractional flow curve, the curves can become non-monotonic depending on the ratio of viscous (u) and gravity ($C_g$). It is instructive to examine fractional flow curves from Eqs. (A17) and (A18). It is possible to choose the total velocity as the characteristic velocity ($u_c$=u). In FIGS. 5A and 5B, plots show the fractional flows for phase 1 ($F_1$=$u_1$/u) with viscosity ratios 1 and 5, respectively, and quadratic relative permeabilities.

$$k_{r,1} = S_1^2 \quad (A24)$$

$$k_{r,2} = S_2^2 = (1-S_1)^2. \quad (A25)$$

The fractional flow curves are monotonic if $0 < mC_g \leq 1$, whereas it can become a non-monotonic function for $mC_g > 1$ or $mC_g < 0$. The fractional flow can be less than zero or larger than one, depending on the directions of gravity force and velocity. This can cause numerical difficulty if Newton iterations of the nonlinear equations do not take the actual pattern of theses curves into account. Note that the fractional flow curve from negative $C_g$ and positive u is equivalent to that from positive $C_g$ and negative u. In practical simulation with fixed coordinates, it is possible to maintain $C_g$ positive, but the mean velocity can be either positive or negative. Note that without loss of generality, the case with negative mean velocity is equivalent to the case of positive mean velocity with negative $C_g$ by selecting an appropriate coordinate to make the mean velocity positive.

Figure 6A:
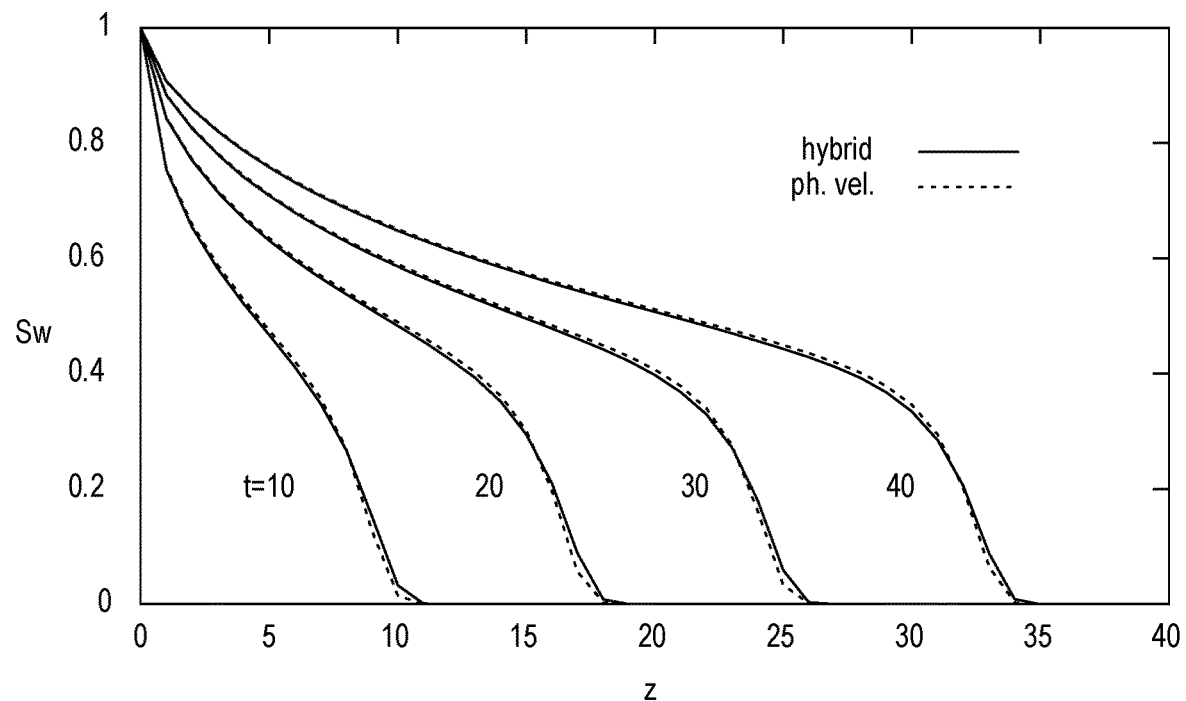
FIGS. 6A and 6B illustrate example plots of linear displacement associated with a one-dimensional model.
Figure 6B:
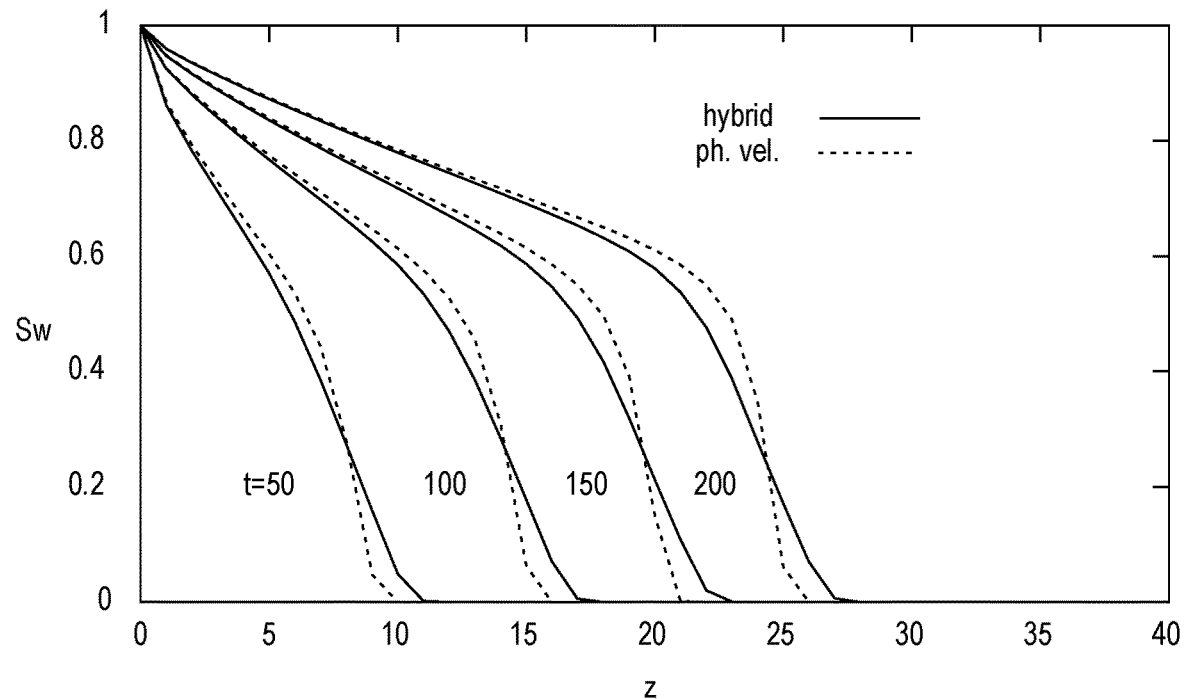

FIGS. 6A and 6B show linear displacement in a one-dimensional model with 40 cells between top and bottom boundaries. The gravity is in a z direction and pressures at top and bottom boundaries remain constant. The initial saturation is $S_0$=1 ($S_w$=0)) for z>0. FIG. 6A is for a high pressure gradient, $P_{top}$=0 and $P_{bot}$=100, and FIG. 6B is for a low pressure gradient, $P_{top}$=0 and $P_{bot}$=40.

Figure 7:
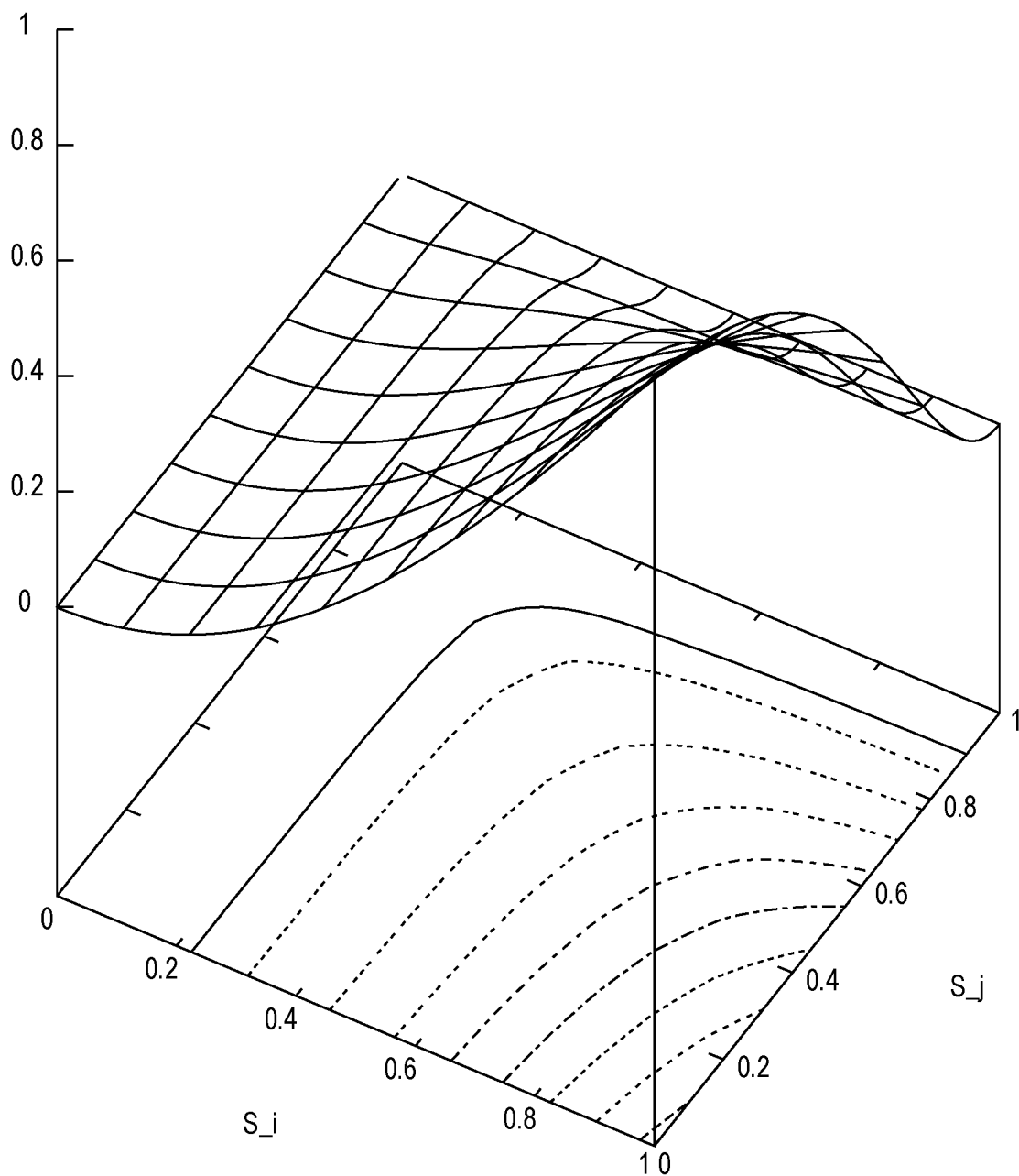
FIG. 7 illustrates an example plot of gravity fractional flow including projected contours of values.

FIG. 7 shows gravity fractional flow ($f_3$), including projected contours.

Figure 8B:
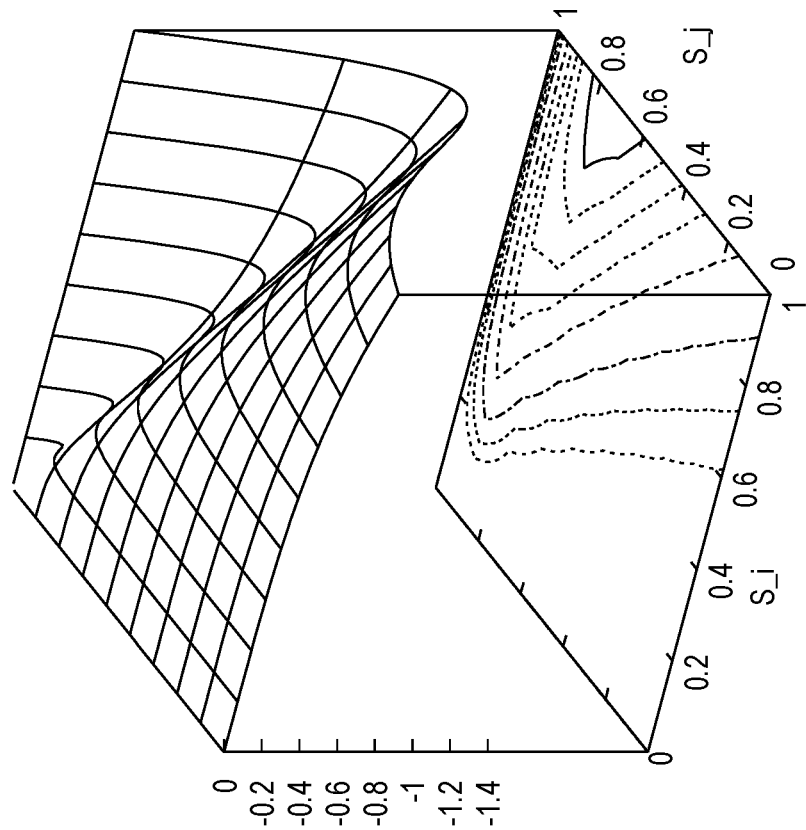
FIGS. 8A, 8B, 8C and 8D illustrate example plots of derivatives of gravity fractional flow.
Figure 8A:
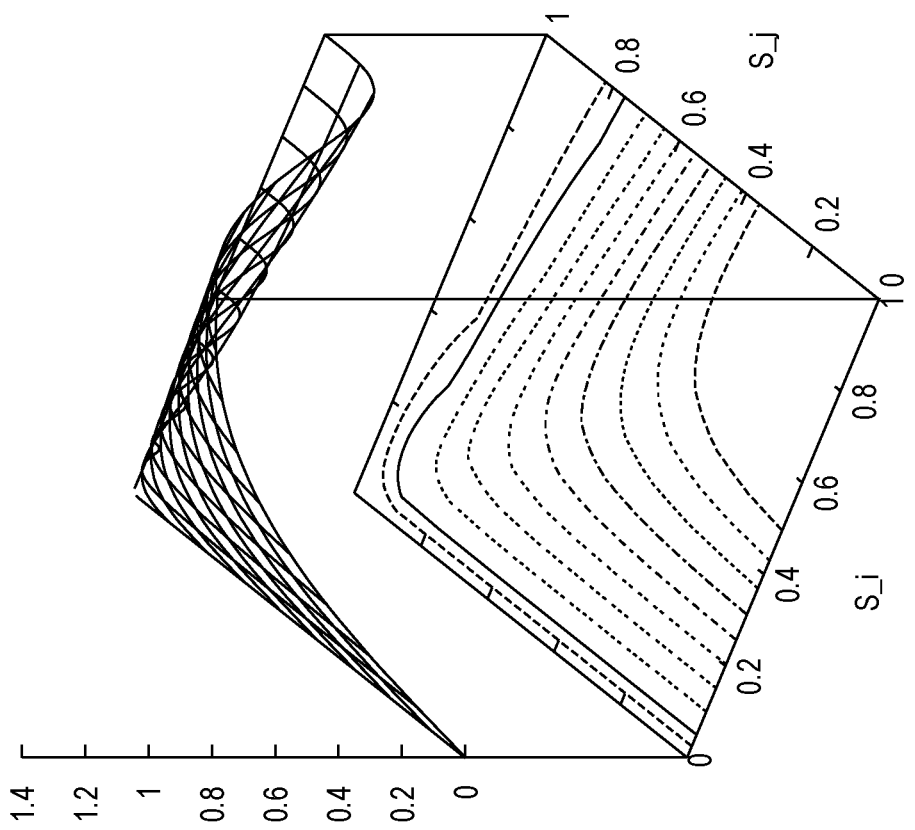
Figure 8D:
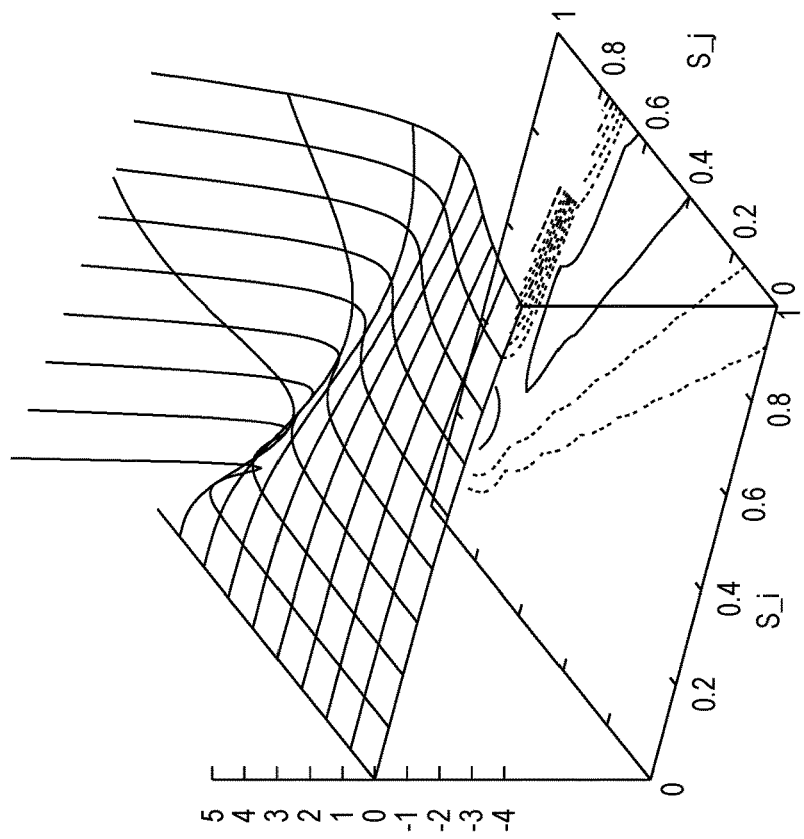
Figure 8C:
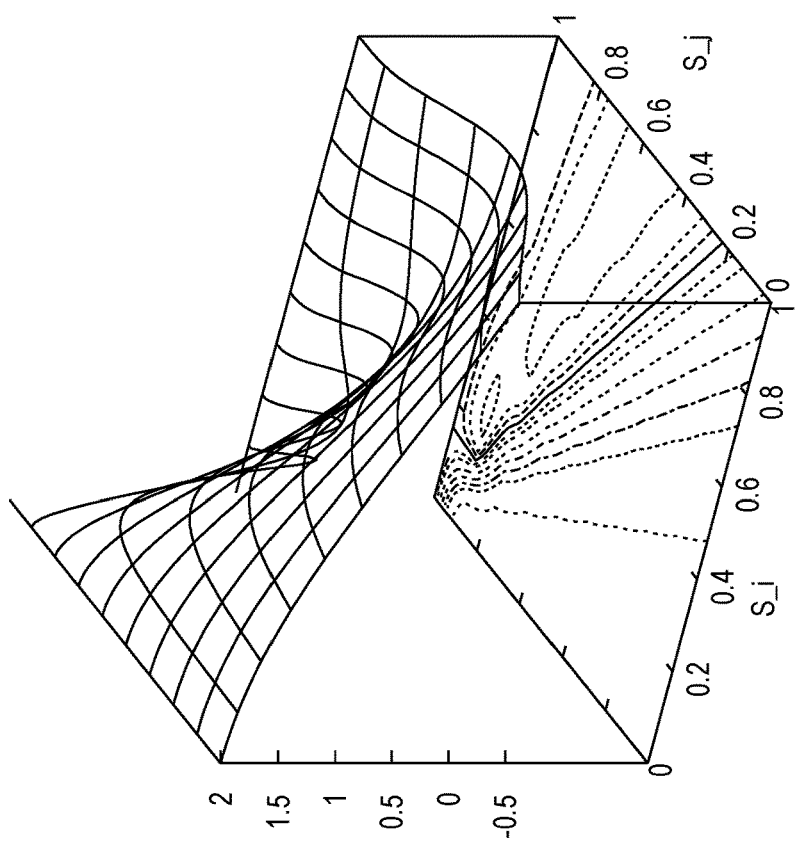

FIGS. 8A, 8B, 8C and 8D show first and second order derivatives of gravity fractional flow: FIG. 8A ($df_3/dS_i$), FIG. 8B ($df_3/dS_j$), FIG. 8C $d^2f_3/dS_i^2$ and FIG. 8D $d^2f_3/dS_j^2$.

For the hybrid upwind discretization method, $f_3$ can be shown to be dependent on two neighboring cell saturations. The functional form and its first and second derivatives may be examined. In FIG. 7, the functional form $f_3$ is plotted as a function of saturations of cell i (lower in z-direction) and j (upper in z-direction). It clearly shows that $f_3$ becomes maximum at $S_i$=1 and $S_j$=0 that is the most unstable situation from the gravity equilibrium. It is noteworthy that $f_3$ becomes zero at the other three corners ($S_i$=0, $S_j$=0, $S_i$=1, $S_j$=0 and $S_i$=1, $S_j$=1). Further, a monotonically decreasing function from the maximum point ($S_i$=1, $S_j$=0). These properties may be utilized in designing an under-relaxation method for iterative saturation solution to be in trust regions. The first and second derivatives of $f_3$ are plotted in FIGS. 8A, 8B, 8C and 8D.

As an initial examination of the consistency and convergence of the hybrid-upwind scheme, a time-dependent problem is solved using different upwind methods: phase-velocity-based and hybrid upwinds. A one dimensional vertical problem with 40 cells is employed with $S_{bot}$=1.0, $S_{top}$=0, and $P_{top}$=0. Two different pressure conditions are applied at the bottom to control viscous and gravitation flow: (a) $P_{bot}$=100 and (b) $P_{bot}$=40. In a high pressure gradient case (a) the saturation may be more dispersive and in the second case the front may become stiffer as the gravity force tends to segregate the saturation. The saturation profiles from these two cases are shown in FIGS. 6A and 6B, respectively. The differences in solution in (a) is almost negligible; but whereas in (b) it can be observed that a more dispersive solution from the hybrid upwinds exists. The solution differences are shown to be within an order of discretization error.

A5. Some Mathematical and Numerical Properties of an Example Hybrid Upwind Method In reservoir simulation, a switch in the upwind direction entails a new iteration with updated upwinds. As discussed in A3.2, the fractional flow in the hybrid upwind method can be dependent on the total velocity for the viscous part and the gravitational part can employ fixed upwinds. Since the total velocity field tends to be more stable in numerical simulation than the phase velocity, the upwind switch in the hybrid upwind scheme may be minimal.

As an example, an unlimited time step size may be stably used without gravity effect, in which the total velocity is weakly dependent on the mobility ratio and the flow direction is fixed due to the fixed locations of production and injection wells. Since the phase-velocity-based upwinds have been used in practical applications of reservoir simulation, it can be informative to compare these two upwind methods in mathematical properties; especially, discretization errors, monotonicity, convergence, and continuity in derivatives.

An examination of the numerical stability (convergence rate) of the hybrid upwind method and differences in converged solutions from the phase-velocity-based and hybrid upwind methods demonstrates various features of the hybrid upwind method. As the solutions are dependent on a discretization scheme, one may first examine whether the difference in solutions is of the same order of discretization errors for smooth saturation fields.

A5.1. Discretization Error

The phase-velocity-based upwind finds use in reservoir simulation. Differences in the discretization errors from the phase-velocity-based upwind and the flow-type-based hybrid upwind set forth herein may be examined. For simplicity of analysis, the flux equation of Eq. (A17) is examined for the given system of constant u and $C_g$. The flux function between cells i and j can be expressed by a function of a saturation, $S^*$, whose value is between the values of cell saturations, $S_i$ and $S_j$.

$$u_{ij}^1 = f_1(S^*)u_{ij} + f_3(S^*)C_g, \text{ where } S_i < S^* < S_j \text{ or } S_j < S^* < S_i. \quad (A26)$$

The discretized approximation of flux can be in a general form expressed as $$\tilde{u}_{ij}^1 = \tilde{f}_1(S_i, S_j)u_{ij} + \tilde{f}_3(S_i, S_j)C_g. \quad (A27)$$

By applying the Taylor series expansion, it is possible to obtain $$f_1(S^*) = f_1(S_i, S_j) + \frac{\partial f_1}{\partial S_i}(S^* - S_i) + \quad (A28)$$

$$\frac{\partial f_1}{\partial S_j}(S^* - S_j) + O((S^* - S_i)^2) + O((S^* - S_j)^2)$$

Using a smooth spatial distribution of saturation, it is possible to estimate the discretization errors:

$$E = |u_1(S_i, S_j) - u_1(S^*)| = \quad (A29)$$
$$|(f_1(S_i, S_j) - f_1(S^*))u + (f_3(S_i, S_j) - f_3(S^*))C_g| =$$
$$\left|\left(u\frac{\partial f_1}{\partial S_i} + C_g\frac{\partial f_3}{\partial S_i}\right)(S^* - S_i) + \left(u\frac{\partial f_1}{\partial S_j} + C_g\frac{\partial f_3}{\partial S_j}\right)(S^* - S_j)\right| +$$
$$O((S^* - S_i)^2) + O((S^* - S_j)^2).$$

Eq. (A29) indicates the discretization errors associated with hybrid upwind method have approximately the same order of magnitude (O(h)). It is still instructive to examine discretization errors from hybrid upwind methods. These are examined as to the phase velocity between two cells with (1) $u_t=1$ and $C_g=1$ and (2) $u_t=0.1$ and $C_g=5$. Here, it can be assumed that the saturation is linearly distributed: the upper cell has $S_j=0.5+0.5\alpha\Delta h$ and the lower cell has $S_i=0.5-0.5\alpha\Delta h$. The $\alpha$ is the spacial gradient of saturation and $\Delta h$ is the grid size. The interface saturation between cells i and j is constant, $S^*=0.5$. Trials included computing the discretization error in $u_1$ by changing the grid size $\Delta h$.

Figure 9:
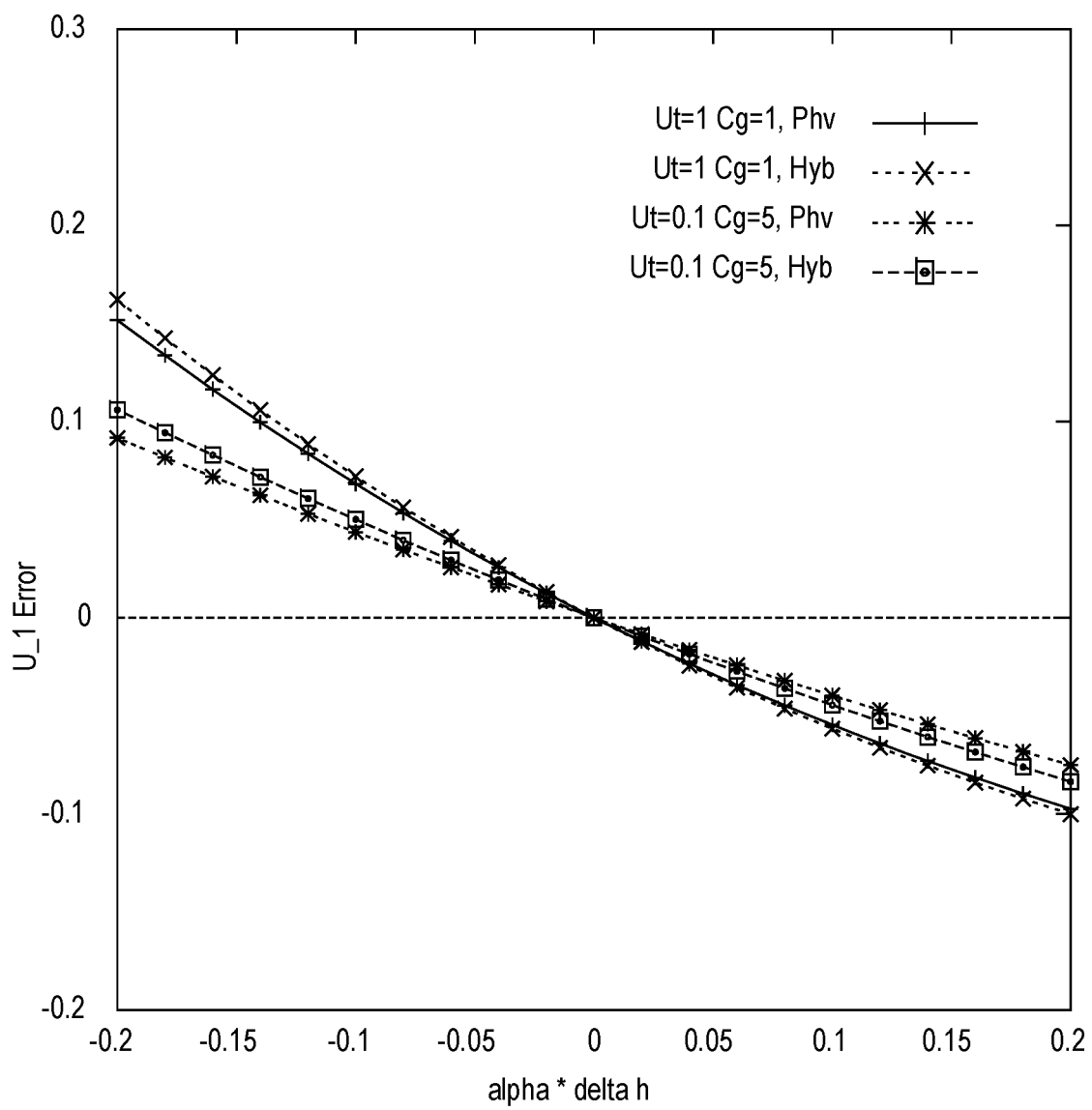
FIG. 9 illustrates an example plot of discretization errors.

FIG. 9 shows discretization errors of $u_1$. As shown, two upwind methods between cells i and j were examined; the phase-velocity based upwind and the hybrid upwind based on flow types. Assuming the saturation is linearly distributed, the upper cell j has saturation ($0.5+0.5\alpha\Delta h$) and the lower cell i has ($0.5-0.5\alpha\Delta h$). The first case involves co-current flow with $u_t=1$ and $C_g=1$; and the second case includes counter-current flow with $u_t=0.1$ and $C_g=5$.

Such a numerical exercise also represents the discretization error if $(S_j-S_i) \propto \alpha h$, where the saturation can be approximated linearly in the neighborhood of a fixed point. The numerical computed phase velocity, $u_1$, has a very weak dependency on the upwind methods, either for co-current and counter current flows. If the saturation is distributed in less stable mode ($\alpha\Delta h<0$), the counter flow rate will increase. It can be noted that the discrepancy between the two upwind methods increases, but still remains within approximately the same order of discretization error. As discussed, the discretization errors from both the upwind methods tend to be similar. This numerical test helps to verify that numerical accuracy of the hybrid upwind approach is comparable to the phase-velocity-based upwind approach.

A5.2. Monotonicity

Monotone approximation may be examined, for example, as the flux function between two cells, $F_{i+1/2}(u,w)$ tends to be non-decreasing in the first argument and non-increasing in the second argument: i.e., for any w, $F_{i+1/2}(u,w) \leq F_{i+1/2}(v,w)$ and $F_{i+1/2}(w,u) \leq F_{i+1/2}(w,v)$ if $u \leq v$.

In a hyperbolic system of transport equations from the IMPES method, it may be shown that a monotone difference scheme with the standard upstream yields an acceptable physical solution. Although the standard upwind method includes numerical diffusion, the numerical diffusion can stabilize the solution in multidimensional flow where velocity and saturation interacts.

The numerical flux from upstream difference may be well-defined, Lipschitz-continuous and consistent. Further, in two-phase flow an upstream scheme can also be convergent to the entropy solution if the Courant-Friedrichs-Lewy (CFL) condition is satisfied. An upwind scheme can be more dispersive than a Godunov scheme, but both of them exhibit Lipschitz-continuity.

The next subsection demonstrates that an example hybrid scheme based on flow types is $C^1$-continuous, which can help as to convergence in Newton iterations. In these example trials, the upwind scheme is shown to be monotone and to yield a physically consistent solution. As an example, an implicit scheme with phase-based upwind may converge to an entropy solution of the conservation law for an arbitrary CFL number. As an example, an implicit scheme with hybrid upwinds may be shown to satisfy a monotonic flux assumption.

Figure 10:
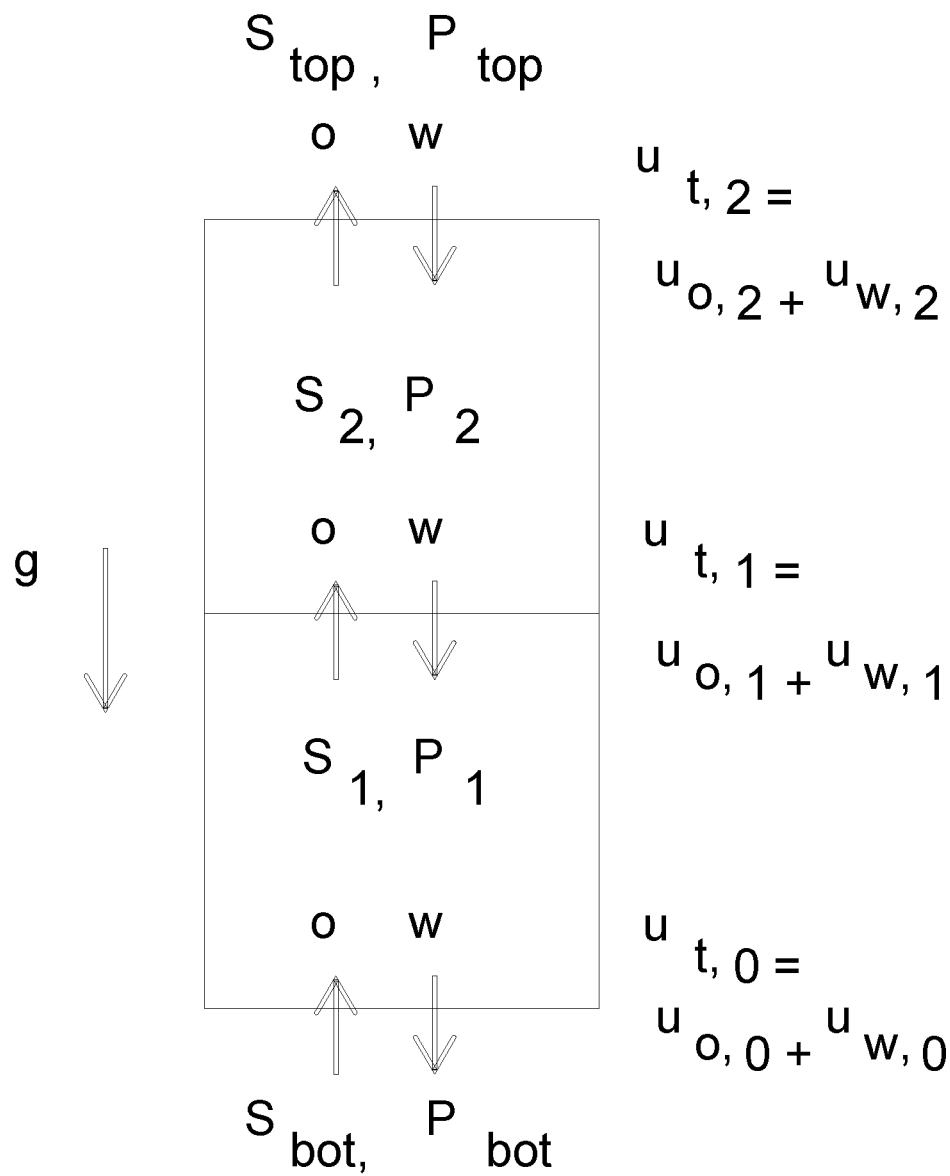
FIG. 10 illustrates an example graphic of a two cell model with gravity for two-phase flow.

FIG. 10 shows an example of a two cell model with gravity where an interface exists between the two cells of the model.

FIGS. 11A and 11B show phase velocities in the two cell model with the boundary conditions: $u_t=0.01$, $Cg=0.05$ and $S_2=0.4$ in FIG. 11A and $S_2=0.8$ in FIG. 11B. The PhV denotes the velocities computed by the phase velocity upwind and Hyb by the hybrid upwind method and Gdn by the Godunov method.

A5.3. $C^1$ Continuity

The transmissibility between two cells is dependent on the choice of upwind properties in relative permeability. The upwind direction in horizontal flow (no gravity effect) does not tend to change due to semi-permanent locations of injection and production wells. The vertical multi-phase flow can change quickly in the presence of strong gravity and weak viscous force. Further, the saturation distribution along the flow direction is gradual with some dispersion in horizontal flow, whereas the fluids tend to be vertically segregated due the continuous effect of buoyancy force.

In various example trials, sharp saturation changes can be noted between the neighboring cells in the vertical direction (e.g., 100% oil to 100% water). The upwind direction, as a result, has an influence in the vertical phase velocity. This strong dependency of upwind direction incurs numerical difficulty in applying large time-steps in reservoir simulation. As an example, a hybrid upwinds approach for flow types can reduce the dependency of phase velocity on upwind-direction changes because the vertical buoyancy part can be set to employ, for example, a fixed upwind (e.g., counter-current flow).

It is, thus, instructive to examine phase velocities from phase-velocity-based and hybrid upwind methods with a model. For example, consider the two-cell model depicted in FIG. 10 in which the upper and lower boundaries have the cell saturation and pressure, $S_{top}$, $P_{top}$ and $S_{bot}$, $P_{bot}$ respectively. If fluid motion is governed by viscous force or gravitational force, the phase flux functions tend to be the same in both the phase-velocity-based and hybrid upwind methods. However, in the case that viscous flow and gravitational flow are both of concern, phase velocities will tend to show differences due to an upwind approach.

FIGS. 11 A and 11B depict the phase velocities between cells 1 and 2 by a phase-velocity-based scheme and a hybrid upwind scheme. Both are computed using Eqs. (A17) and (A18). In FIG. 11A, it is assumed $S_2=0.4$ and in (b) $S_2=0.8$. In the plots, Godunov fluxes are shown, for example, to compare phase velocities. Godunov fluxes may be given by Eq. (A32), further below.

In numerical experiments, it can be assumed that the total velocity and gravity number are constant ($u_t=0.1$ and $C_g=0.05$) and the viscosity ratio is m=5 and the quadratic relative permeability curves are employed. If the cell saturations are identical ($S_1=S_2=0.4$ in FIG. 11A and $S_i=S_2=0.8$ in FIG. 11B), the three upwind methods yield substantially equal fluxes. When the counter-current flow occurs (e.g., $S_1=0.45$), the phase-velocity-based upwind scheme changes discontinuously the fractional flow dependency from one upstream saturation to two phase-velocity-based-upwind saturations. As a result, discontinuous derivatives of the fractional flow curves exist in FIG. 11B. The Godunov method also displays discontinuous derivatives due to the upwind switching criterion, as shown in Eq. (A33), which is dependent on the saturations and the reflection (sonic) point ($S^*=0.697$). The Godunov method is designed for explicit time stepping, however, it can show that the flux function has a kink which does not affect the method's performance in an explicit time setup.

In FIG. 11B, $S_2 > S^*$, the flux function becomes constant for $S_1 > 0.6$. The flux function calculation can become complex and ambiguous when a counter-current flow occurs. The phase-velocity based upwind may yield non-convergent solutions for a system with heterogeneous flux functions. Such concerns are associated with an explicit method that may be accurately solved by a Riemann solver; however, the time-step size can be limited by the CFL conditions.

As mentioned, a hybrid upwind scheme may be implemented via an implicit technique, which may yield a more stable (e.g., and dispersive) solution than an explicit technique. The CFL condition does not apply in the implicit method. In an implicit scheme, Newton iterations can become non-convergent if derivatives of flux functions become discontinuous. The non-convergent behavior can be due to discontinuity occurring in local regions (some grid blocks). A stable time-stepping scheme can entail flux functions of continuous first order derivatives ($C^1(\Omega)$). As shown in FIG. 11 the hybrid upwind scheme can provide flux functions with continuous first derivatives (e.g., $f \in C^1(\Omega)$).

Figure 12A:
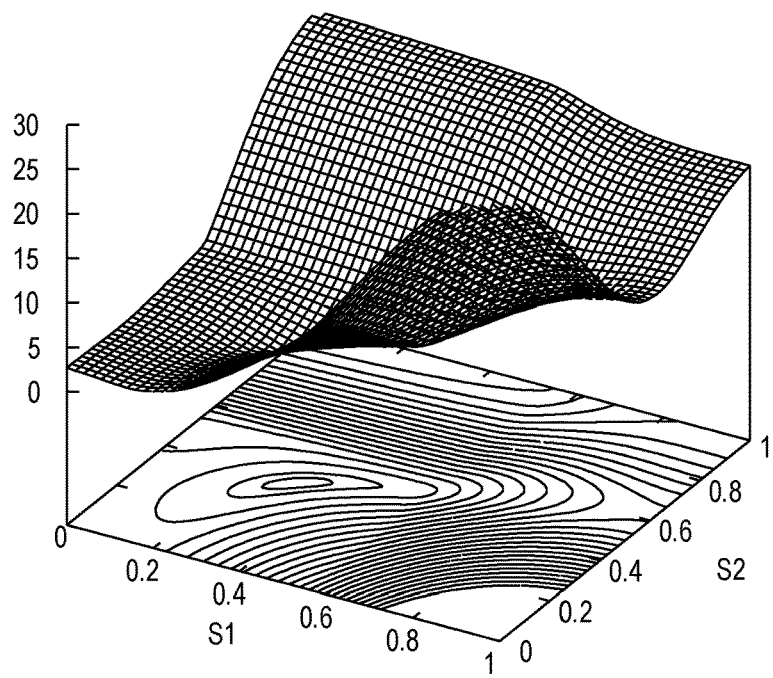
FIGS. 12A and 12B illustrate example plots of residuals for a two cell model for phase-velocity based upwinds and for hybrid unwinds, respectively.
Figure 12B:
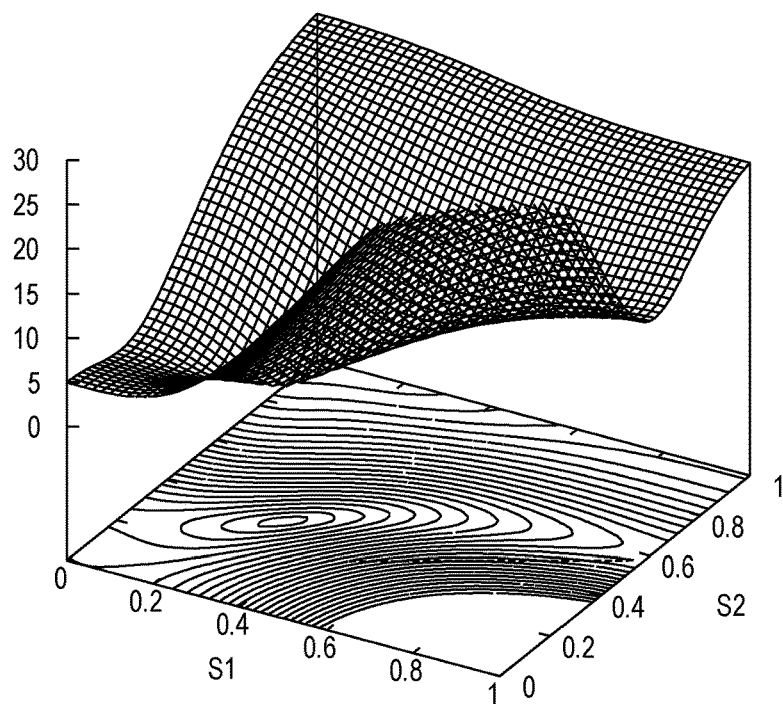

FIGS. 12A and 12B show residuals for a two cell problem with the values of $S_1^{n+1}$ and $S_2^{n+1}$. The initial saturations are $S_1^n = S_2^n = 1$ and the boundary cell saturations are $S_{top} = 0.4$ and $S_{bot} = 0.2$. The time step size $\Delta t = 10$, $u_t = -1$, $C_g = 5$ and $m = 1$. FIG. 12A shows phase-velocity based upwinds and FIG. 12B shows hybrid upwinds based on flow types (viscous and gravitational).

Figure 13A:
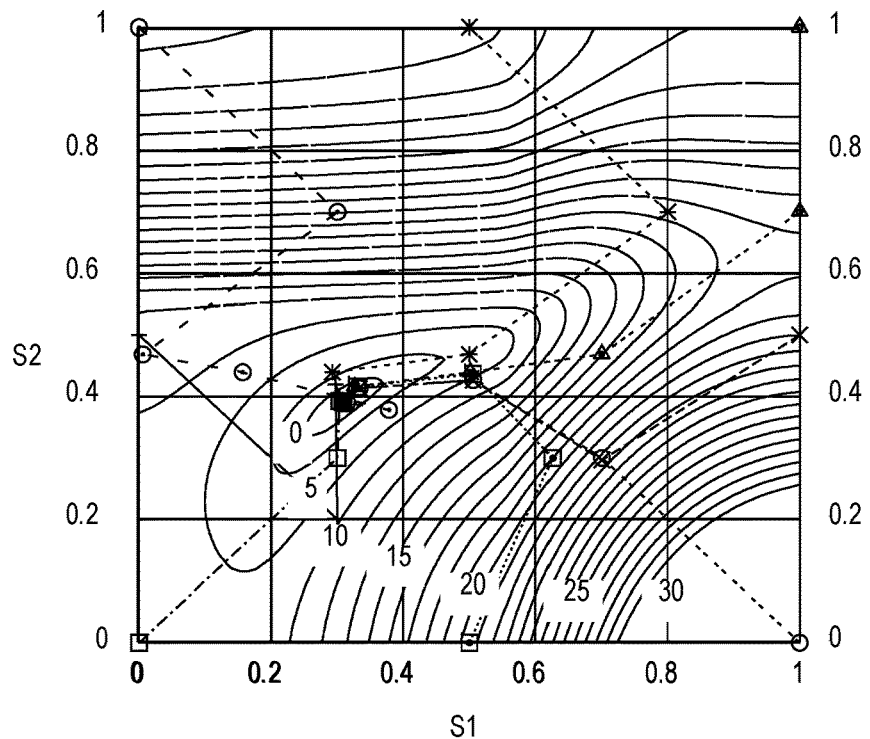
FIGS. 13A and 13B illustrate example plots of trajectories of iterative solutions associated with a two cell model for phase-velocity based upwinds and for hybrid unwinds, respectively.
Figure 13B:
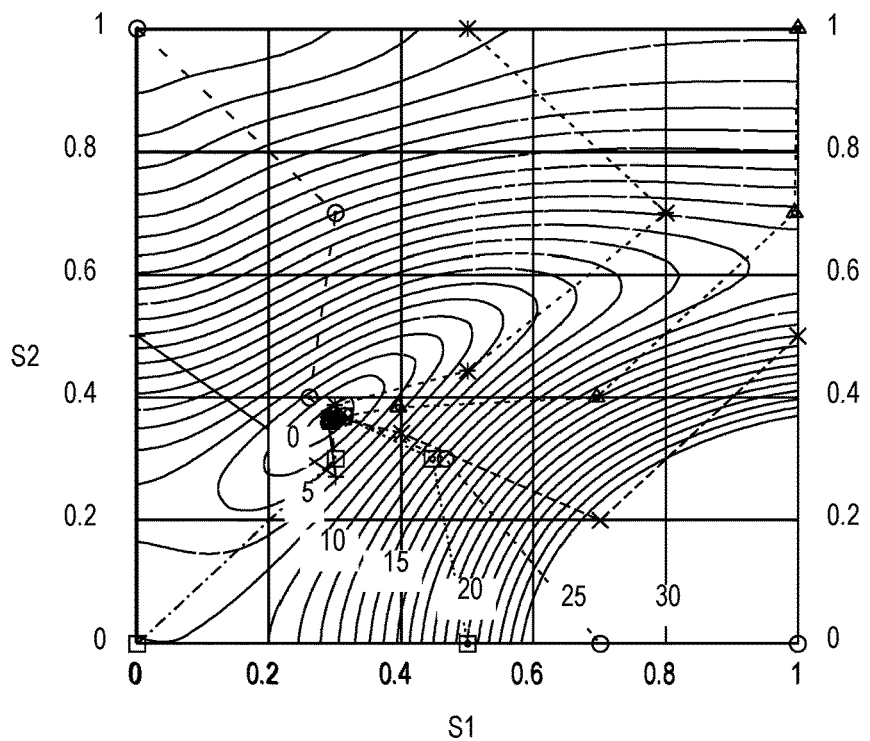

FIGS. 13A and 13B show trajectories of iterative solutions for a two cell problem with the values of $S_1^{n+1}$ and $S_2^{n+1}$. The initial saturations are $S_1^n = S_2^n = 1$ and the boundary cell saturations are $S_{top} = 0.4$ and $S_{bot} = 0.2$. $S_{top} = 0.4$ and $S_{bot} = 0.2$. The time step size $\Delta t = 10$, $u_t = -1$, $C_g = 5$, i and m = 1. FIG. 13A shows phase-velocity based upwinds and FIG. 13B shows hybrid upwinds based on flow types (viscous and gravitational).

A5.4 Numerical Convergence

The two-cell problem of FIG. 10 is examined. The initial saturations of cells 1 and 2, are given by $S_1^n = S_2^n = 1$ and the top and bottom boundary include cells with $S_{bot} = 0.2$ and $S_{top} = 0.4$. The time step size $\Delta t = 10$, $u_t = -1$ and $C_g = 5$. In FIGS. 12A and 12B, contour lines are plotted for the $L_2$ norm of residual for the value of estimated solution $S_1^{n+1} + 1$ and $S_2^{n+1}$ from the formulation with phase-velocity-based upwinds in FIG. 12A and that with the hybrid upwind based on flow types in FIG. 12B. The contour lines from the phase-velocity based upwinds show the discontinuity in first derivatives at $S_1 = 0.54$ and $S_2 = 0.54$. $L_2$ norm is Lipschitz continuous, but not $C^1$-continuous. In comparison, the $L_2$ norms of residuals from the hybrid upwinds are $C^1$ continuous. This property can establish stable Newton iterations in solving nonlinear saturation equations.

For this numerical example, numerical convergence trajectories are examined from various initial guesses of a solution. Eight initial guesses of the solution are examined: $(S_1^{n+1,0}, S_2^{n+1,0}) = (0,0), (0,0.5), (0,1), (0.5,0), (0.5,1), (1,0), (1, 0.5)$ and $(1,1)$. The convergence trajectories from the phase-velocity-based upwinds and the hybrid upwinds based on flow types are plotted in FIGS. 13A and 13B, respectively. As the initial guesses are far away from the converged solution, a restriction can be implemented to ensure that the iterative solution does not oscillate; $\Delta^v S_i < 0.3$ for iterations v and cell i. As an example, an under-relaxation criteria can be developed to expedite the iterative Newton solutions. In this example, the restriction criterion is sufficient to examine the iterative convergence behavior from the different upwind method. As shown, the hybrid upwinds tends to take fewer Newton iterations than the phase-velocity-based upwinds. The convergence trajectory from the initial guess, $(S_1^{n+1,0}, S_2^{n+1,0}) = (0,1)$, demonstrate the difference in iterative solutions. The convergence trajectory from the phase-velocity-based upwinds goes through the upwind direction changes at $S_2^{n+1,v}:0.54$. It took more iterations than the solution from the hybrid upwinds (6 versus 3 iterations).

Even though the two different upwinds yield solutions of about the same order of discretization error, they converge to different solutions when the viscous and gravitational forces tend to be relatively equal. Such a difference may tend to be pronounced if the discretization is large in comparison of saturation changes as in this example. Solutions from the phased-velocity-based upwind and the hybrid upwind converged $(S_1^{n+1}, S_2^{n+1}) = (0.3092, 0.3896)$ and $(0.2927, 0.3624)$, respectively. The differences will tend to become smaller, for example, if the model is discretized with more cells.

A6 Remarks

In the presence of gravity, the fractional flow tends to not be a monotonic function and multi-phase fluids can flow in co-current or counter-current directions. The upwind scheme based on phase velocity incurs a numerical instability due to discontinuous upwind changes in fractional flow if the multi-phase flow changes from co-current to counter-current.

The conservation equation from two phase flow in porous media with gravity includes two parts: viscous flow and gravitational flow. The gravitational part is counter-current with zero total velocity. An example hybrid upwind scheme based on flow types, co-current for viscous flow and counter-current for buoyancy flow, may employ one point upwind for the former and fixed counter-current upwinds for the latter. Such a hybrid upwind scheme can help to ensure smooth transitions of fractional flow (e.g., when the flow changes from co-current to counter-current, or vice versa).

As to mathematical and numerical properties of the hybrid upwind scheme, in comparison with the phase-velocity-based upwind method, the phase-velocity-based upwinds incur discontinuous derivatives of fractional flows (not $C^1$ continuity) in transition between co-current and counter-current flows, that can result in non-convergence in iterative Newton solutions. In practical reservoir simulation, most numerical instability is due to the upwind direction changes in non-linear iterations. In contrast of phase velocities, the total velocity tends to change slowly, for example, due to fixed positions of source and sink (wells). As an example, a hybrid upwind scheme can handle upwind direction changes during Newton iterations. As shown, a hybrid upwind scheme can gives approximately the same order of discretization error as a phase-velocity-based upwind scheme and may yield a slightly more dispersive solution than a phase-velocity-based upwind scheme. An implicit scheme with hybrid upwinds may satisfies a monotonic flux assumption. As a result, such an implicitly, hybrid upwind scheme may provide a monotonic solution.

In developing a stable time-stepping algorithm for multi-phase flow in porous media, a smooth, consistent discretization of the conservation equation with gravity is devised. As an example, nonlinear coupling between pressure and saturation may be analyzed to devise an under-relaxation scheme, which may allow, for example, relatively large and stable time-stepping.

A7 Godunov Method

In the Godunov scheme, the upwind does not depend on phase velocity and the fractional flow can be written as $$f_1^{god}(S) = f_1(S, 1-S) \tag{A30}$$

$$f_3^{god}(S) = f_3(S, 1-S). \tag{A31}$$

The total flux function is defined by $$f(S) = f_1^{god}(S) u_{ij} + f_3^{god}(S) C_g. \tag{A32}$$

The Godunov fluxes are given by $$f(S_L, S_R) = \begin{cases} \min_{S \in [S_L, S_R]} f(S) \text{ for } S_L \leq S_R, \\ \max_{S \in [S_R, S_L]} f(S) \text{ for } S_L \geq S_R \end{cases} \tag{A33}$$

The Godunov method uses a Riemann solver. Eq. (A33) indicates that the flux function as a function of $S_L$ is not $C^1$-continuous at the sonic point of the flux function.

Example Method

Figure 14:
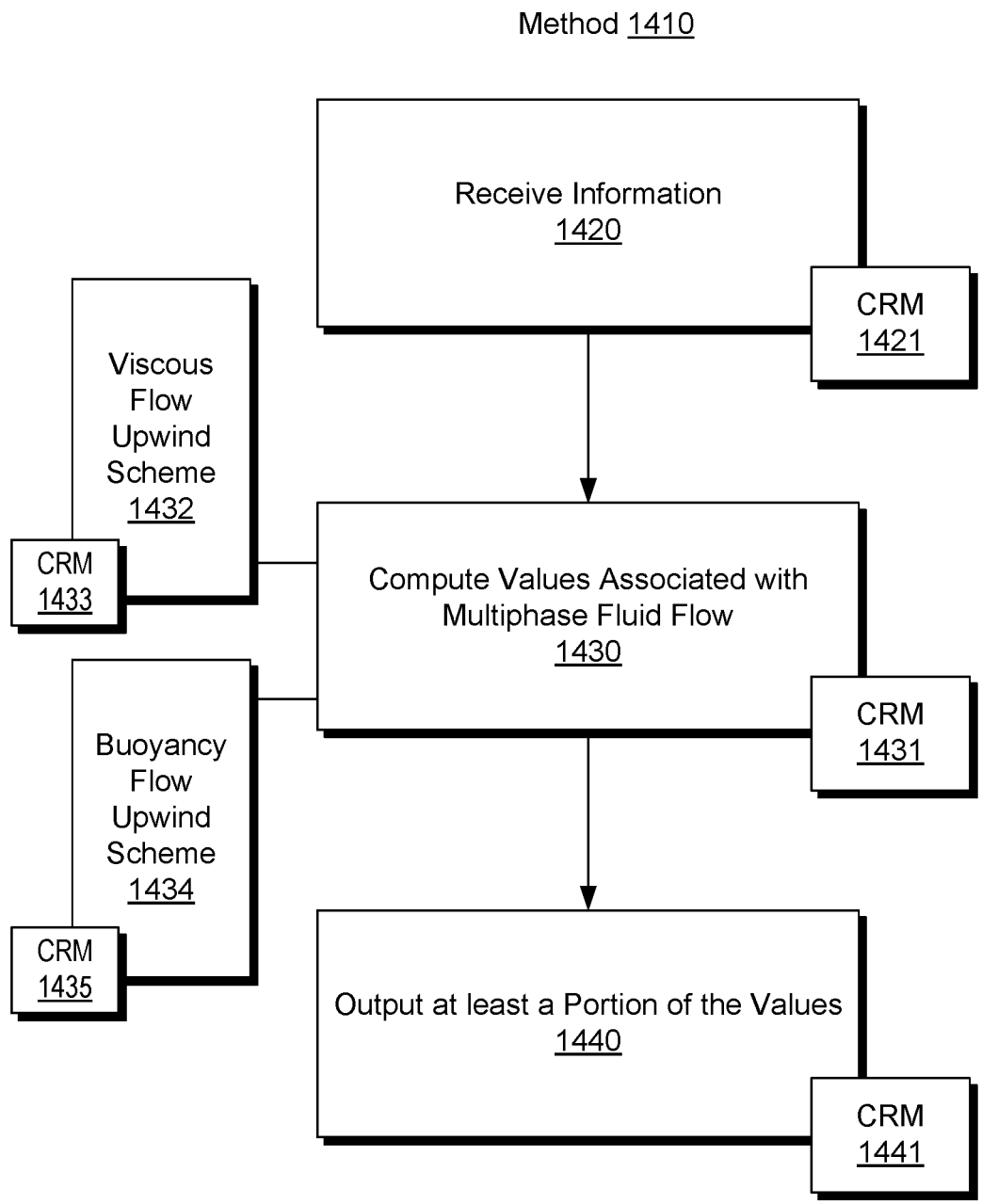
FIG. 14 illustrates an example of a method.

FIG. 14 shows an example of a method 1410 that includes a reception block 1420 for receiving information associated with a geologic environment, a computation block 1430 for, based at least in part on the information, computing values associated with multiphase fluid flow in the geologic environment using a viscous flow upwind scheme 1432 and a buoyancy flow upwind scheme 1434, and an output block 1440 for outputting at least a portion of the computed values.

The method 1410 is shown in FIG. 14 in association with various computer-readable media (CRM) blocks 1421, 1421 and 1431 as well as 1433 and 1435. Such blocks generally include instructions suitable for execution by one or more processors (or cores) to instruct a computing device or system to perform one or more actions. While various blocks are shown, a single medium may be configured with instructions to allow for, at least in part, performance of various actions of the method 1410. As an example, a computer-readable medium (CRM) may be a computer-readable storage medium that is non-transitory and that is not a carrier wave.

Example Scenario

FIG. 15 shows an example of a scenario 1500 that includes inputs 1510, outputs 1520 and a system 1550. As shown, the inputs 1510 can include field data 1511, model data 1512 and other data 1513 and the outputs 1520 can include fluid physics 1521 (e.g., values associated with multiphase fluid flow), field development plan information 1522 and field operation information 1523. In the example, the system 1550 can include one or more information storage devices 1552, one or more computers 1554, one or more network interfaces 1560 and one or more modules 1570. As to the one or more computers 1554, each computer may include one or more processors (e.g., or processing cores) 1556 and memory 1558 for storing instructions (e.g., modules), for example, executable by at least one of the one or more processors. The memory 1558 may provide for storage of information, for example, data received for processing via one or more of the one or more processors 1556, data processed via one or more of the one or more processors 1556, etc. As an example, a computer may include one or more network interfaces (e.g., wired or wireless), one or more graphics cards, a display interface (e.g., wired or wireless), etc.

In the example scenario, modules 1433 and 1435 of FIG. 14 are shown as corresponding to viscous flow and bouancy flow, respectively. An example of two cells is also illustrated as cell i and cell j where an interface exists between these cells. At the interface, fluxes may exist. For example, a viscous flux and/or a gravitation flux may exist at the interface. As shown, the viscous flux may be characterized in part by a total velocity and the buoyancy flux may be characterized in part by gravity. In such an example, the viscous flux may employ an upwind scheme based at least in part on a direction of the total velocity and the buoyancy flux may employ an upwind scheme based at least in part on a direction of gravity.

As an example, upwinds for viscous flow can be dependent on a direction of total velocity, which may change relatively slowly and/or substantially maintain a particular direction for some amount of time. As an example, upwinds for buoyancy flow (e.g., gravitational flow) can be assigned to a fixed direction (e.g., a direction of gravity) and may be formulated to be independent of a flow field. Such an approach to upwinding may be referred to as a hybrid upwind scheme, which may exhibit numerical stability and be consistent.

As an example, the scenario 1500 may provide for defining the structure and properties of a reservoir, understanding fluid and rock physics, preparing a field development plan and optionally performing one or more field operations.

As an example, multiphase flow may include one or more of two-phase flow, three-phase flow, etc. Three-phase flow in a reservoir model may be simulated via a simulator, for example, a computing system that includes one or more processors, memory operatively coupled to at least one of the processors and instruction stored in the memory that may be executable by at least one of the processors to simulate physical phenomena that can occur in a reservoir, for example, with and/or without intervention (e.g., injection, production, heating, etc.). As an example, a reservoir may be subjected to one or more enhanced oil recovery techniques (EOR). As an example, a reservoir may be subjected to one or more fracturing operations (e.g., hydraulic fracturing). As an example, a simulator may operate in conjunction with one or more other simulators, plug-ins, modules, etc., which may, for example, provide for modeling of one or more interventions, etc.

As an example, a simulator may operate in an iterative manner to generate a solution to a system of equations. For example, a Newton method may be applied where a solution may be found via a plurality of iterations that "converge" (e.g., to achieve an error or errors that are less than a target error or target errors). Depending on the system of equations and imposed boundary conditions, etc., convergence may or may not occur (e.g., within an number of iterations, within an acceptable target error, etc.). As an example, non-convergent iterations can occur in Newton method-based solution techniques for a system of nonlinear transport equations.

As an example, a method can include iteratively solving a system of equations using a consistent, $C^1$ continuous discretization of transport equations that aims to ensure a smoothly convergent solution. Such a system of equations may account for numerical characteristics of three-phase flow such that a simulator can implement a consistent, $C^1$ continuous discretization of transport equations that results in a smoothly convergent solution.

As an example, consider three-phase relative permeabilities as germane to mathematical properties in solving nonlinear transport equations. Three-phase relative permeabilities may be difficult to measure in a laboratory. As an example, such permeabilities may be correlated with two-phase relative permeabilities (e.g., oil-gas and water-oil systems). As an example, numerical convergence of nonlinear transport equations entail that three-phase relative permeabilities correlations tend to be a monotonically increasing function of phase saturation and that consistency conditions of phase transitions are satisfied. As an example, a method can include applying a linear interpolation method, for example, to yield consistent, $C^1$ continuous three-phase relative permeabilities, for example, where two phase relative permeabilities are relatively monotonic and differentiable.

As an example, a method can include applying a hybrid upwind (HU) scheme for multiphase flow (e.g., for two-phase flow to three phase flow, etc.). In such an example, the phase flux can be divided into two parts based on the driving forces: viscous and buoyancy. In such an example, the viscous-driven and buoyancy-driven fluxes can be upwinded differently. Specifically, the viscous flux, which can be co-current, can be upwinded based on the direction of the total velocity. Pure buoyancy-induced flux has been shown to be dependent on saturation distributions and can be counter-current.

In three-phase flow, the buoyancy effect can be expressed as a sum of two buoyancy effects from two-phase flows, i.e., oil-water and oil-gas systems. As an example, an upwind scheme for the buoyancy flux term from three-phase flow may be a sum of two buoyancy terms from two-phase flows. The upwind direction of the buoyancy flux in two phase flow can be fixed such that the heavier fluid goes downward and the lighter fluid goes upward.

As an example, an implicit hybrid upwind (IHU) scheme for three-phase flow can be locally conservative and produce relatively monotone physically-consistent numerical solutions. As in two phase flow, in a IHU scheme, the flux of a fluid phase may remain continuous and differentiable as the flow regime changes between co-current and counter-current conditions as a function of time, or (Newton) iterations. Such an approach is in contrast to a standard phase-potential-based upwinding scheme, in which the overall fractional-flow (flux) function is non-differentiable across the transition between co-current and counter-current flows.

B1. Introduction

Nonlinear coupled transport equations in reservoir simulation may be solved by a fully implicit method (FIM) with implicit (backward-Euler) for time and phase-potential-based upwinding (PPU) for the phase fluxes. For individual Darcy phase-flux, single-point upwinding based on the gradient of the phase potential (phase pressure plus gravity head) may be used. The implicit-PPU FIM formulation yields a system of coupled nonlinear discrete residual (mass conservation) equations, which can be solved for a given timestep. A Newton-based method may be used as the nonlinear solver. The number of mass conservation equations per control volume can be equal to the number of components used to describe the subsurface flow process. For instance, there can be two nonlinear conservation equations per cell for immiscible two-phase flow and three nonlinear conservation equations per cell for immiscible three-phase flow. Reservoir simulators may, at times, suffer from difficulties in obtaining converged numerical solutions of the coupled nonlinear system of residual equations for the chosen timestep. For example, even though FIM may be unconditionally stable, the nonlinear (Newton) solver may not be unconditionally convergent. Convergence problems associated with a nonlinear solver can lead to limits on timestep size. Such problems may affect the robustness of a simulator and limit an ability to perform reservoir simulations of highly detailed subsurface models for one or more time spans of interest. Moreover, such difficulties with a nonlinear solver may be expected to increase as the multiscale physics associated with subsurface recovery processes gets much more complex.

For two-phase flow with no gravity effect, nonlinearity in solving the transport equations can be caused by the S-shaped fractional flow curves. As an example, a physics-specific solver strategy for nonlinear two-phase flow in porous media can be implemented, whereby properties of the flux function to guide the Newton-based iterative updating of the saturation. Such an approach proposed an unconditionally convergent algorithm for two-phase flow without buoyancy. Specifically, the nonconvex, but monotone, fractional-flow (flux) function was divided into two trust regions delineated by the inflection point. If the local (cell) saturation update proposed by the full Newton step would cross the inflection saturation, the update is chopped back to the inflection point.

Two phase flow in the presence of gravity adds additional complexity in fractional flow functions. In the presence of both viscous and buoyancy forces, the different fluid phases (here, two) can flow together (co-current), or in opposite directions (counter-current), across an interface. As the flow switches between co-current and counter-current states, the upstream direction for one of the phase velocities changes. In the standard phase-potential-based upwinding (PPU) scheme, the upstream direction of a phase flux is determined based on the overall phase-potential difference. It follows that the overall fractional-flow function obtained using PPU is non-differentiable across the boundary between the co-current and counter-current flow regimes. So, as the flow regime switches between co-current and counter-current states, the upstream direction obtained using PPU switches accordingly, and the numerical flux becomes discontinuous. Note that neighboring cells in a reservoir model can have quite different properties, especially in, for example, absolute permeability; thus, in the presence of strong buoyancy forces, discontinuities in the PPU numerical-flux can be quite severe. Such discontinuities can lead to ill-conditioned Jacobian matrices and convergence problems in the Newton-based iterative process.

As an example, a hybrid upwind scheme (HU) for two phase flow in the presence of gravity may be implemented. In such an example, the viscous-driven flux tends to be co-current with respect to the total-velocity, and the buoyancy-driven flux tends to be counter-current (bell-shaped with zero end-points). Thus, for example, the upstream for the numerical viscous-flux can be determined by the total-velocity flow direction across the interface. For the counter-current numerical buoyancy-flux, the upstream can be fixed such that the lighter fluid moves upward and the heavier fluid moves downward. Such an approach can help to ensure a smooth transition, for example, as the numerical overall fractional-flow may change from co-current to counter-current (or vice versa) conditions. Such an HU scheme can be, for example, $C^1$-continuous. Such a HU scheme can gives an order of discretization errors in the PPU approach.

In reservoir simulation a three-phase flow region can occur in one or more parts of a reservoir model and can become a challenging numerical problem in convergence of the non-linear iterative solution. For example, consider numerical difficulty that can be traced to inconsistent (or substantially non-monotonic) three-phase relative permeabilities that may be used and, for example, complex phase upwind directions (e.g., as in a conventional phase-potential-based upwind method). As an example, three-phase relative permeabilities may be understood better and handled in a manner that aims to ensure consistent, convergent solution. As an example, such an approach may then be applied in an extended HU (e.g., developed for two-phase flow) that can be applied to three-phase flow with gravity.

Three-phase relative permeabilities are can be time-consuming to measure in a laboratory. As a result, three-phase relative permeabilities may be correlated with two phase relative permeabilities (e.g., oil-water and oil-gas systems). Furthermore, three phase relative permeability measurements at a laboratory may not be suitable or applicable for certain reservoir simulations, for example, because of differences in length scales (e.g., from 1-2 inches cores to 10 ft to 100 ft grid blocks). As an example, an approach can aim to provide relative permeabilities for reservoir simulation that have "nice" mathematical properties (e.g., consistency, substantial monotonicity, and $C^1$ continuity), which may act to diminish unwarranted numerical difficulties in simulation. Consistency and monotonicity of the modified Stone's method II and the linear interpolation method for three-phase relative permeabilities are discussed below and, the later is employed for various analyses and numerical computations (e.g., as it demonstrates better mathematical properties over the former).

The three phase transport equation can be expressed in total velocity and fractional flow formulation. From this formulation, buoyancy force in three-phase flow is a sum of buoyancy forces in two two-phase flows, e.g., oil-water an oil-gas systems. As an example, an approach developed for the hybrid upwind scheme for two phase flow with gravity may be extended to three-phase flow with gravity. The heaviest fluid may be water and move down from buoyancy effect, and the lightest fluid may be gas and move upward from gravity effect. The buoyancy force for an intermediate fluid such as oil may be balanced between the buoyancy forces (e.g., between oil-water and oil-gas systems). Based on physical principles, the hybrid-upwind scheme for three-phase flow with gravity can be designed to yield consistent, $C^1$ continuous discretization.

In Section B2, mathematical properties of the modified Stone's method II and linear interpolation method for three-phase relative permeabilities are discussed and the linear interpolation method is selected for reservoir simulation. In Section B3, the transport equation of three-phase flow with gravity is set forth and fractional flow formulations derived. In Section B4, an example of a hybrid upwinding discretization scheme for three-phase flow in porous media in the presence of gravity is set forth and the properties of the fractional-flow functions are examined. In Section B5, the mathematical and numerical properties of the hybrid upwinding method are briefly discussed and compared with a phase-potential based upwinding method, and in Section B6, some numerical examples with the Hybrid Upwinding Method for linear displacement, gravity segregation problems are presented.

Figure 16A:
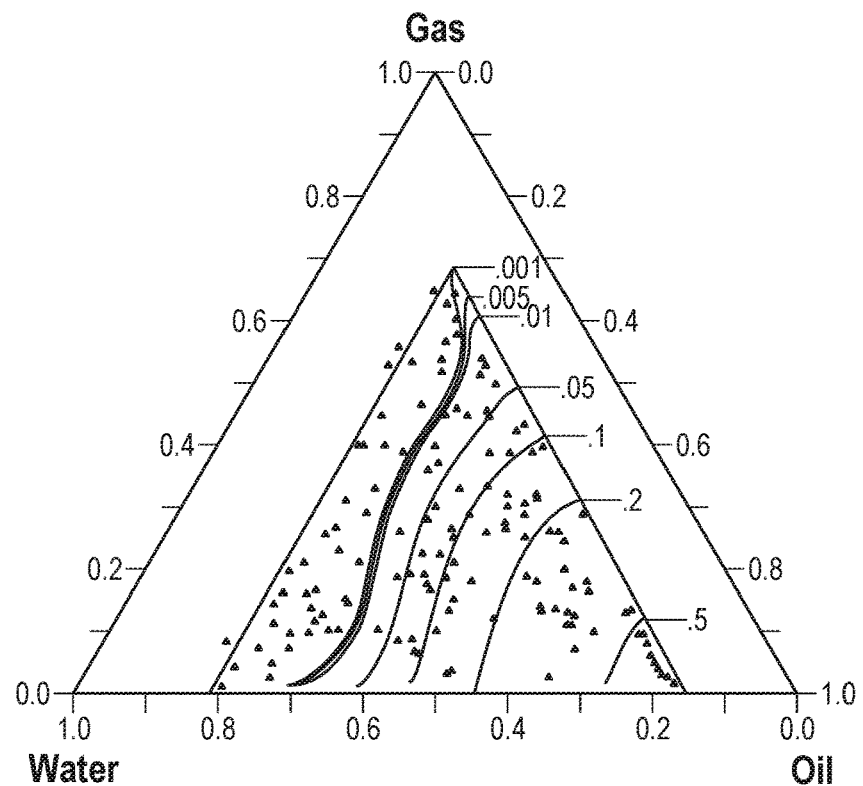
FIGS. 16A and 16B illustrate example plots of three-phase relative permeability models associated with the modified Stone's method II and the linear interpolation method, respectively.
Figure 16B:
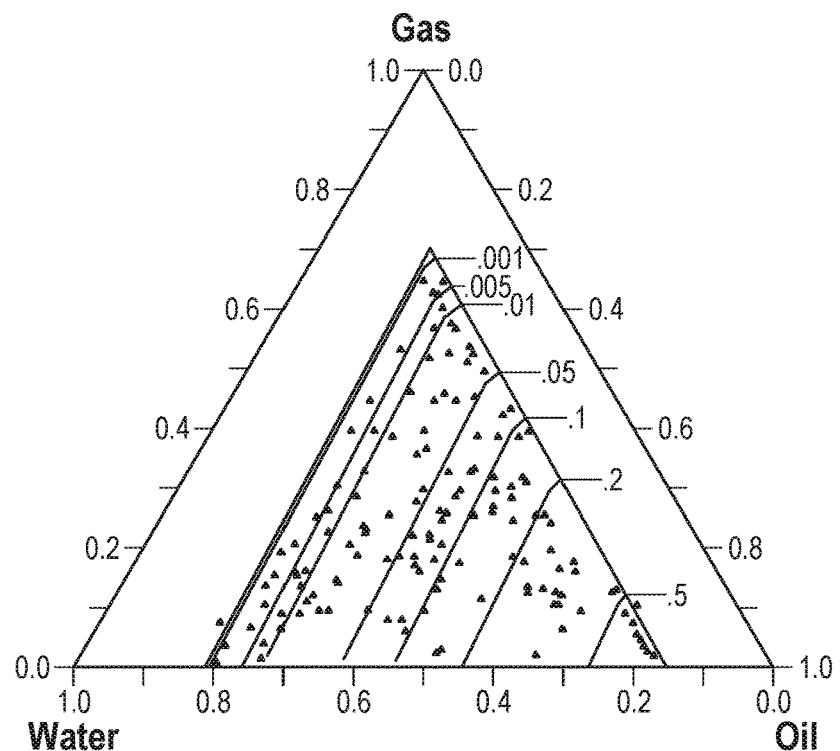

FIGS. 16A and 16B show three-phase relative permeability models where the points are experimental data and the lines are from the modified Stone's method II for FIG. 16A and the linear interpolation method for FIG. 16B.

B2. Three-Phase Relative Permeability

Three-phase flow in porous media is not particularly understood owing to the complexity of physical phenomena and practical difficulty in measuring three-phase relative permeabilities. In a reservoir conditions, three-phase flow can occurs in one or more areas, which may be limited. Nonetheless, three-phase flow may appear in a reservoir simulation because of a length scale of one or more grid blocks likely involves a combination of two-phase flows in the block. In such a situation, an understanding of how three-phase relative permeabilities are measured or calculated and their relevance in reservoir simulation can be helpful.

Due to the complexity of three-phase relative permeability measurements, three-phase relative permeability may be approximated by a combination of two two-phase relative permeabilities, e.g., water-oil and oil-gas systems or other systems. As an example, three-phase relative permeabilities correlations that may be used in industry. As an example, a simulator may apply the Linear interpolation method, for example, for reservoir simulation. The modified Stone's method II may be employed in industry, but its substantially non-monotonic characteristics and negative values of the correlations often incur difficulties in numerical convergence. Baker proposed two simple correlations for three-phase relative permeabilities: Saturation-Weighted Interpolation and Linear Interpolation. Heiba also studied three-phase relative permeabilities with a statistical network model and percolation theory, and later stated that the Linear interpolation method can approximate statistical/percolation results.

The mathematical characteristics of the modified Stone's method II and the Linear interpolation method are discussed and then a simple combination of two-phase flows that is consistent with Linear interpolation method and Saturation-Weighted Interpolation. With this interpolation, as an example, one may build a relatively stable algorithm for three phase flow in the presence of gravity.

B2.1 Modified Stone's Method II

Stone observed that gas and water relative permeabilities are the same functions in the three phase as in two-phase flow. He then derived oil relative permeability by considering the effects water and gas have on the total relative permeability. Dietrich and Bondor modified Stone's method II to ensure the oil relative permeability is consistent at connate water saturation and zero gas saturation.

$$k_{ro} = \frac{1}{k_{rocw}}(k_{row} + k_{rw})(k_{rog} + k_{rg}) - (k_{rw} + k_{rg}) \quad \text{(B1)}$$

Here, $k_{ro}$, $k_w$, and $k_{rg}$ are oil, water and gas relative permeability, respectively. The $k_{rocw}$ is oil relative permeability at connate water saturation, $k_{row}$ is oil relative permeability in the oil-water system, and $k_{rog}$ is oil relative permeability in the oil-gas system. Note that $S_w$ is used to evaluate $k_w$ and $k_{row}$ and $S_g$ is directly used to calculate $k_{rg}$ and $k_{rog}$. The relative permeabilities for the water and gas phases are approximated to the same functional form from two-phase relative permeabilities, such as the water relative permeability is computed from the water relative permeability from oil-water system and the gas relative permeability from the gas relative permeability from the oil-gas system.

$$k_{rw} = k_{rwo}(S_w) \quad \text{(B2)}$$

$$k_{rg}=k_{rgo}(S_g) \tag{B3}$$

Here, $k_{rgo}$ and $k_{rwo}$ denote the relative permeabilities of gas in the oil-gas system and water in the water-oil system, respectively.

The modified Stone's Method II may be employed in reservoir simulators. As evidenced in FIG. 16A, the oil relative permeability from the modified Stone II method may yield substantially non-monotonic behavior, especially in the region of low $k_{ro}$. This non-monotonic behavior can poses a numerical challenge in reservoir simulation. Three-phase relative permeability is difficult to experimentally measure and not many consistent data are available. Furthermore, as discussed, the three-phase flow in reservoir simulation may be likely due to a large scale of grid-block that includes a combination of two-phase flows. Consequently, it does not particularly warrant employment of a complex nonlinear functional form such as the modified Stone's method II for three-phase relative permeability in reservoir simulation.

B2.2 Linear Interpolation Method

Heiba investigated three-phase flow by a statistical percolation theory. Later, Heiba proposed a straight-line interpolation between $k_{row}$ and $k_{rog}$ with constant $k_{ro}$ in a ternary diagram of three-phase relative permeability. Baker also proposed a linear interpolation method, in which the relative oil permeability can be approximated by a straight line between two saturations that give identical $k_{ro}$ in the oil-water and oil-gas systems. It is identical to Heiba's method. The Linear interpolation method is depicted in FIG. 16B. Heiba proposed that the oil-phase phase relative permeability at given $S_g$ and $S_w$ is given by solving the non-linear equation:

$$\frac{S_g}{S_g^{og}(k_{ro})} = \frac{S_w^{ow}(k_{ro}) - S_w}{S_w^{ow}(k_{ro}) - S_{wc}} \tag{B4}$$

Here, $S_g^{og}(k_{ro})$ is the gas saturation at which the measured oil relative permeability is $k_{ro}$ in the gas flood carried out at the irreducible water saturation, $S_{wc}$. $S_w^{ow}(k_{ro})$ is the water saturation at which the measured oil relative permeability is $k_{ro}$ in a water flood of oil.

Baker also proposed the same model, linear interpolation model, and formulate a nonlinear programming problem to determine the straight line that intersects the relative permeabilities of gas-oil and oil-water systems to yield the same oil relative permeability and passes the point of given three-phase saturation. In the following, it is shown that the Linear interpolation method can be recast as a two-domain model with two-phase flows that can be solved algebraically.

For given uncertainties in experimental measurements and the scaling issues in a reservoir model, the linear interpolation method appears to be a monotonic method that has been successfully applied in reservoir simulation. As shown in FIG. 16B and in Eq. (B4), a straight-line interpolation method by Heiba's solution is equivalent to split three phase into two two-phase (o-w and o-g) regions in which the oil relative permeability is identical in two regions.

As an example, a method may include implementing the following algorithm (e.g., for reservoir simulation, etc.), with reference to an oil, water and gas system; noting that one or more other types of systems may be considered and handled.

When a cell with saturations $(S_o, S_w, S_g)$ is split into the two regions ($L_1$ for the oil-gas system and $L_2$ for the water-oil system), the mass balance and saturation constraint equations yield become the following equations:

$$1 = L_1 + L_2, \tag{B5}$$

$$1 = S_o + S_w + S_g, \tag{B6}$$

$$1 = S_o^1 + S_g^1, \tag{B7}$$

$$1 = S_o^2 + S_w^2, \tag{B8}$$

$$S_o = L_1 S_o^1 + L_2 S_o^2, \tag{B9}$$

$$S_g = L_1 S_g^1, \tag{B10}$$

$$S_w = L_2 S_w^2, \tag{B11}$$

where the superscripts 1 and 2 denote the saturations in $L_1$ and $L_2$. The equivalence of oil relative permeability in two domains is given by $$k_{rog}(S_o^1) = k_{row}(S_o^2) \tag{B12}$$

Assume the two-phase relative permeabilities are given by simple Corey-type exponential functions:

$$k_{rog}(S_o^1) = c_1 (S_o^1)^{m_1}, \tag{B13}$$

$$k_{rgo}(S_g^1) = c_2 (S_g^1)^{m_2}, \tag{B14}$$

$$k_{row}(S_o^2) = c_3 (S_o^2)^{m_3}, \tag{B15}$$

$$k_{rwo}(S_w^2) = c_4 (S_w^2)^{m_4}. \tag{B16}$$

Substituting Eqs. (B13) and (B15) into Eq. (B12), it can be obtained $$S_o^2 = \left(\frac{c_1}{c_3}\right)^{\frac{1}{m_3}} (S_o^1)^{\frac{m_1}{m_3}} = c_5 (S_o^1)^{m_5}, \tag{B17}$$

where $c_5 = (c_1/c_3)^{1/m_3}$ and $m_5 = m_1/m_3$. From Eqs. (B5)-(B11) and (B17) it can be obtained a nonlinear equation for the fraction $L_1$ for the oil-gas region:

$$0 = 1 - \frac{S_w}{1 - L_1} - c_5 \left(1 - \frac{S_g}{L_1}\right)^{m_5} \tag{B18}$$

Eq. (B18) can be iteratively solved by Newton's method. $S_o^1$ and $S_o^2$ can readily computed from Eqs. (B5)-(B12) and the oil-phase relative permeability becomes $$k_{ro} = k_{rog}(S_o^1) = k_{row}(S_o^2) \tag{B19}$$

The relative permeabilities for water and gas are proposed to use the same ones in two-phase flows that are given in Eq. (B2).

If $m_5$ is one (e.g., $m_1 = m_3$), $L_1$ can be analytically solved.

$$L_1 = \frac{-b + \sqrt{b^2 - 4ac}}{2a} \tag{B20}$$

where $$a = 1 - c_5 \tag{B21}$$

$$b = S_w = c_5 S_g - 1 + c_5 \tag{B22}$$

$$c = -c_5 S_g \tag{B23}$$

B2.3 A Combination of Two-Phase Flows

The linear interpolation method, discussed in the previous section, was derived from statistical network and percolation theory. As discussed in B2.2, the oil relative permeability can be interpreted as a combination of two-phase flows in which the oil relative permeability is the same. The saturation-weighted interpolation method splits the three-phase into oil water and oil-gas systems by assuming the oil saturation remains the same in the two two-phase flows. This linear interpolation methods intrinsically imply that the weight factor of two phase relative permeabilities are computed from the split of the three phase flow into two two-phase flows. As mentioned before, the three-phase flow may occurs in a quite limited domain in a reservoir model, and three phase saturation in a grid may be arguably due to a combination of two phase flows in a discrete grid of a reservoir model. With such considerations at hand, relative permeabilities for water and gas may be given as:

$$k_{rg}(S_g) = L_1 k_{rgo}(S_g^1) \quad (B24)$$

$$k_{rw}(S_w) = L_2 k_{rwo}(S_w^2) \quad (B25)$$

For the Correy type two-phase relative permeabilities, consider:

$$k_{ro}(S_o) = L_1 c_1 (S_o^1)^{m1} + L_2 c_3 (S_o^2)^{m3}, \quad (B26)$$

$$k_{rg}(S_g^1) = L_1 c_2 (1-S_o^1)^{m2}, \quad (B27)$$

$$k_{rw}(S_w^2) = L_2 c_4 (1-S_o^2)^{m4}. \quad (B28)$$

Figure 17A:
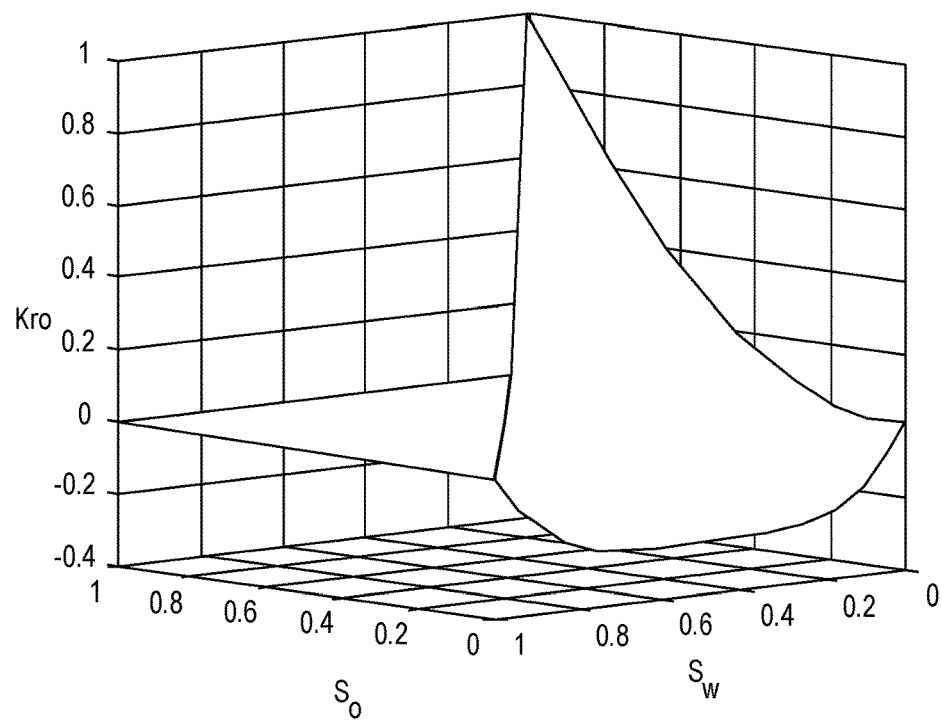
FIGS. 17A and 17B illustrate example plots of three-phase relative permeability associated with Stone's method II and the linear interpolation method, respectively.
Figure 17B:
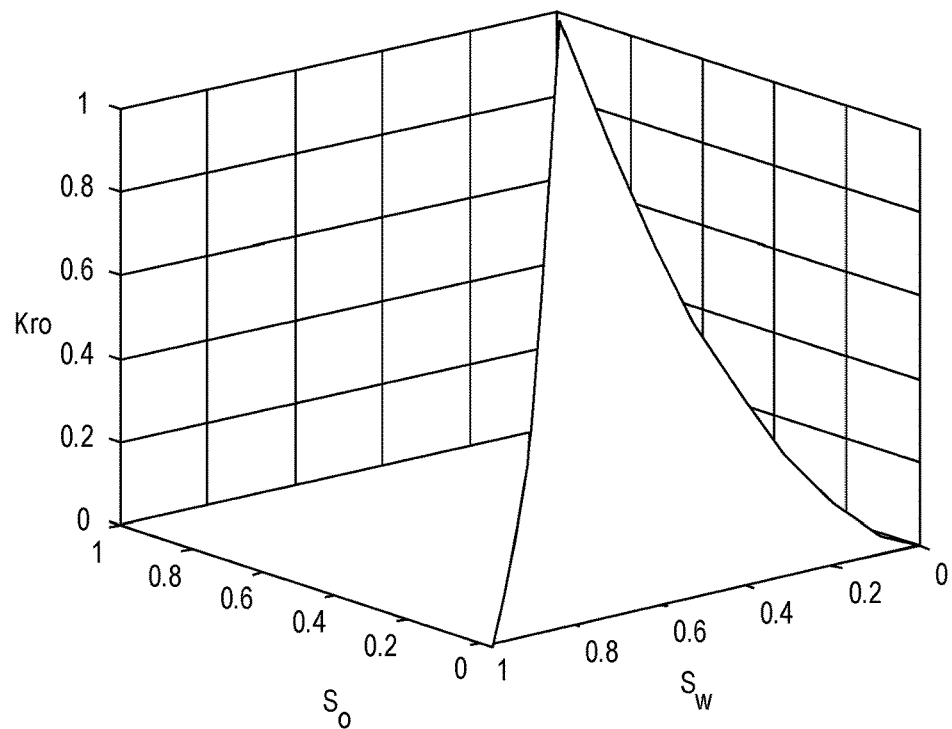

FIGS. 17A and 17B show three-phase relative permeability models in Baker where the points are the experimental data by Hossin and the lines are from Stone's method (FIG. 17A) and the linear interpolation method (FIG. 17B).

B2.4 Discussion

The approximation of total mobility reduction in Stone's method is plausible, but not rigorously proven by theoretical analysis or experimental measurements. As measurements of three-phase relative permeability can be difficult to achieve in a laboratory, the models of three-phase relative permeabilities may be constructed from relative permeabilities of two two-phase flows (water-oil and oil-gas systems). As an example, one or more models in reservoir simulation may entail a smooth, monotonic function in $C^1$ continuity. As an example, an approach may include a smooth, consistent transition between two-phase and three-phase relative permeabilities, for example, to help to ensure numerical convergence in finite difference simulation:

$$\lim_{S_g \to 0} k_{ro}(S_w, S_o, S_g) = k_{row}(S_w, S_o) \quad (B29)$$

$$\lim_{S_g \to 0} k_{rw}(S_w, S_o, S_g) = k_{rwo}(S_w, S_o) \quad (B30)$$

$$\lim_{S_w \to 0} k_{ro}(S_w, S_o, S_g) = k_{rog}(S_o, S_g) \quad (B31)$$

$$\lim_{S_w \to 0} k_{rg}(S_w, S_o, S_g) = k_{rgo}(S_o, S_g) \quad (B32)$$

In FIG. 17A and FIG. 17B, the oil-phase relative permeabilities, computed by Stone's method and the linear interpolation method are depicted, respectively, for a simple system with quadratic two-phase relative permeabilities and $S_{wc} = 0$. Both methods yield similar $k_{ro}$ for high $S_o$, but very different one for small $S_o$. Stone's method gives unphysical, negative $k_{ro}$ in low $S_o$ that has to be removed. This may cause inconsistency and non-convergence in flow solution. Stone's method does not satisfy the consistency condition in Eq. (B29)-(B32). This non-monotonic behavior for low $S_o$ is also evident in the results in FIG. 16A. In comparison, the linear interpolation method produces smooth, monotonic relative permeabilities, as shown in FIG. 17B. Further, this linear interpolation scheme is based on a statistical network and percolation theory of multi-phase flow in random porous media, without ad-hoc approximation (e.g., as may exist in some models). The three-phase relative permeability can be sought to be identical to two-phase relative permeability if one phase asymptotically disappears. The modified Stone's method II does not satisfy this type of fundamental consistency.

Assuming accurate three-phase relative permeabilities are available in micro scale (i.e., of 1-2 inches in core scale), a method may upscaled relative permeabilities for one or more simulation grid blocks (e.g., consider length scales of the order of about 10 ft to about 100 ft or possibly more). As three-phase flow may be quite localized in a reservoir model and limited in pore level, the three-phase flow in reservoir simulation can be due to the fact that a simulation grid includes multiple two-phase flow domains. In this interpretation, the mixed-two-phase flow model may be implemented because it is valid, independent of scales and it has nice mathematical properties of monotonicity and continuity. Considering large uncertainties in three-phase relative permeabilities, the linear form of the combination of-two-phase flow model, e.g., the linear interpolation method, may suffice in practical application of reservoir simulation. In various discussions that follow, the linear interpolation method is selected as an example to be used in flow computation.

B3. Fractional Flow

Three-phase flow with gravity is considered. As in the two-phase flow stability analysis by Lee, capillary pressure is not included in the analysis.

Darcy's law for three phase flow can be written as $$u_\alpha = k k_{r\alpha} \mu_\alpha (\nabla p + \rho_\alpha g \nabla H). \quad (B33)$$

Here, k is permeability, u is phase velocity, k is permeability, $\mu$ is viscosity, H denotes the height and $\rho$ is density. The subscript $\alpha$ denotes the phase properties (i.e., $\alpha$=w, o, g for water, oil and gas phases, respectively). From equation (33), consider:

$$u_w = f_1(S_w, S_o, S_g) u_T - f_4(S_w, S_o, S_g) C_{g1} - f_5(S_w, S_o, S_g) C_{g2}, \quad (B34)$$

$$u_o = f_2(S_w, S_o, S_g) u_T + f_4(S_w, S_o, S_g) C_{g1} - f_6(S_w, S_o, S_g) C_{g3}, \quad (B35)$$

$$u_g = f_3(S_w, S_o, S_g) u_T + f_5(S_w, S_o, S_g) C_{g2} + f_6(S_w, S_o, S_g) C_{g3}. \quad (B36)$$

The total velocity can be defined as:

$$u_T = u_w + u_o + u_g \quad (B37)$$

and the fractional parameters can be given by $$f_1 = k_{rw} k_{rw} + M_2 k_{ro} + M_3 k_{rg}, \quad (B38)$$

$$f_2 = M_2 k_{ro} k_{rw} + M_2 k_{ro} + M_3 k_{rg}, \quad (B39)$$

$$f_3 = M_3 k_{rg} k_{rw} + M_2 k_{ro} + M_3 k_{rg}, \quad (B40)$$

$$f_4 = M_2 k_{rw} k_{ro} k_{rw} + M_2 k_{ro} + M_3 k_{rg}, \quad (B41)$$

$$f_5 = M_3 k_{rw} k_{rg} k_{rw} + M_2 k_{ro} + M_3 k_{rg}, \quad (B42)$$

$$f_6 = M_2 M_3 k_{ro} k_{rg} k_{rw} + M_2 k_{ro} + M_3 k_{rg}, \quad (B43)$$

where $M_1$ is the inverse of fluid viscosity ratio with respect to water viscosity, $\mu_w/\mu_\alpha$ (e.g., $M_2=\mu_w/\mu_o$ and $M_3=\mu_w/\mu_g$). The velocity due to gravity force can be characterized by variables, $C_{gi}$, $$C_{g1}=kg(\rho_w-\rho_o)\mu_w u_c \nabla H, \quad (B44)$$

$$C_{g2}=kg(\rho_w-\rho_g)\mu_w u_c \nabla H, \quad (B45)$$

$$C_{g3}=C_{g2}-C_{g1}, \quad (B46)$$

where $u_c$ is a characteristic velocity. Note that velocities $u_T$ and $u_\alpha$ in Eqs. (B34)-(B36) are non-dimensionalized with respect to $u_c$. Since there is a constraint for saturations:

$$1=S_w+S_o+S_g, \quad (B47)$$

two equations in Eqs. (B34)-(B36) are independent. An approach may choose equations $u_w$ and $u_o$ for independent equations and also choose $S_w$ and $S_o$ as independent variables by substituting $S_g$ by $1-S_o-S_w$. In addition, an approach may assume that water is the heaviest phase, oil is the intermediate phase and gas is the lightest phase: $\rho_w > \rho_o > \rho_g$. Note that the fluxes due to buoyancy force are dependent on saturation distributions, independent of pressure and total velocity. Furthermore, the total net flux from the buoyancy force remains to be zero.

Figure 18B:
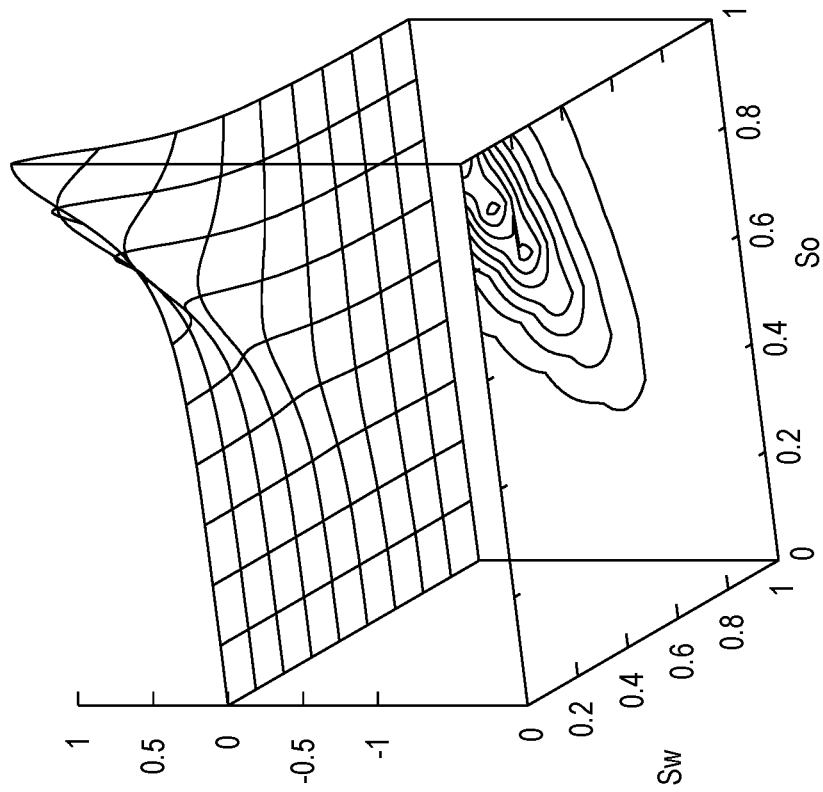
FIGS. 18A and 18B illustrate example plots of fractional flow surfaces without effect of gravity for water phase and oil phase, respectively.
Figure 18A:
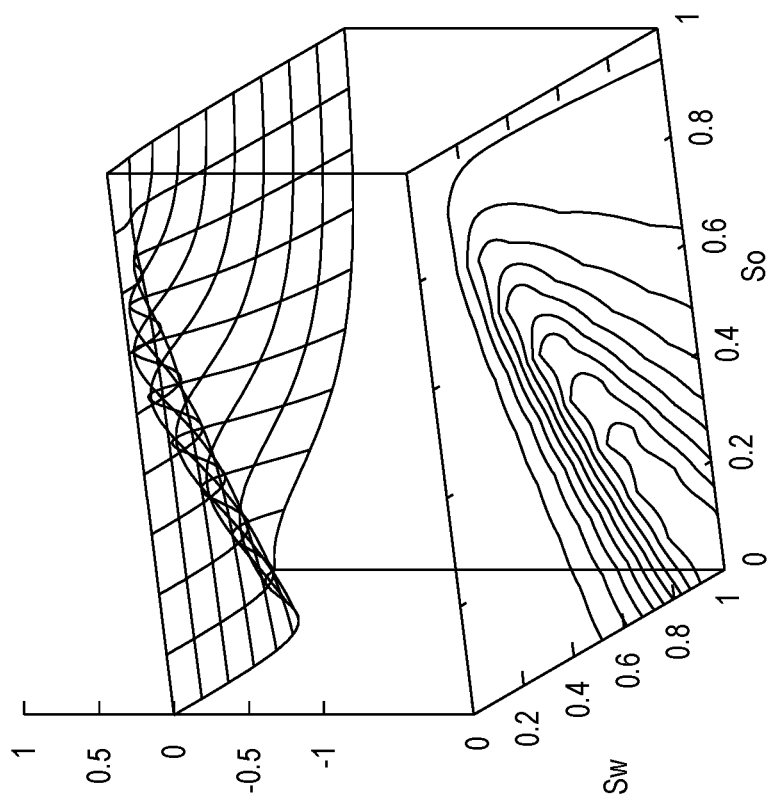

FIGS. 18A and 18B show fractional flow surfaces with no gravity effect: $M_2=0.2$, $M_3=10$. $C_{g1}=C_{g2}=0$ where FIG. 18A is for water phase FIG. 18B is for oil phase.

Figure 19B:
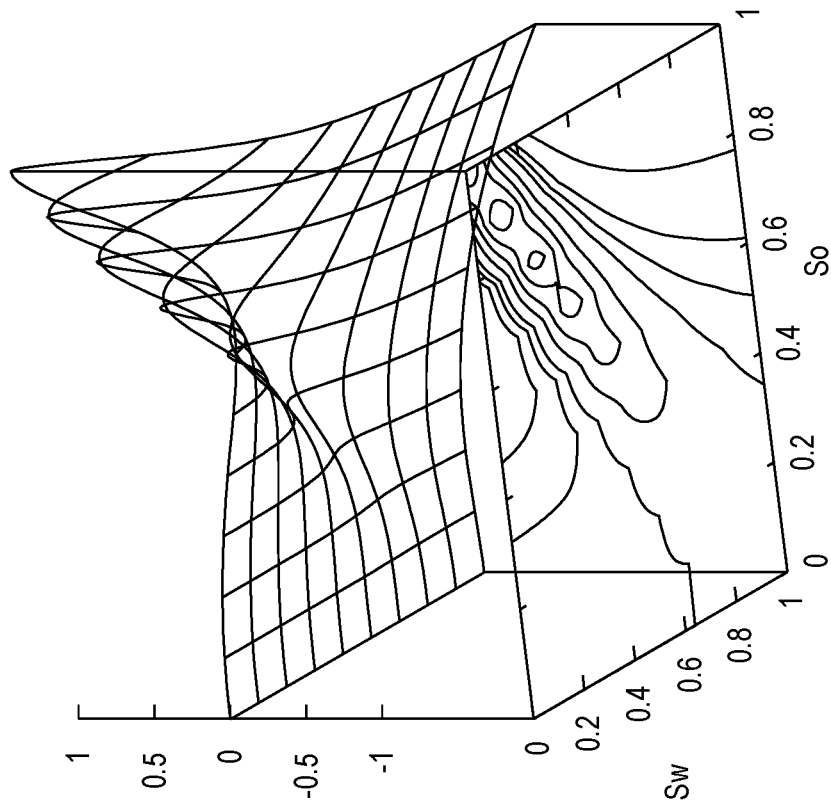
FIGS. 19A and 19B illustrate example plots of fractional flow surfaces with the effect of gravity for water phase and oil phase, respectively.
Figure 19A:
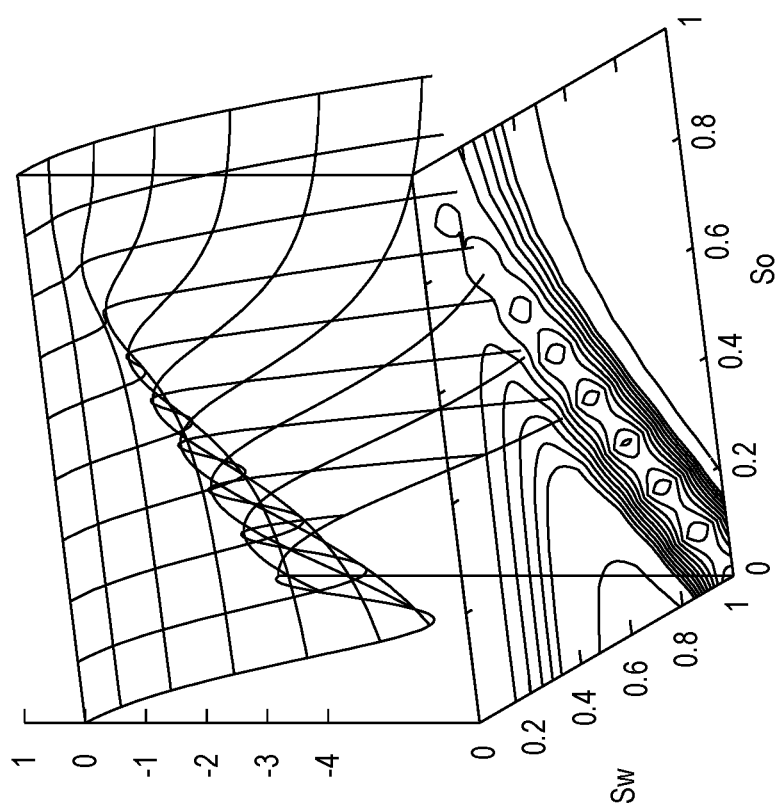

FIGS. 19A and 19B show fractional flow surfaces with gravity effect: $M_2=0.2$, $M_3=10$. $C_{g1}=5$, $C_{g2}=10$ where FIG. 19A is for water phase FIG. 19B is for oil phase.

3.1 Examples with a Model with Uniform Oil Saturation

It can be instructive to examine fractional flow surfaces from Eqs. (B34) and (B35):

$$F_w=u_w|u_T|, F_o=u_o|u_T|. \quad (B48)$$

An approach may choose an example with mobility ratios, $M_2=0.2$ and $M_3=10$ and quadratic relative permeabilities, $$k_{r\alpha}=S_\alpha^2. \quad (B49)$$

In FIGS. 18A, 18B, 19A and 19B, plots are plotted for the fractional flow surfaces for no gravity ($C_{g1}=C_{g2}=0$) and strong gravity ($C_{g1}=5$ and $C_{g2}=10$), respectively. The fractional flow curves are monotonic for small $C_{g1}$ and $C_{g2}$, whereas it can become a multi-valued function for large $C_{g1}$ and $C_{g2}$. Note that depending on the directions of gravity force and velocity, the fractional flow can be smaller than zero or larger than one. Such a situation may cause numerical difficulty if the Newton nonlinear iteration does not take into account the actual pattern of these surfaces.

From Eqs. (B34) and (B35) an approach can derive the bounding curves where the fractional flow becomes zero.

$$0=u_T-M_2 C_{g1} k_{ro}-M_3 C_{g2} k_{rg}, \quad (B50)$$

$$0=u_T+C_{g1} k_{rw}-M_3 C_{g3} k_{rg} \quad (B51)$$

For quadratic relative permeabilities, equations (B50) and (B51) become $$0=u_T-M_2 C_{g1} S_o^2-M_3 C_{g2}(1-S_w-S_o)^2, \quad (B52)$$

$$0=u_T+C_{g1} S_w^2-M_3 C_{g3}(1-S_w-S_o)^2 \quad (B53)$$

B4. Upwind Schemes

As an example, the overall fractional-flow function of two-phase flow, in the presence of buoyancy, can become nonmonotonic, which reflects that the two phases flow in opposite directions across an interface (counter-current flow). The conventional upwinding method of the phase velocities, which is based on the overall phase potential (PPU) suffers from nonlinear convergence difficulties due to discontinuous changes in the upwinding direction of the fluid phases, as a function of time, or Newton iterations. Since the viscous-driven flux is co-current with respect to the total-velocity, and the buoyancy-driven flux tends to be counter-current (bell-shaped with zero the end-points), an approach can implement, for example, a hybrid upwind (HU) scheme for two-phase flow. For example, consider the upstream for the viscous flux as being determined by the total-velocity flow direction across the interface.

For the counter-current buoyancy flux, the upstream can be fixed such that the lighter fluid moves upward and the heavier fluid moves downward. Such an approach can help to ensure a smooth transition as the overall fractional-flow changes from co-current to counter-current (or vice versa) conditions. Three-phase flow in porous media can exhibit complex flow behaviors in the presence of gravity due to multiple density differences in fluid phases. As an example, a HU scheme for two-phase flow can be extended to three-phase flow, for example, in a manner that will make the numerical scheme becomes consistent and $C^1$ continuous. For example, in the "A" sections above, the two-phase flow equations may be extended to three-phase flow, for example, per the description in "B" section.

B4.1 Phase-Potential-based Upwind (PPU) Scheme

If the relative-permeability at the interface between cells i and j is determined by the upstream saturation of phase $\alpha$ ($S_{\alpha,ij}$), then the phase-velocity at the interface is given by:

$$u_{\alpha,ij}=-k\frac{k_{r\alpha}(S_{\alpha,ij})}{\mu_\alpha}[\nabla p + \rho_\alpha g \nabla H], \quad (B54)$$

where $\nabla p$ is the pressure gradient, and $\nabla H$ is a unit-vector in the z direction. Here, the upwind phase saturation at the interface between cells i and j is defined by $$\begin{aligned}S_{\alpha,ij} &= S_{\alpha,i} \text{ if } p_i-p_j+\rho_\alpha(H_i-H_j) \geq 0 \\ &= S_{\alpha,j} \text{ if } p_i-p_j+\rho_\alpha(H_i-H_j) < 0.\end{aligned} \quad (B55)$$

Eq. (55) is the single-point PPU scheme. In this scheme, the upstream of a phase is determined by the direction of the phase velocity dictated by the local overall gradient of the phase-potential due to both viscous and buoyancy forces. Thus, for a given interface, depending on the overall phase-potential gradient of each phase, the two phases may flow in the same (co-current), or opposite (counter-current), directions. The fractional-flow functions at the interface between cells i and j are rewritten as:

$$f_{l,ij}(S_w,S_o,S_g)=f_l(S_{w,ij},S_{o,ij},S_{g,ij}), \text{ where } l=1\ldots 6 \quad (B56)$$

where $f_1$-$f_3$ are the viscous-force-induced fractional flow functions, and $f_4$-$f_6$ are the buoyancy-force-induced fractional flow functions. Since both viscous and buoyancy forces contribute to the overall phase-velocity, determining the upwind direction based on the overall gradient of the phase-potential can be a source of numerical difficulties in Newton solvers. This is because the upstream direction is then quite sensitive to small differences in the pressure. The sensitivity can be particularly strong when the local force balance is dominated by buoyancy (i.e., close to gravity equilibrium). In practice, the flip-flopping of the upwind direction of the phase velocities as a function of time, or Newton iterations, due to small changes in the overall phase-potential difference can lead to convergence problems. Note that flip-flopping across a very small number of interfaces is enough to prevent the global Newton loop from reaching an acceptable numerical solution.

B4.2 Hybrid Upwind (HU) Scheme

In a HU scheme for two-phase flow, an approach can consider that the viscous flux is upwind based on the total velocity and the buoyancy flux is upwind by a physical rule that the buoyancy force moves the heavier fluid downward and the lighter fluid upward with respect to the downward gravity direction. That is, upwinding of the buoyancy-driven fractional-flow is fixed by the density difference between the two phases and the orientation of the interface with respect to gravity, and it does not depend on the local pressure distribution. Treating the viscous and buoyancy fluxes differently can lead to a locally conservative and smooth approximation.

As an example, phase fluxes and fractional flow functions for three-phase flow in Eqs. (B34)-(B36) in the HU scheme for two-phase flow may be extended to three-phase flow. The phase fluxes of three-phase flow can be composed of two parts: (1) $f_l u_T$, for l=1-3 due to the viscous force, and (2) $f_l C_g$ for l=4-6 due to the buoyancy force. As in two-phase flow, the fluxes due to buoyancy force are independent of pressure and velocity field and dependent on saturation distributions (e.g., solely dependent thereon). The buoyancy fluxes in three phase flow include buoyancy fluxes from two-phase systems. In addition, the sum of the phase fluxes tends to remain approximately zero.

As an example, a method that can be implemented by a simulator (e.g., a computing system, etc.) may include an upwinding scheme that treats the viscous flux differently from the buoyancy flux. For example, the viscous fractional flow, $f_l$ for l=1-3, can be upwinded based on the direction of the total-velocity, $u_{T,ij}$. And, as an example, the buoyancy flux can be first split into contributions from two two-phase systems. In such an example, for each two-phase system, a method can include applying the upwind direction as in two-phase flow: the heavier fluid moves down, and the lighter fluid moves up. Treating the viscous and buoyancy fluxes differently can lead to a locally conservative and smooth approximation, for example, even for the three-phase flow. The differentiable flux approximation allows for smoother evolution of the nonlinear solution, and it can also lead to improvements in the performance of Newton-based nonlinear solvers.

The upwinding cell with respect to the total-velocity may be defined as:

$$S^U_{\alpha,ij} = S_{\alpha,j} \text{ if } u_{T,ij} \geq 0 \quad \text{(B57)}$$
$$= S_{\alpha,j} \text{ if } u_{T,ij} < 0.$$

The upwinding direction due to buoyancy may be defined as:

$$S_{w,ij}{}^G = S_{w,j}, S_{g,ij}{}^G = S_{g,i}, S_{o,ij}{}^{G,wo} = S_{o,i}, S_{o,ij}{}^{G,og} = S_{o,ij}{}^{G,wg} = S_{o,j}, \text{ if } (x_i - x_j) \cdot g \geq 0 \quad \text{(B58)}$$

$$S_{w,ij}{}^G = S_{w,j}, S_{g,ij}{}^G = S_{g,i}, S_{o,ij}{}^{G,wo} = S_{o,i}, S_{o,ij}{}^{G,og} = S_{o,ij}{}^{G,wg} = S_{o,j}, \text{ if } (x_i - x_j) \cdot g < 0. \quad \text{(B59)}$$

That is, for the buoyancy flux, the upstream direction can be determined as follows: the heavier fluid moves downward, and the lighter fluid moves upward in each two-phase combination in Eqs. (B34)-(B36). The intermediate-phase oil saturation can be determined whether the buoyancy force is due to water-oil ($S_{o,ij}{}^{G,wo}$), oil-gas ($S_{o,ij}{}^{G,og}$) or water-gas ($S_{o,ij}{}^{G,wg}$) system. So, for such a hybrid scheme, the fractional-flow functions can be defined as:

$$f_{l,ij}(S_w, S_o, S_g) = f_l(S_{w,ij}^U, S_{o,ij}^U, S_{g,ij}^U), \text{ for } l=1\text{-}3 \quad \text{(B60)}$$

$$f_{4,ij}(S_w, S_o, S_g) = f_4(S_{w,ij}^G, S_{o,ij}^{G,wo}, S_{g,ij}^G) \quad \text{(B61)}$$

$$f_{5,ij}(S_w, S_o, S_g) = f_5(S_{w,ij}^G, S_{o,ij}^{G,wg}, S_{g,ij}^G) \quad \text{(B62)}$$

$$f_{6,ij}(S_w, S_o, S_g) = f_6(S_{w,ij}^G, S_{o,ij}^{G,og}, S_{g,ij}^G) \quad \text{(B63)}$$

The gravitational direction of oil phase can be determined by the direction of buoyancy forces in water-oil, oil-gas and water-gas systems (i.e., $S_{o,ij}{}^{G,wo}$ and $S_{o,ij}{}^{G,og}$). Note that the upwinding direction for the viscous flux depends on the total-velocity direction, which may change slowly in time. The upwinding for the buoyancy-driven flux can be fixed independently of the pressure field. This resulting hybrid upwinding scheme can be smooth ($C^1$-continuity), and that can help an iterative Newton solver. Note that such a hybrid scheme can be conservative and consistent.

The two different upwinding strategies for the viscous and buoyancy fluxes lead to the following form of the discrete Darcy equation Eq. (B54):

$$u_{\alpha,ij} = -k\lambda^U_{\alpha,ij}(\nabla p + \rho_\alpha g \nabla H) + \sum_\ell \left(-\frac{\lambda^U_{\alpha,ij}\lambda^U_{\ell,ij}}{\lambda^U_{T,ij}} + \frac{\lambda^G_{\alpha,ij}\lambda^G_{\ell,ij}}{\lambda^G_{T,ij}}\right)(\rho_\alpha - \rho_\ell)g\nabla H. \quad (64)$$

Figure 20:
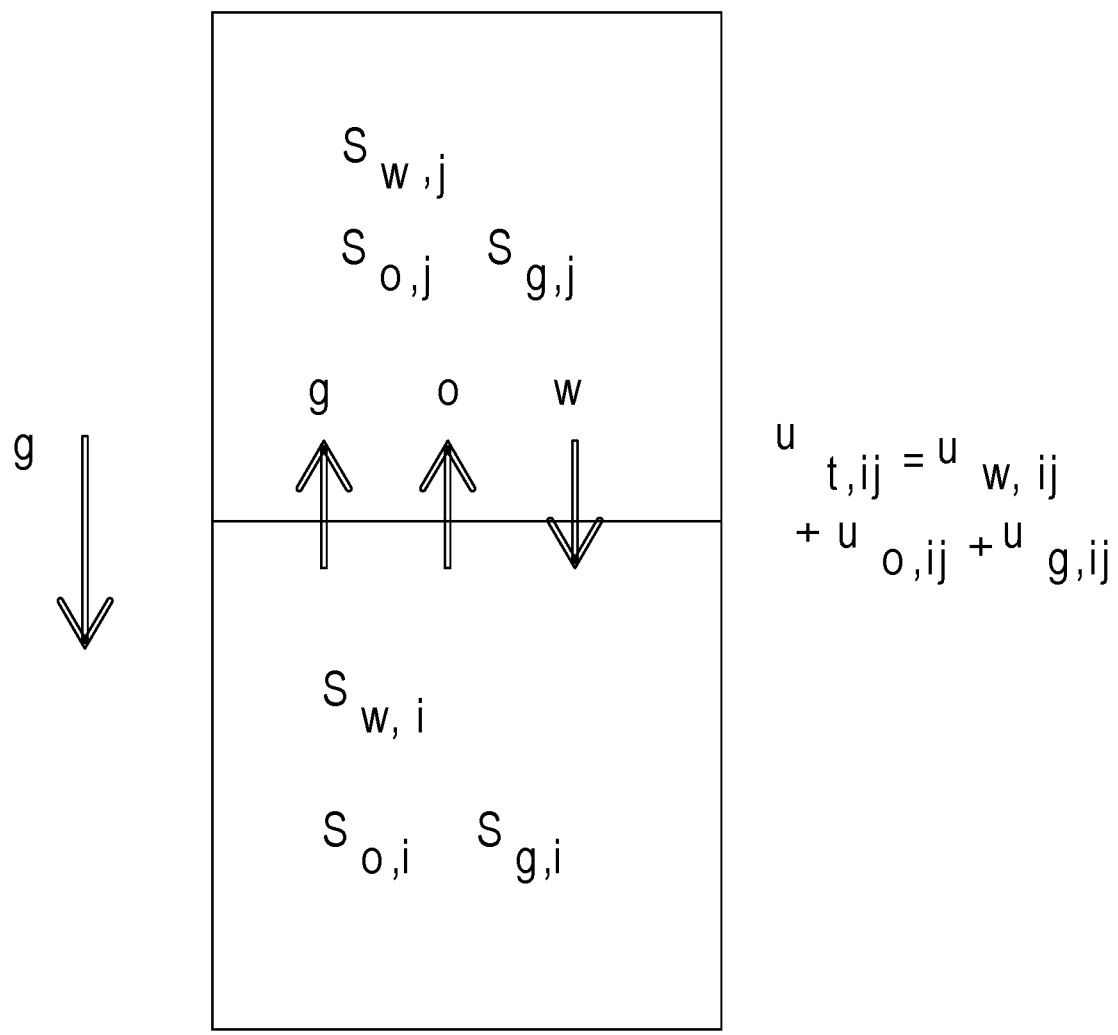
FIG. 20 illustrates a graphic of an example of a two cell model with gravity for three-phase flow.

FIG. 20 shows an example of a two cell model with gravity for three-phase flow (see also, e.g., FIG. 10 as to two-phase flow).

Figure 21A:
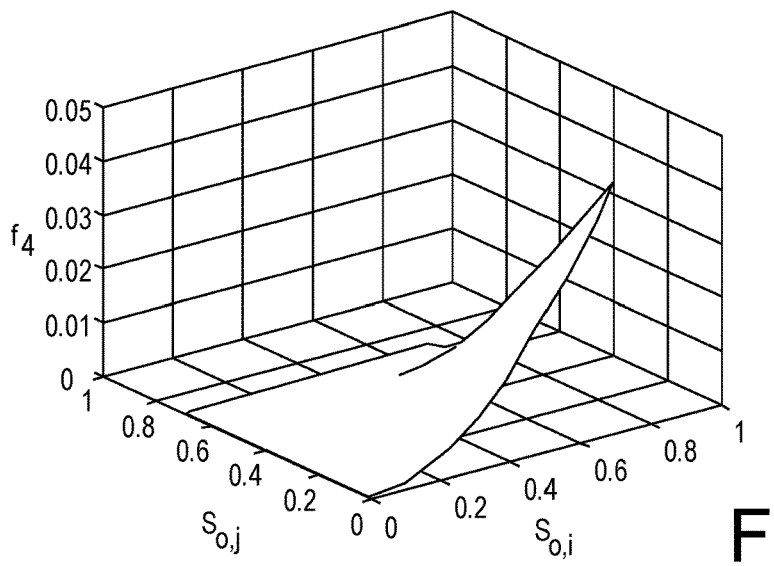
FIGS. 21A, 21B and 21C illustrate example plots of fractional flows between cells of a model.
Figure 21B:
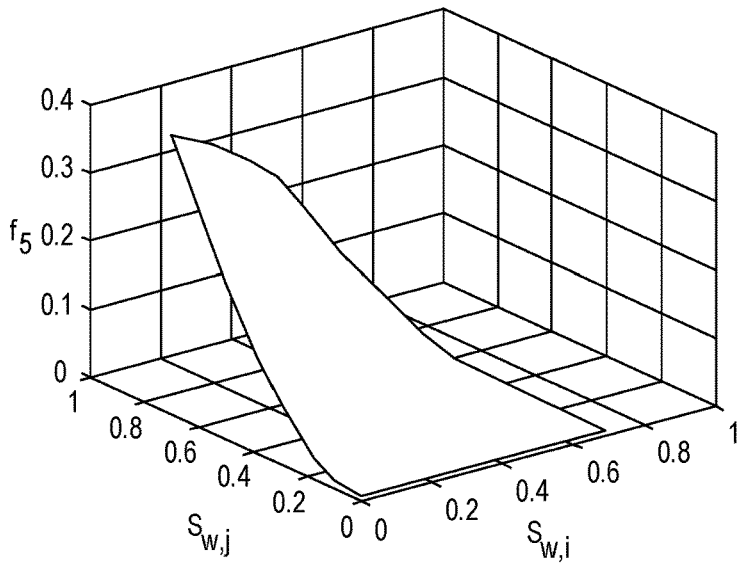
Figure 21C:
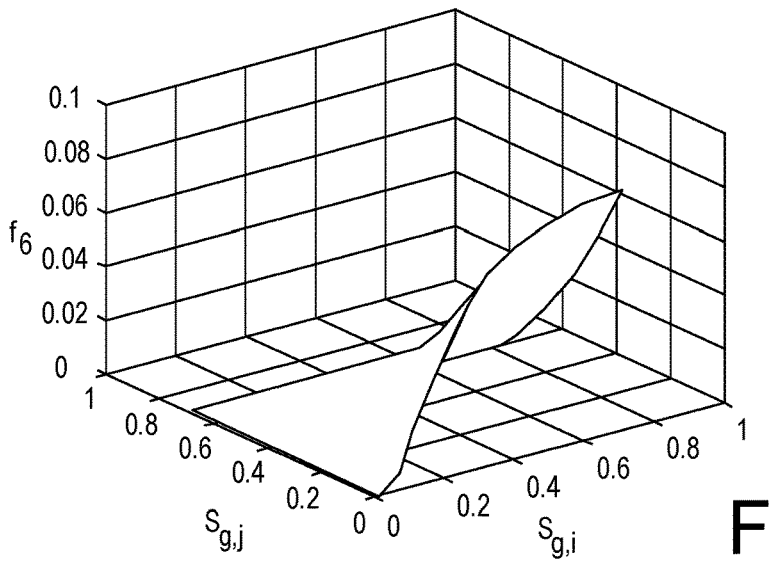

FIGS. 21A, 21B and 21C show examples of fractional flows between cells i and j with $M_2$=0.2 and $M_3$=5 and quadratic relative permeabilities: FIG. 21A is for $f_4$ with $S_{g,i} = S_{g,j}$=0.3, FIG. 21B is for $f_5$ with $S_{o,i} = S_{o,j}$=0.3, and FIG. 21C is for $f_6$ with $S_{w,i} = S_{w,j}$=0.3.

Figure 22A:
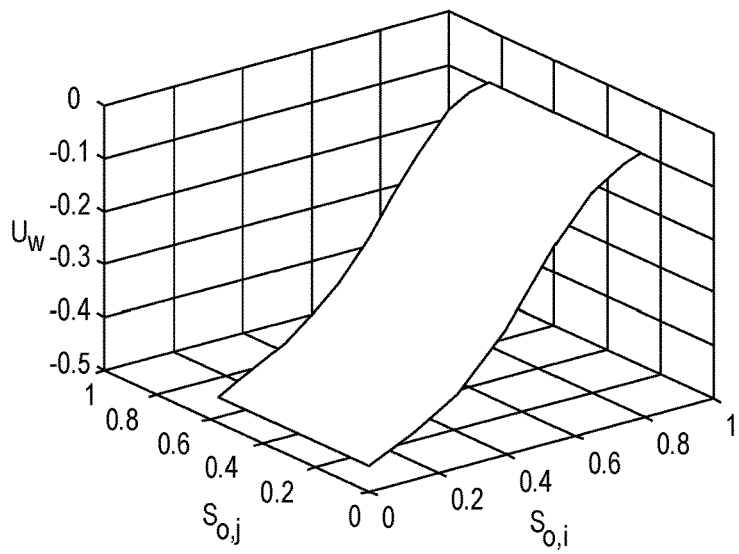
FIGS. 22A, 22B and 22C illustrate example plots of phase velocities between cells of a model with initial upwind directions.
Figure 22B:
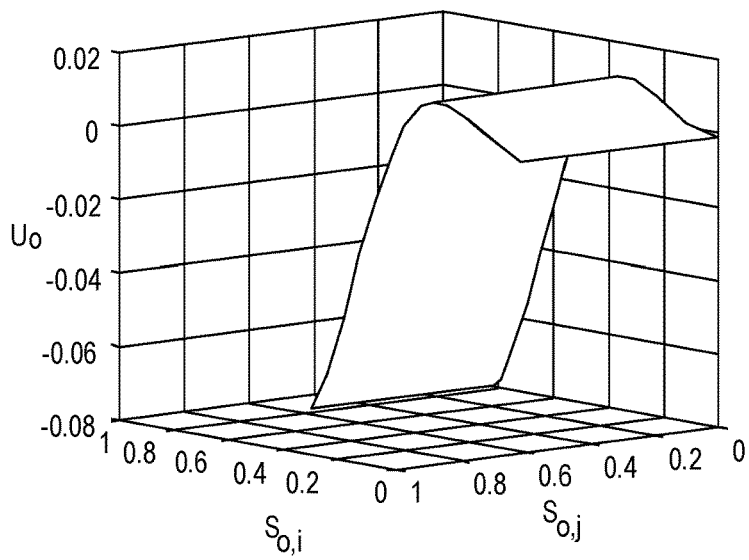
Figure 22C:
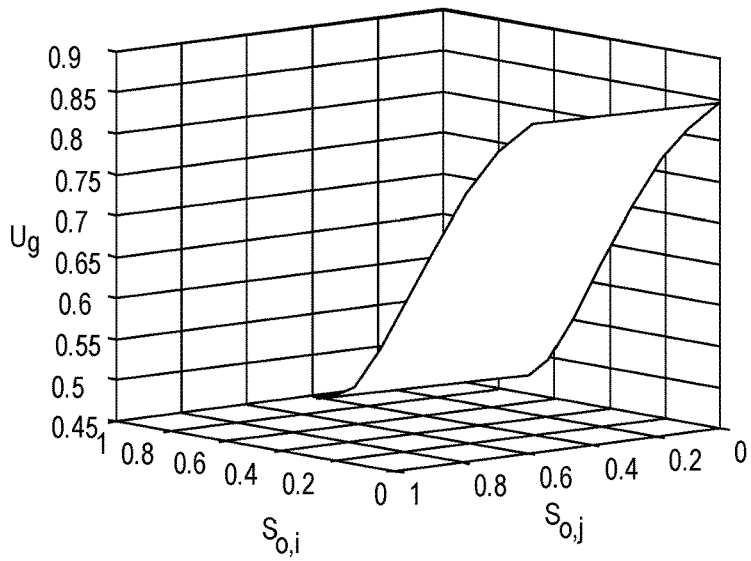

FIGS. 22A, 22B and 22C show phase velocities between cells i and j with the initial upwind directions: Phase-Potential-based Discretization with Linear Interpolation Relative Permeabilities, $u_T$=0.4, $C_{g1}$=2, $C_{g2}$=5, $S_{g,i}$=0.2, $S_{g,j}$=0.4, $M_2$=0.2, $M_3$=5: FIG. 22A is for $u_{w,ij}$, FIG. 22B is for $u_{o,ij}$, and FIG. 22C is for $u_{g,ij}$.

Figure 23A:
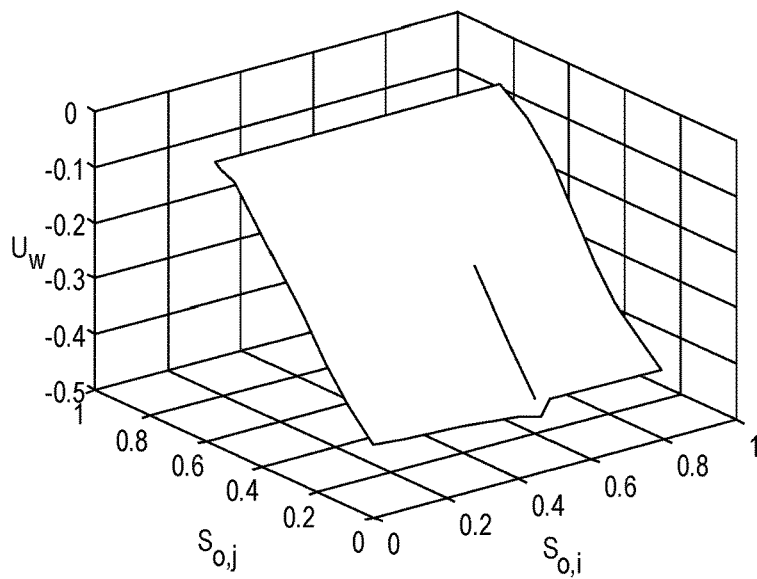
FIGS. 23A, 23B and 23C illustrate example plots of phase velocities between cells of a model with first updates of upwind directions.
Figure 23B:
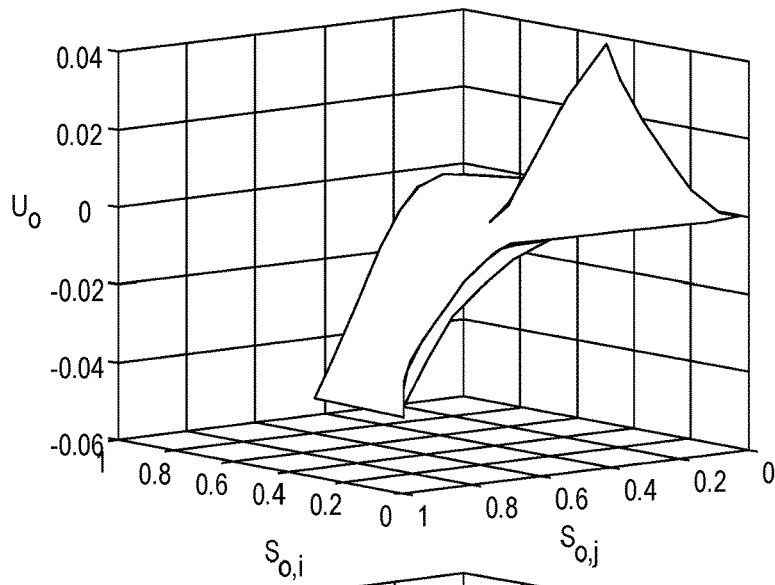
Figure 23C:
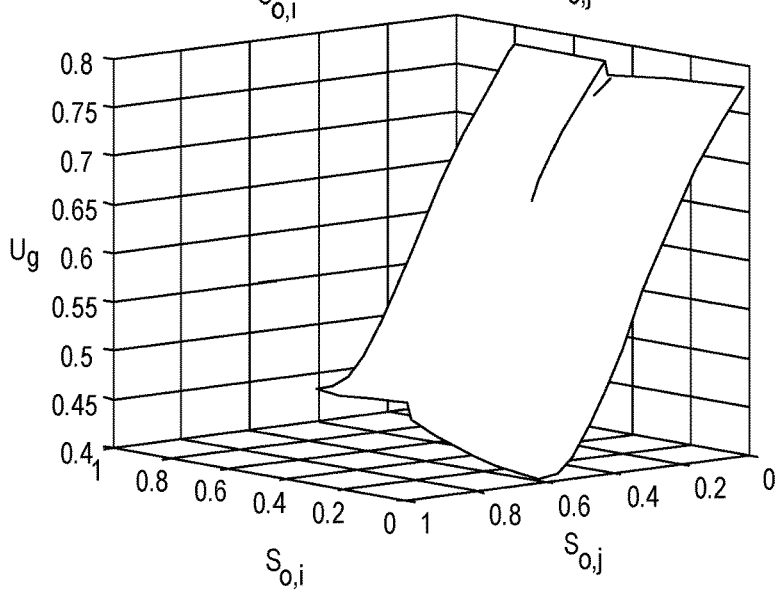

FIGS. 23A, 23B and 23C show phase velocities between cells i and j with the first updates of upwind directions: Phase-Potential-based Discretization with Linear Interpolation Relative Permeabilities, $u_T$=0.4, $C_{g1}$=2, $C_{g2}$=5, $S_{g,i}$=0.2, $S_{g,j}$=0.4, $M_2$=0.2, $M_3$=5: FIG. 23A is for $u_{w,ij}$, FIG. 23B is for $u_{o,ij}$, and FIG. 23C is for $u_{g,ij}$.

Figure 24A:
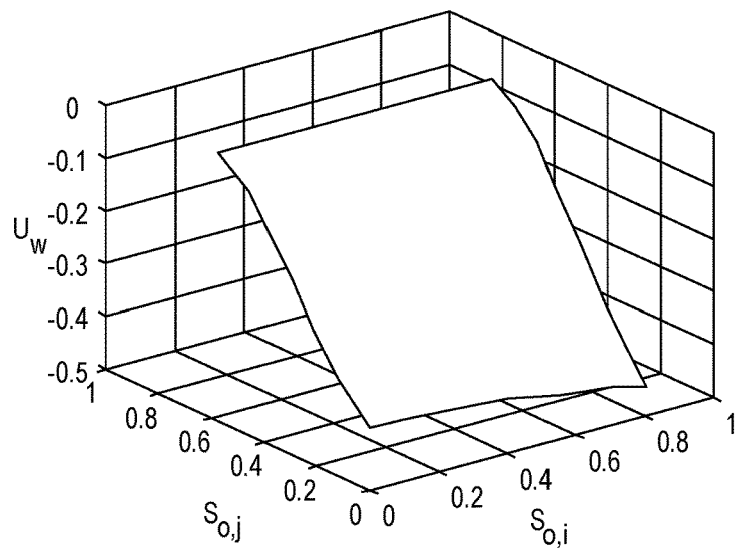
FIGS. 24A, 24B and 24C illustrate example plots of phase velocities between cells of a model with second updates of upwind directions.
Figure 24B:
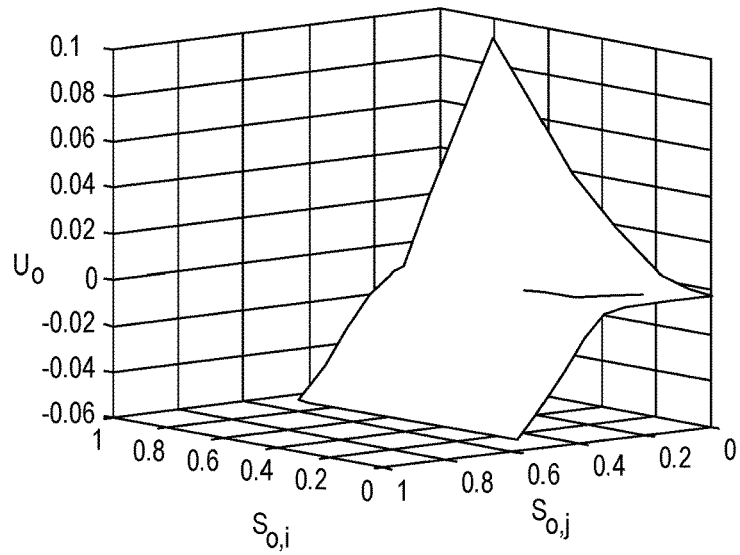
Figure 24C:
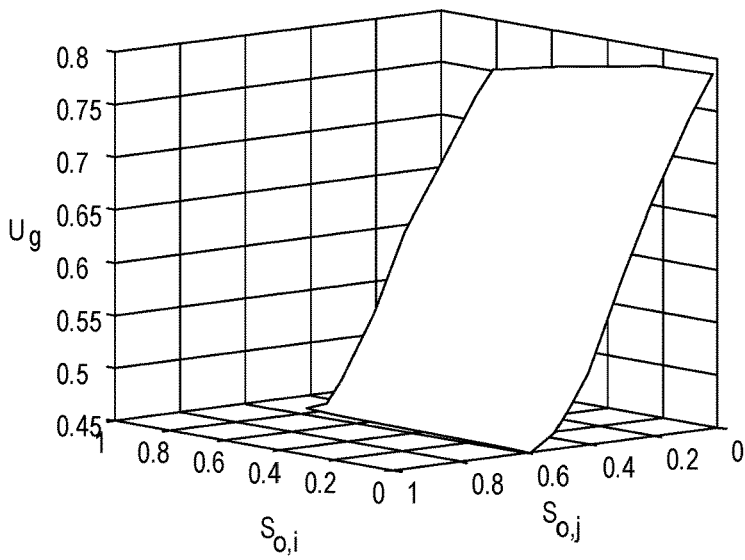

FIGS. 24A, 24B and 24C show phase velocities between cells i and j with the second updates of upwind directions: Phase-Potential-based Discretization with Linear Interpolation Relative Permeabilities, $u_T$=0.4, $C_{g1}$=2, $C_{g2}$=5, $S_{g,i}$=0.2, $S_{g,j}$=0.4, $M_2$=0.2, $M_3$=5: FIG. 24A is for $u_{w,ij}$, FIG. 24B is for $u_{o,ij}$, and FIG. 24C is for $u_{g,ij}$.

Figure 25A:
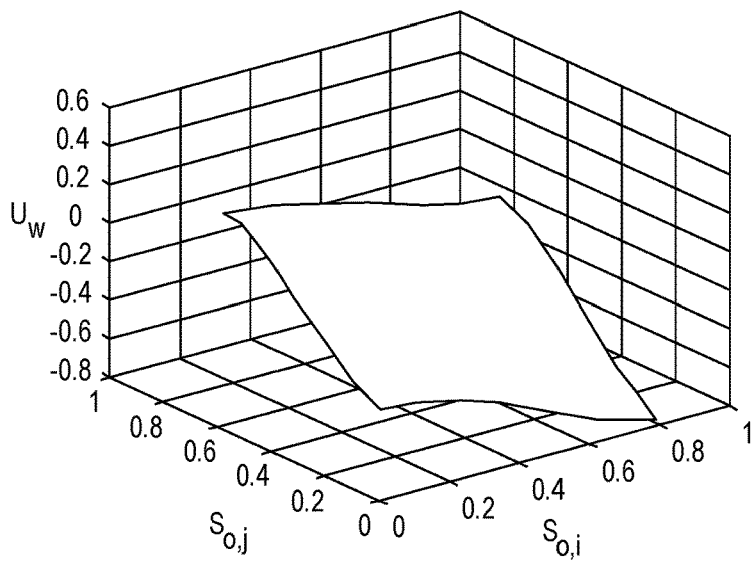
FIGS. 25A, 25B and 25C illustrate example plots of phase velocities between cells of a model with hybrid discretization and linear interpolation relative permeabilities.
Figure 25B:
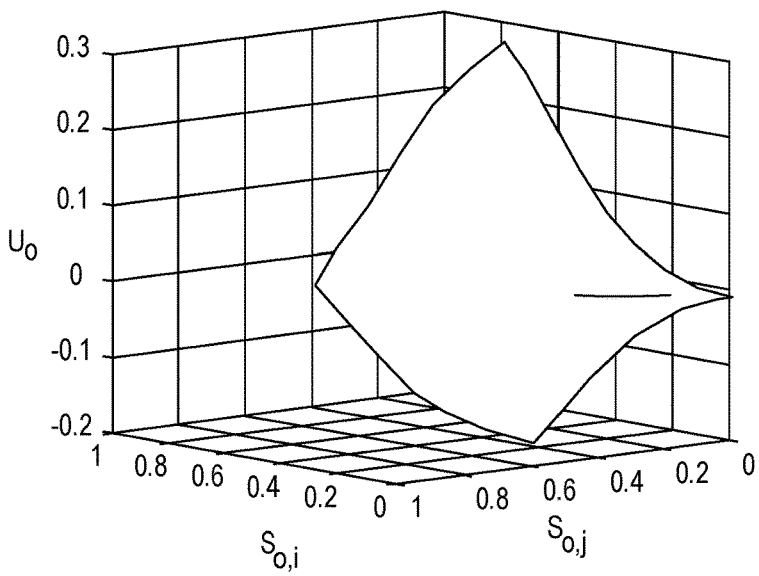
Figure 25C:
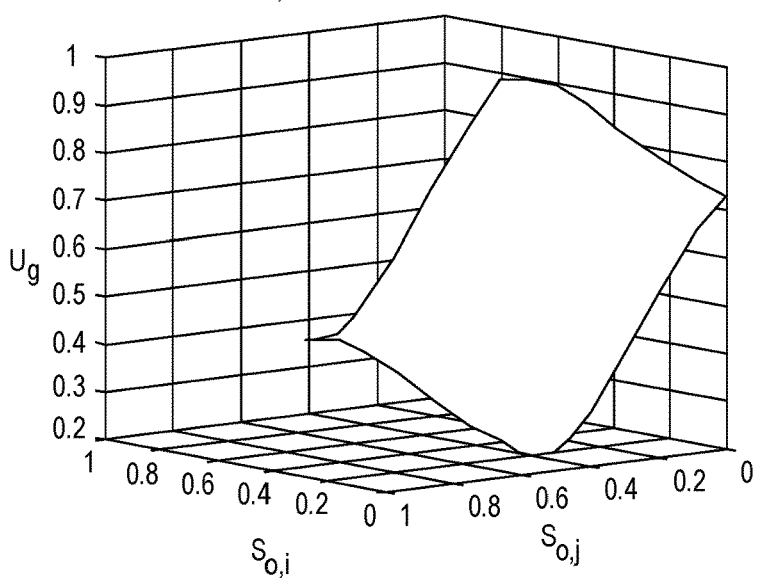

FIGS. 25A, 25B and 25C show phase velocities between cells i and j from Hybrid Discretization with Linear Interpolation Relative Permeabilities, $u_T$=0.4, $C_{g1}$=2, $C_{g2}$=5, $S_{g,i}$=0.2, $S_{g,j}$=0.4, $M_2$=0.2, $M_3$=5: FIG. 25A is for $u_{w,ij}$, FIG. 25B is for $u_{o,ij}$ and FIG. 25C is for $u_{g,ij}$.

B4.3 a Numerical Example of Phase Velocities Between Two Cells

It is instructive to compare phase velocities between two cells, computed by HU and PPU. A two cell model is depicted in FIG. 20. The cell i is the lower cell and cell j is the upper cell with respect to the gravity direction. In the HU discretization method, the buoyancy terms, $f_4$, $f_5$ and $f_6$, depend on the two cell saturations on either side of the interface. FIGS. 21A, 21B and 21C show plots of these terms as a function of the oil saturations of cells i (lower in z-direction) and j (upper in z-direction) with fixed $S_{g,i}=S_{g,j}=0.3$ in $f_4$ and $S_{o,i}=S_{o,j}=0.3$ in $f_5$ and $S_{w,i}=S_{w,j}=0.3$ in $f_6$, respectively. In FIG. 21A $f_4$ has a maximum at $S_{o,i}=1-S_{g,i}$ and $S_{o,j}=0$, which is the most unstable state from the gravity equilibrium. The $f_4$ becomes zero at the other three corners ($S_{o,i}=0$, $S_{o,j}=0$; $S_{o,j}=0$, $S_{o,j}=1-S_{g,j}$; and $S_{o,i}=1-S_{g,i}$, $S_{o,j}=1-S_{g,j}$). Further, $f_4$ decreases monotonically from the maximum point ($S_{o,i}=1-S_{g,i}$, $S_{o,j}=0$). The $f_5$ and $f_6$ also have similar smooth, monotonically varying surfaces in the parameter domain of $S_{w,i}$ and $S_{w,j}$, and that of $S_{g,i}$ and $S_{g,j}$, respectively.

Using the two cell model in FIG. 20, phase velocities from PPU and HU schemes are examined. In this numerical computation, $u_T=0.4$, $C_{g1}=2$, $C_{g2}=5$, $M_2=0.2$, and $M_3=5$ are employed. For simplicity of demonstration, the gas saturations remains to be constant in both cells (e.g., $S_{g,i}=0.2$ and $S_{g,j}=0.4$). In PPU, as the phase upwind directions are not known before the pressure and saturation computations, an approach can first assume the lower cell (cell) is the upwind cell for the phases, and then compute the phase velocities by Eqs. (B34)-(B36). If the computed phase velocity directions and the assigned phase upwind directions are not identical, the phase velocities are computed again with the updated upwind directions until they agree for the phase velocities.

The phase velocities from PPU scheme with the initial upwind directions are plotted in FIGS. 22A, 22B and 22C. The water phase moves downward while the gas phase moves upward in the entire domain of $S_{o,i}$ and $S_{o,j}$. The oil phase flow is in positive direction for $S_{o,i}<0.482$ and negative direction for $S_{o,i}>0.482$. Since the initial upwind directions are assumed from cell i, the phase velocities are dependent on the saturation of cell i. In the second iteration, the upwind directions are updated, based on the phase velocities in the first iteration with the initial upwind directions.

The phase velocities from the second iterations with updated upwind directions are shown in FIGS. 23A, 23B and 23C. Note that the phase velocities are quite different from those from the initial ones. The FIGS. 23A, 23B and 23C illustrate that the phase velocities are sensitive to the phase upwind directions. The differences are especially manifested due to a large contrast in two cell saturations. As the upwind directions from the first iteration and the computed phase velocity directions from the second iteration are not completely matched, a process can update the upwind directions again and compute the phase velocities. The results are shown in FIGS. 24A, 24B and 24C. The phase velocity surfaces are much smoother than those from the previous two iterations. Nevertheless, the oil-phase velocity are not continuous in the first derivative w.r.t. cell saturations as the upwind direction changes at $S_{o,j}=0.315$. This may create numerical difficulty in the Newton iterations of nonlinear solution.

The phase velocities from HU are depicted in FIGS. 25A, 25B and 25C. Recall that the HU scheme may implement fixed upwind directions for viscous and gravitational terms. The phase velocities with HU smoothly varies in the whole parameter domain of $S_{o,i}$ and $S_{o,j}$. The first derivatives of phase velocities w.r.t the cell saturations are also continuous. The smooth, continuous derivatives of fractional flow in HU will help convergence in Newton iterations for nonlinear solver.

Figure 26:
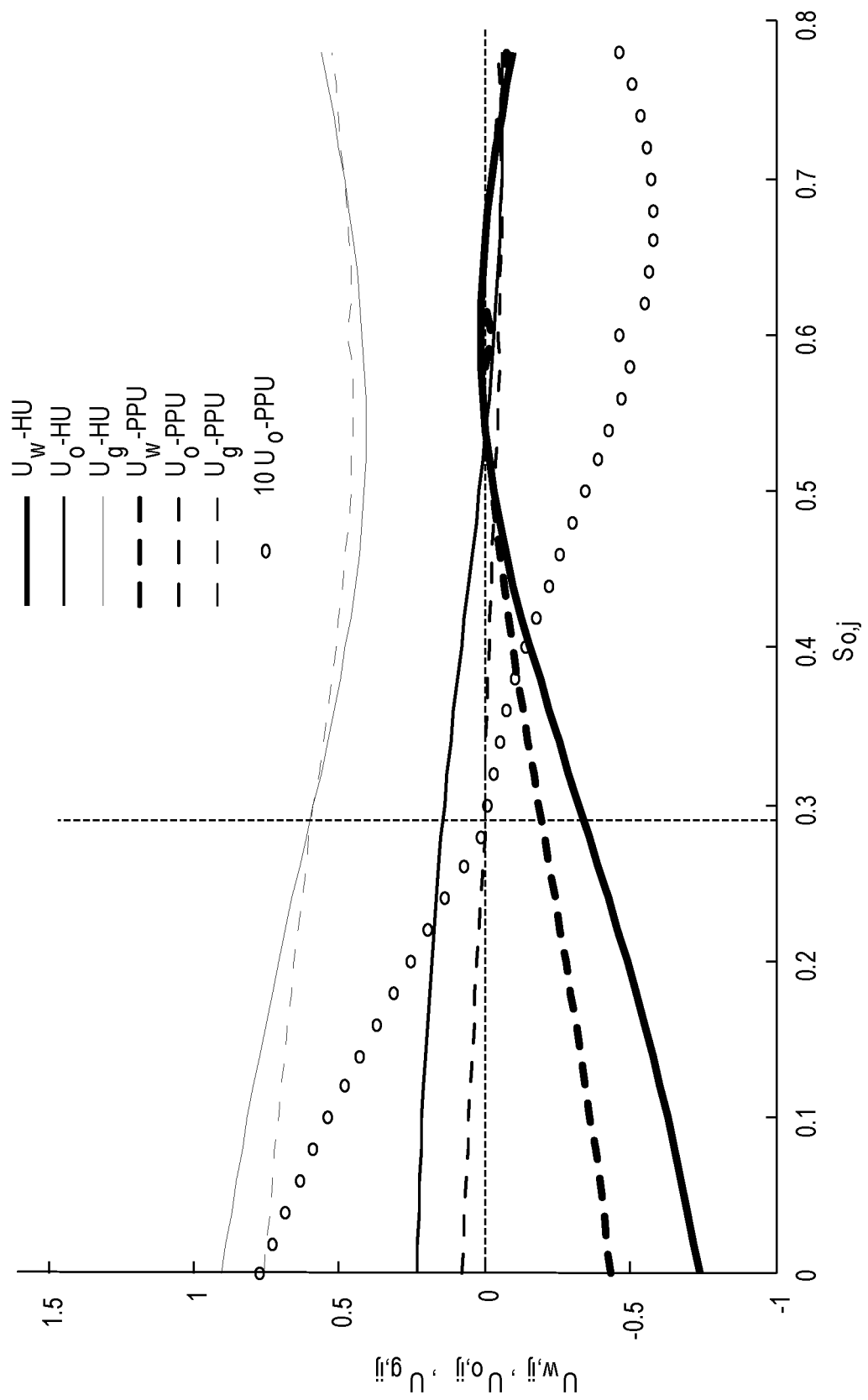
FIG. 26 illustrates an example of a plot of phase velocities in a two cell model associated with a phase potential upwind approach and associated with a hybrid upwind approach.

FIG. 26 shows phase velocities in the two cell model with $M_2=0.2$, $M_3=5$, $u_T=0.4$, $Cg_1=2$, $Cg_2=5$. The lower cell i has constant saturations: $S_{o,i}=0.7$, and $S_{g,i}=0.2$. The gas saturation in the upper cell j is also fixed, $S_{g,j}=0.2$. The PPU denotes the velocities computed by the phase potential upwind, HU by the hybrid upwind method.

B5. Mathematical Properties

Three-phase flow may be found in a quite localized region or regions in a reservoir simulation model and it can pose a numerical challenge in solving a non-linear transport equation by Newton iterations. Various plots discussed herein demonstrate that the numerical difficulties can be due at least in part to inconsistent three-phase relative permeabilities and/or complex upwinding schemes in the presence of gravity. In this section some mathematical properties associated with three-phase flow are discussed. The elliptic region in three-phase flow is discussed and mathematical properties of an HU scheme for three-phase flow are examined. Mathematical properties of HU for two phase flow; discretization error, discrete monotonicity, and continuity of derivatives may be examined. Mathematical properties of three-phase flow can be investigated by a similar analysis.

Elliptic Region of Three-Phase Flow:

Three-phase flow without diffusion can possibly yield an elliptic region in which the flow field becomes unstable. This elliptic region can possibly occur in a very limited small domain of three-phase flow with no numerical diffusion and it can also entail that three phase relative permeability is a function of two saturations (e.g., Stone's type model). Furthermore, Bell demonstrated that the numerical simulation yields a stable solution that passes through the elliptic region with reasonable numerical diffusion. As an example, an approach may thus assume that the elliptic region is unlikely encountered in practical numerical simulation. In the following numerical example, it is demonstrated that an example algorithm can yield a stable simulation result for the problem that Bell designed to investigate an elliptic region in three-phase flow.

$C^1$ Continuity:

The discontinuity in the derivatives of fractional functions flux can plays a detrimental role in numerical convergence. If the three-phase relative permeability is continuous and the phase upwind directions are fixed, the fractional functions of HU is $C^1$ continuous in Eqs. (B60)-(B63), as long as the total velocity does not change the direction. In comparison, the phase upwind directions from PPU are dependent on saturations, and the fractional flows, as a result, are not $C^1$ continuous. If the fluid motion is governed by viscous forces, the discrete flux functions will be identical for both the upwinding methods.

In gravitational segregation, PPU and HU can yield identical discretizations for two-phase flow, while different discretizations for three-phase flow due to the presence of an intermediate phase (i.e., oil). The flow direction of the intermediate fluid can be upward or downward, depending on the buoyancy force balance between water-oil and oil-gas systems. The upwind direction of the intermediate fluid can create different discretizations for PPU. When viscous and gravitational driving forces are heightened, the phase velocities computed using the two different discretization schemes are unlikely to be the same as in two-phase flow.

The $C^1$ continuity of fractional flows can be numerically demonstrated from the example of two cell model of FIG. 20. In FIG. 26 the plot shows the phase velocity profile along $S_{o,j}$ with constant $S_{o,i}=0.7$ from the phase velocity surfaces of FIGS. 24A, 24B, 24C, 25A, 25B and 25C. The phase velocities, computed with HU, are $C^1$ continuous, but the $u_o$ from PPU is $C^1$ discontinuous at $S_{o,j}=0.29$, where the upwind direction of oil phase changes from the lower cell i to the upper cell j. In the figure, the value of $u_o$ is enlarged by a factor of 10 to manifest the discontinuity of the first derivative of $u_o$ with respect to $S_{o,j}$.

The transmissibility between two cells can depends on the choice of upwinding direction for the relative permeability. As discussed earlier, the upwinding direction for horizontal flow (no gravity effects) changes very little in time. This is due to the strong permeability heterogeneity and the semi-permanent locations of injection and production wells. In the vertical/inclined direction, the details of the multiphase flow can change rapidly in the presence of strong buoyancy and weak viscous forces. As a result, the saturation distribution along the flow direction tends to change smoothly with some dispersion in the horizontal direction, whereas the fluids tend to be vertically segregated due to the continuous presence of gravity. Thus, sharp saturation changes between neighboring cells in the vertical direction (e.g., 100% oil to 100% water) can be observed often, especially far from sources/sinks (wells).

As to implicit time discretization of nonlinear conservation laws, in FIM simulations with the standard PPU scheme, as the flow switches between co-current to counter-current states, at least one of the phase-flux derivatives becomes discontinuous. Such local discontinuities tend to be implicated in convergence problems of nonlinear (Newton-based) solvers. A stable time-stepping scheme is expected to benefit from flux functions that have continuous first-order derivatives ($C^1(\Omega)$).

Discrete Monotonicity

A PPU scheme may be more dispersive than a Godunov scheme, but both schemes tend to obey Lipschitz-continuity. A PPU scheme with implicit time discretization (i.e., standard FIM) may converge to the entropy solution of the nonlinear conservation law for arbitrary CFL numbers. Using a monotone approximation of it may be shown that the monotonicity of two-phase flow with HU. The monotone difference approximation may be extended to implicit time discretization of the nonlinear mass conservation equation for two-phase flow.

If the phase velocities are co-current, the α-phase flux increases with respect to $S_{\alpha,i}$ and decreases with respect to $S_{\alpha,i+1}$. Moreover, the flux is a standard upwind with respect to $u_T$. As an example, an approach may include examining the monotonicity result in the vertical direction where $f_4$-$f_6$ enter. In other directions, a standard PPU may be used.

In the hyperbolic system of transport equations from the IMPES method, a monotone difference scheme with the standard PPU scheme can yield physical numerical solutions. Although implicit PPU is accompanied with relatively large numerical diffusion effects, numerical diffusion may help to stabilize the solution in multidimensional models with complex interactions between the phase velocities and the saturation field.

Monotonicity for a system of scalar transport equations can exist. The three-phase flow in an example approach can have two independent unknowns for each cell.

Discretization Error:

The PPU upwinding scheme has been used in reservoir simulation and the differences in the discretization error between the PPU and HU schemes have been examined for two-phase flow. The discretization error is O(h), if the fluxes between each cell includes the properties of the two neighboring cells, either two- or three-phase flow. Without losing generality, the HU and PPU can have the same order of discretization error, O(h).

Figure 27A:
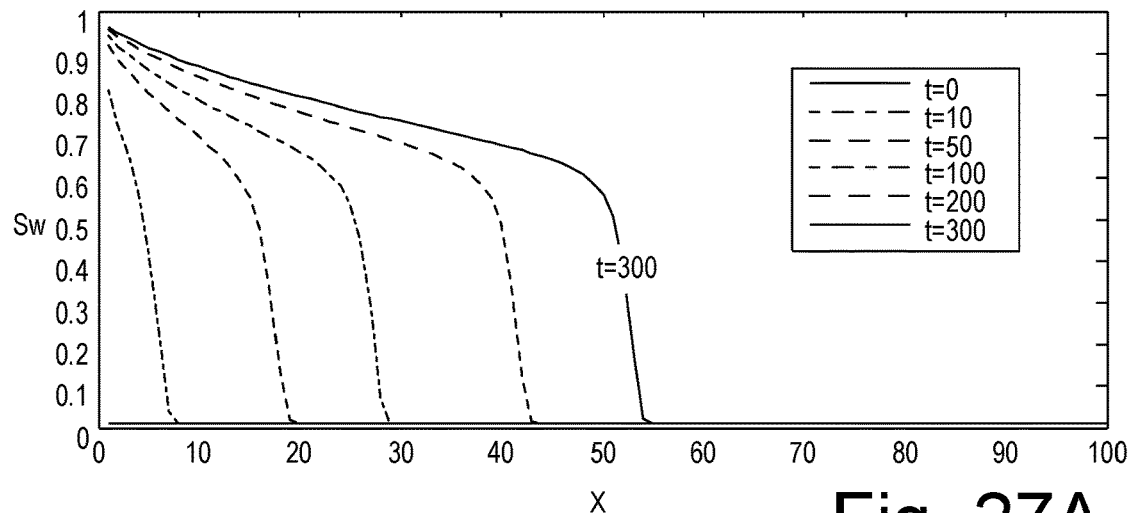
FIGS. 27A, 27B and 27C illustrate example plots of linear displacement in a one-dimensional model.
Figure 27B:
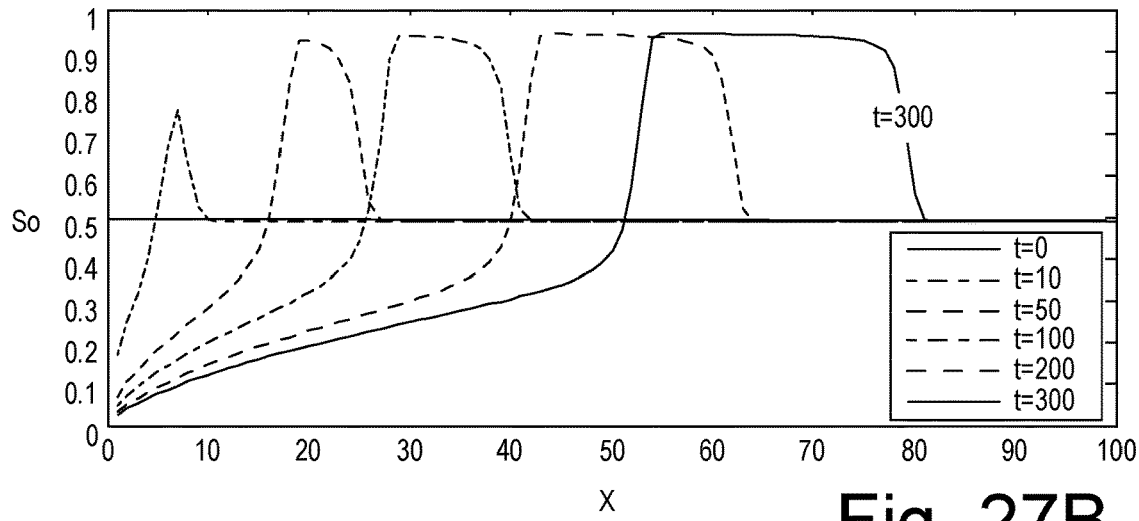
Figure 27C:
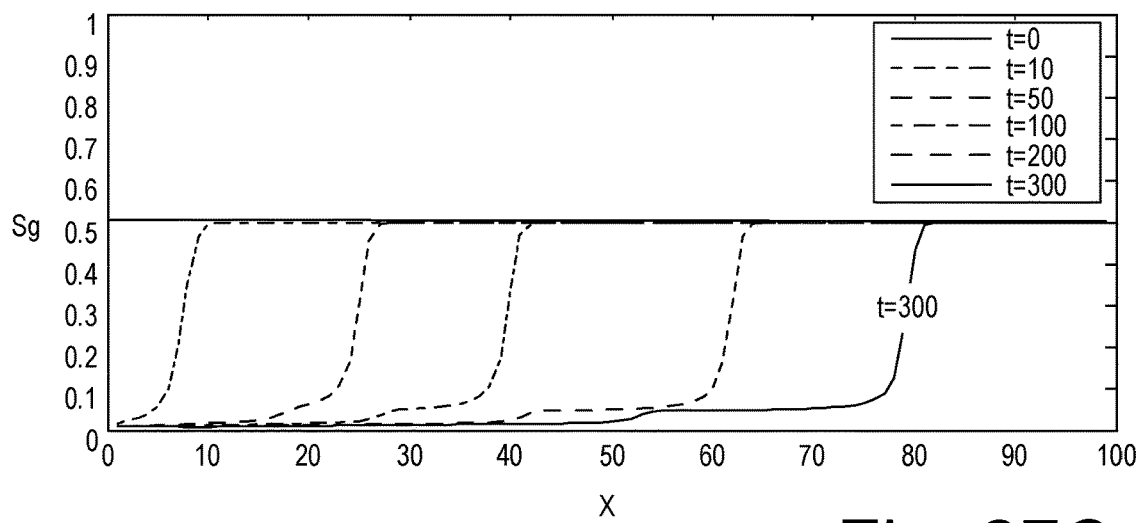

FIGS. 27A, 27B and 27C show linear displacement in a one-dimensional model with 100 cells between the left and right boundaries. The pressures at left and right boundaries are held constant. The initial saturation is $S_w=0.01$, $S_o=0.49$, $S_g=0.5$ for x>0, $P_{right}=0$ and $P_{left}=10$.

B6. Numerical Examples of Linear Displacement and Gravity Segregation

B6.1 Horizontal Displacement of Three-Phase Flow

The first example is concerned about a linear displacement of three-phase flow in the horizontal direction without gravity effect. The problem was originally constructed by Bell to study the elliptic region in three-phase flow. As discussed in the previous section, the elliptic region is unlikely encountered in actual numerical simulation, unless the numerical experiment is carefully designed to enlarge the elliptic region and reduce numerical diffusion. As an example, an approach may adapt a numerical approach to examine the numerical stability of three-phase flow without gravity effect. For example, consider an approach that includes a model with 100 cells with the constant potential boundary conditions, $P_{left}=10$ and $P_{right}=0$. The initial saturations in the model are $S_w=0.01$, $S_o=0.49$ and $S_g=0.5$, and the fluid at the left boundary has constant saturations: $S_w=0.99$, $S_o=0$ and $S_g=0.01$. The viscosities of fluids are $\mu_w=0.8$, $\mu_o=1$ and $\mu_g=0.05$, respectively.

An approach can employ the linear interpolation method for three-phase relative permeabilities with quadratic relative permeabilities for two-phase flow (e.g. $k_{r\alpha}=S_\alpha^2$). The saturation profiles at t=0,10,50,100,200 and 300 are shown in FIGS. 27A, 27B and 27C. In FIG. 27A, the injection fluid of water propagates as a Buckley-Leverett front, whereas the oil phase forms a bank due to the low mobility of viscous oil phase in FIG. 27B. The gas phase moves quickly due to its low viscosity and high relative permeability in FIG. 27C. Note that as the oil bank becomes large, the injection rate becomes smaller due to a high viscosity of oil-phase. A small time step size Δt=1 (CFL: 0.5) was employed to ensure numerical convergence in time-stepping. The simulation converges consistently within four Newton iterations in nonlinear solution. As the formulation is consistent and the relative permeabilities are reasonably constructed in the linear interpolation method, the flow calculation of three-phase flow does not incur numerical difficulty. An approach also used the modified Stone's method II Eq. (B1) for this problem. The first cell had negative relative permeability for oil-phase, but it did not create numerical difficulty as long as the oil-phase is kept non-negative in nonlinear iterations. For this horizontal linear displacement the simulation results from the three-phase relative permeabilities of the modified Stone's method II are basically identical to those from the linear interpolation method of three-phase relative permeabilities.

Figure 28A:
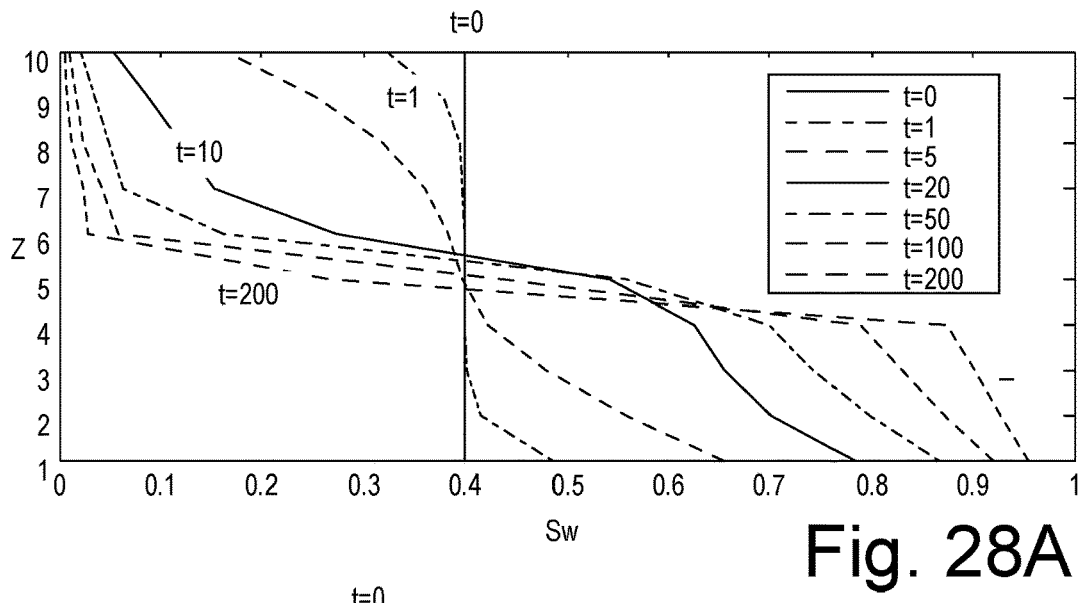
FIGS. 28A, 28B and 28C illustrate example plots of vertical segregation in a one-dimensional model.
Figure 28B:
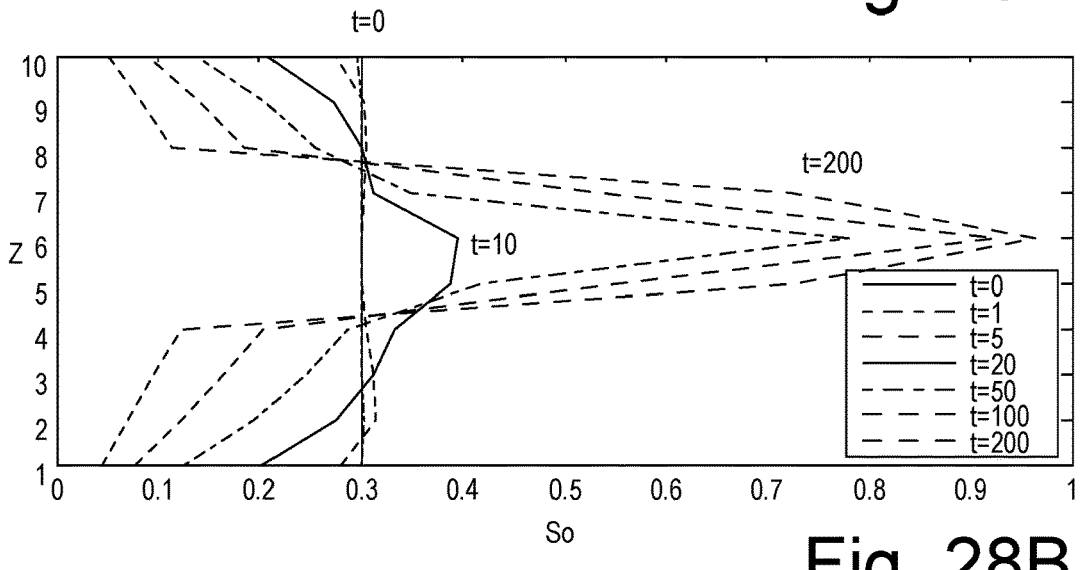
Figure 28C:
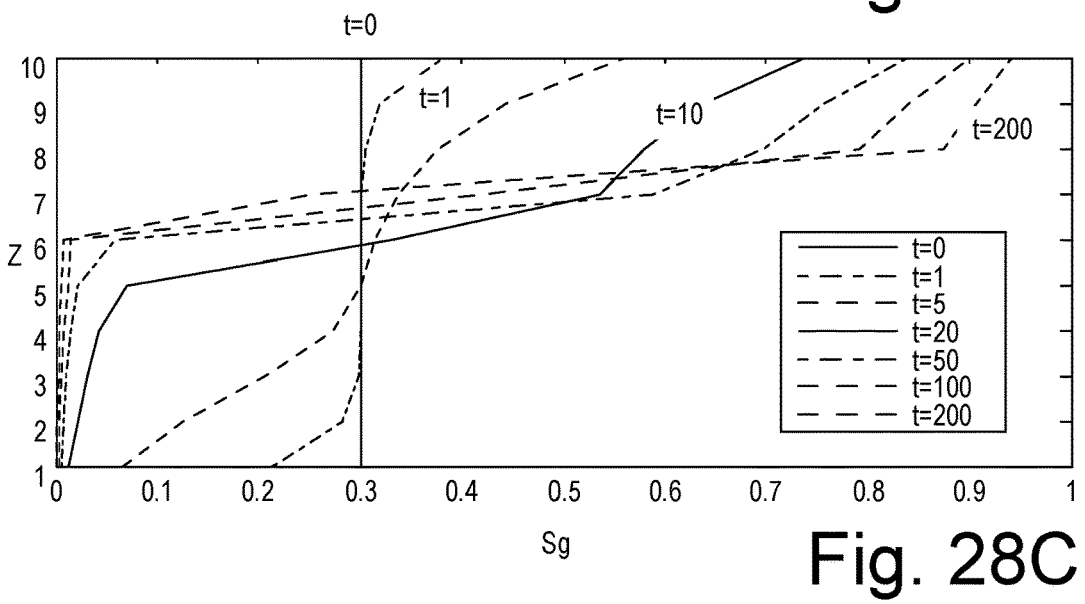

FIGS. 28A, 28B and 28C show vertical segregation in a one-dimensional model with 10 cells between no-flow top and bottom boundaries. Gravity is in the negative z-direction. The initial saturation distribution in the model is uniformly distributed as $S_w=0.3$, $S_o=0.4$, $S_g=0.3$. The phase saturation developments are depicted as $S_w$, $S_o$, and $S_g$.

Figure 29:
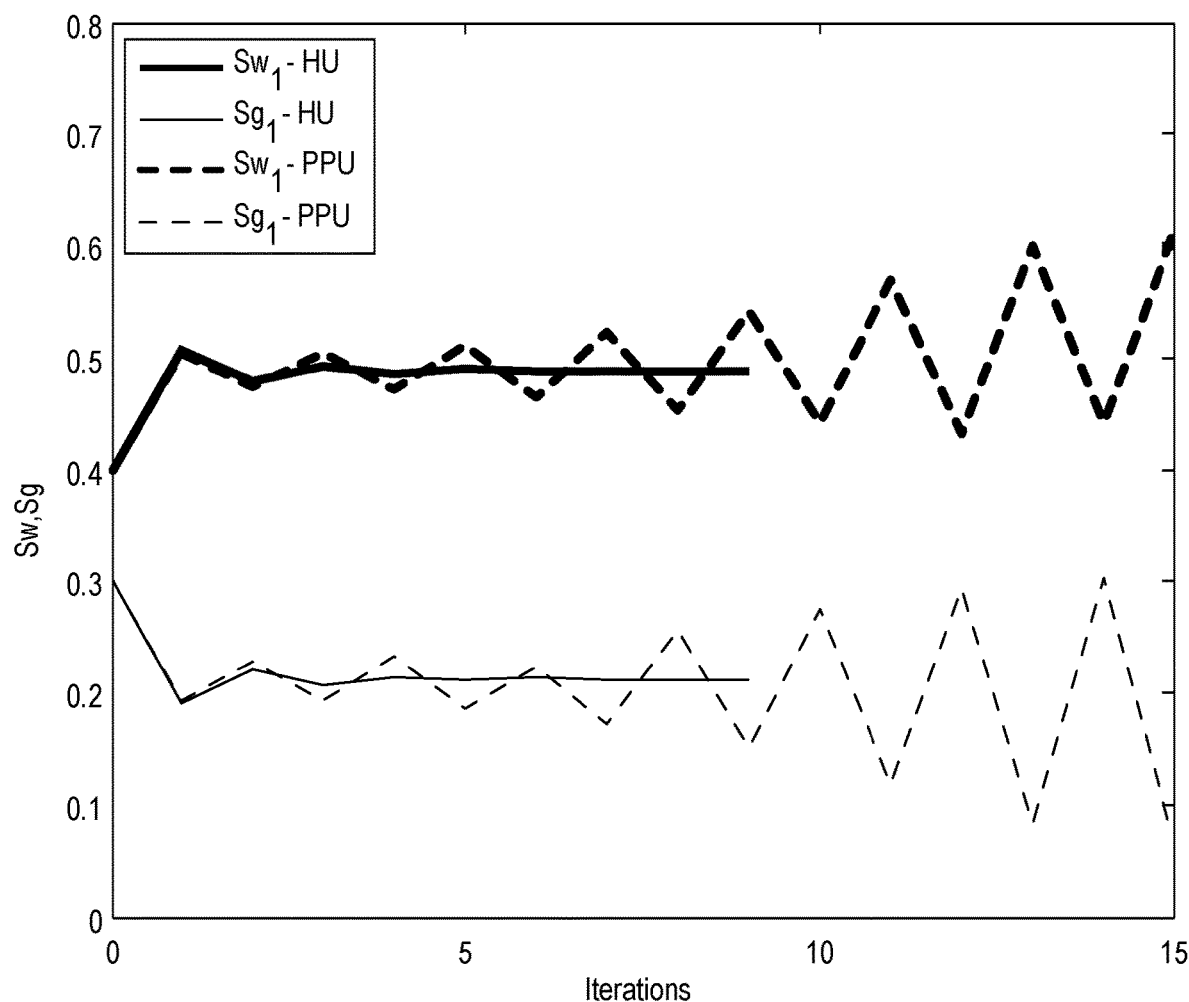
FIG. 29 illustrates an example plot of convergence of water and gas saturations in a cell associated with a phase potential upwind approach and associated with a hybrid upwind approach.

FIG. 29 shows the convergence of $S_w$ and $S_g$ in cell 1 in the iterative solution with PPU and HU discretization. The fluids are uniformly distributed as $S_w=0.4$, $S_o=0.3$ and $S_g=0.3$ in the model.

B6.2 Vertical Gravity Segregation of Three-Phase Flow with Zero Total Velocity

In an example, an approach investigates vertical gravitational segregation of three-phase flow. In gravitational segregation of two-phase flow with zero total velocity, HU and PPU yield the same upwind discretization. In three-phase flow, the intermediate phase (oil) can flow upward or downward depending on the relative strength of buoyancy forces from oil-water and oil-gas systems. As a result, even with a negligible total velocity, the upwind discretization schemes from HU and PPU can yield different results. In this example, an approach may employ a model with 10 cells and the viscosities and densities of fluids can be given by $\mu_w=1$, $\mu_o=5$, $\mu_g=0.2$ and $\rho_w=1$, $\rho_o=0.5$, $\rho_g=0.1$, respectively. Three-phase relative permeabilities are computed by the linear interpolation method with quadratic two phase relative permeabilities. The fluids are completely mixed as an initial condition ($S_w=0.4$, $S_o=0.3$, and $S_g=0.3$ at t=0). No-flow conditions are applied at the upper and lower ends of the model and a constant time step size ($\Delta t=1$) is used throughout the simulation.

The evolution of phase re-distributions are depicted in FIGS. 28A, 28B and 28C. The water phase moves to the lower section, the oil phase to the middle section and the gas phase to the upper section of the model. The saturation development is very stable and monotonically approaches to the steady state. The initial time step may entail about 7-8 iterations, but at later time, the simulation entails one or two iterations to converge. It was also tried to solve the problem with PPU. The PPU includes upwind updates for each phase at each outer iteration of pressure solution. This can cause numerical difficulties because the Newton iterations are strongly dependent on the smoothness of the gradient of fractional flow surfaces. The fractional flow surfaces from PPU included discontinuous gradients of fractional flow. With the specified physical and simulation parameters the iteration with PPU did not converge at the first time step. The iteration trajectories of $S_{w,1}$ and $S_{g,1}$ at the first time step are compared in FIG. 29. The HU provides a solution that is basically convergent after a few iterations, whereas the solution from PPU diverges as the simulation takes more iterations. The PPU method may use a smaller time-step size to yield a convergent solution. This example clearly demonstrates that HU yields a monotonically convergent and consistent solution. Note that the final segregation speed becomes slow because the small relative permeability for low saturation hinders the natural segregation process.

Figure 30A:
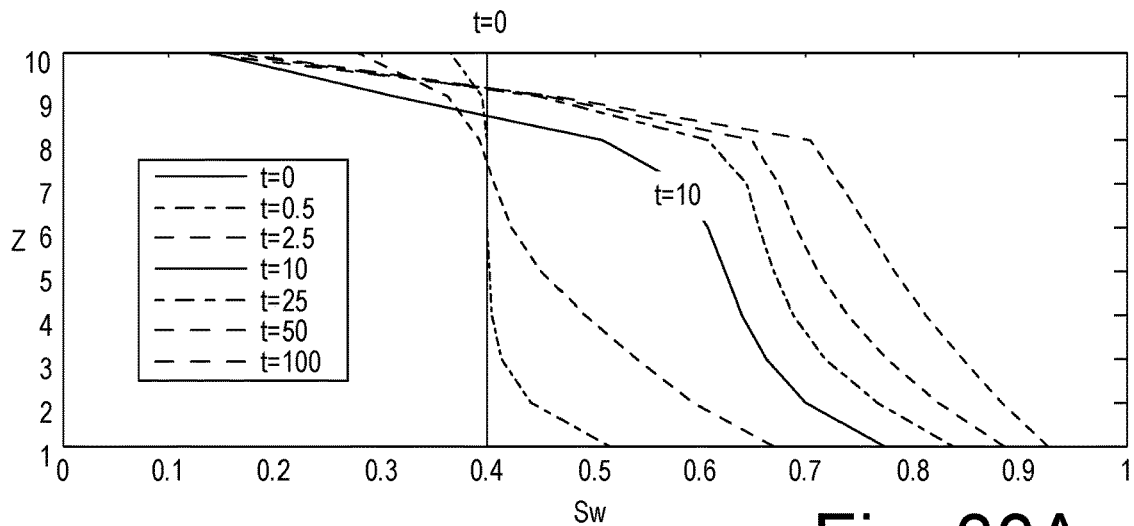
FIGS. 30A, 30B and 30C illustrate example plots of vertical segregation with non-zero total velocity in a one-dimensional model.
Figure 30B:
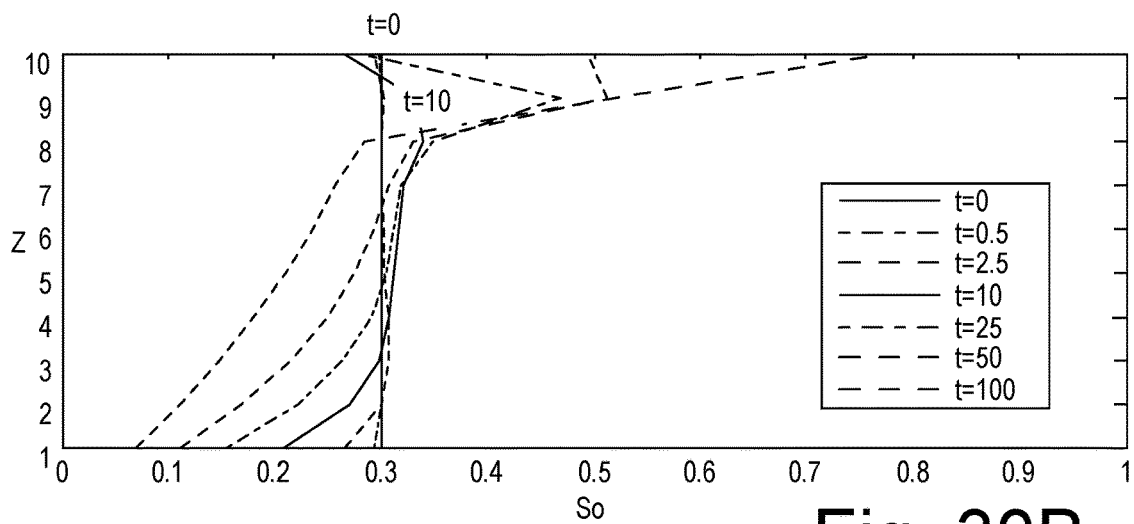
Figure 30C:
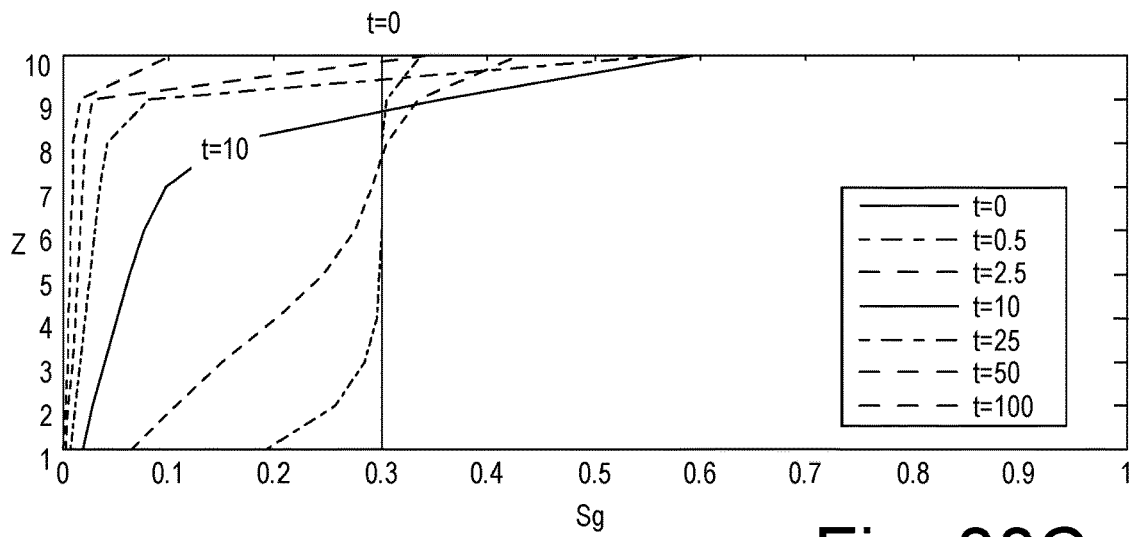

FIGS. 30A, 30B and 30C show vertical segregation with non-zero total velocity in a one-dimensional model with 10 cells between the top and bottom boundaries. Gravity is in the negative z-direction. The pressures at top and bottom boundaries are held constant, $P_{top}=0$ and $P_{bot}=2.5$, and the saturations at the bottom and top boundaries are kept $S_w=1$ and $S_g=1$, respectively. The initial saturation distribution in the model is uniformly distributed as $S_w=0.3$, $S_o=0.4$, $S_g=0.3$. The saturation profile developments are plotted for $S_w$, $S_o$, and $S_g$.

B6.3 Vertical Gravitational Segregation of Three-Phase Flow with Non-Zero Total Velocity In a numerical algorithm with PPU, two phase flow with strong gravity and small non-zero total velocity often becomes numerically unstable and no-convergent due to the frequent changes in phase upwind directions at the unit-flux point. This upwind-switch problem can be worse in three-phase flow because one more additional phase velocity is involved. As an example, an approach may be examined with non-zero total velocity. Water flows from the bottom boundary with $P_{bot}=2.5$ and $S_w=1$ and the pressure at the top boundary is kept at $P_{top}=0$. Note that the approach can use the HU upwind with the linear interpolation method for three-phase relative permeabilities. The evolution of saturation profiles is depicted in FIGS. 30A, 30B and 30C. With the injection of water from the bottom boundary the saturation development of this example is drastically different from that of the previous case with zero total velocity. The water saturation builds up quickly near the bottom boundary and the gas moves out from the top boundary.

The numerical simulation entails four iterations to solve nonlinear saturation equation at the beginning and one or two iteration at the later time. The HU method with the linear interpolation method of three-phase relative permeability makes this problem stable and convergent with a few iterations. Note that this example problem is likely challenging in solving with the conventional numerical method with PPU and Stone's relative permeability.

B7. Remarks

In reservoir simulation three-phase flow can be numerically challenging in non-linear Newton iterations because a numerical convergent algorithm entails a consistent, monotonic, and $C^1$ continuous discretized formulation. Consistency and monotonicity of three phase relative permeabilities of modified Stone's method II and linear interpolation method have been examined. The modified Stone's method II has a negative oil relative permeability in the region where the oil (an intermediate phase) saturation is low. The simulation grid block can include two- or three-phase flow in the Newton iteration or time-stepping. As an example, to help to ensure smooth convergence in reservoir simulation, three-phase relative permeability can satisfy the consistent transition condition between two-phase and three-phase flows. This transition can be smoothly changing and consistent to help to ensure numerical convergence. Considering uncertainties in laboratory measurements and scaling issues in three-phase relative permeabilities in simulation, the linear interpolation method for three-phase relative permeabilities can be used in numerical computations.

In the presence of buoyancy, the overall fractional-flow function of three-phase flow can become quite complex, because the three phase flow includes a multiple combination of phase upwind directions. It reflects that the three phases flow in co-current, counter-current directions across an interface. As in two phase flow, the conventional upwinding method of the phase velocities, which is based on the overall phase potential (PPU) suffers from nonlinear convergence difficulties due to discontinuous changes in the upwinding direction of the fluid phases, as a function of time, or Newton iterations.

By extending two phase flow with gravity, an example approach can include implementing an hybrid upwinding (HU) scheme for three-phase flow with gravity. The phase flux can be divided into two parts: (1) viscous-force-driven flux and (2) buoyancy-driven flux. The viscous-force-driven flux is co-current with respect to the total-velocity, and the buoyancy-driven flux is represented by a sum of buoyancy-driven fluxes in two two-phase-flow systems. The upstream for the numerical viscous-flux in two-phase flow is determined by the total-velocity flow direction across the interface. For the counter-current numerical buoyancy-flux, the upstream can be fixed such that the lighter fluid moves upward and the heavier fluid moves downward. For the intermediate fluid oil phase, the buoyancy force may be counter balanced between the upward buoyancy from oil-water system and the downward one from oil-gas system, with respect to the gravity direction. Such a hybrid method can help to ensure a smooth transition of fractional-flows in multiple co-current and counter-current (or vice versa) conditions for three-phase flow.

As in two-phase flow, an example HU scheme can be $C^1$-continuous. Such an HU scheme can gives the same order of discretization errors as a PPU approach. In numerical examples, the implicit scheme with hybrid upwinding yield a monotonic numerical solution. The hybrid upwinding method may yield monotone numerical solutions to the nonlinear hyperbolic conservation law; moreover, the monotone solutions converges to the entropy solution upon refinement.

In reservoir simulation, numerical instabilities can be associated with changes in the upwinding direction at some interfaces during the nonlinear solution process. In contrast to the phase velocities, the total-velocity tends to change slowly in time. This is largely due to the spatial heterogeneity of the permeability and the positions of the sources and sinks (wells), which may be fixed. As an example, a hybrid upwinding method can account for this behavior by treating the viscous flux, which is controlled by the total-velocity, differently from the buoyancy flux, which tends to be counter-current and independent of the total-velocity (or pressure) fields. Thus, the hybrid method can be less sensitive to changes in the local pressure distribution compared with a standard phase-based strategy. As a result, the hybrid method effectively diminishes frequent switching in the upstream direction associated with a standard scheme.

As an example, a hybrid upwind scheme for nonlinear three-phase flow in the presence of viscous and buoyancy forces may be employed by a simulator to simulate phenomena in a reservoir. Such a hybrid scheme can be consistent, monotone, and convergent, and it can have smooth first-order derivatives as the flow moves in a mixture of co-current and counter-current conditions. Such a hybrid scheme can provides, for example, a robust, framework to design unconditionally convergent time-stepping algorithms and nonlinear (Newton-based) solvers.

Example Method

Figure 31:
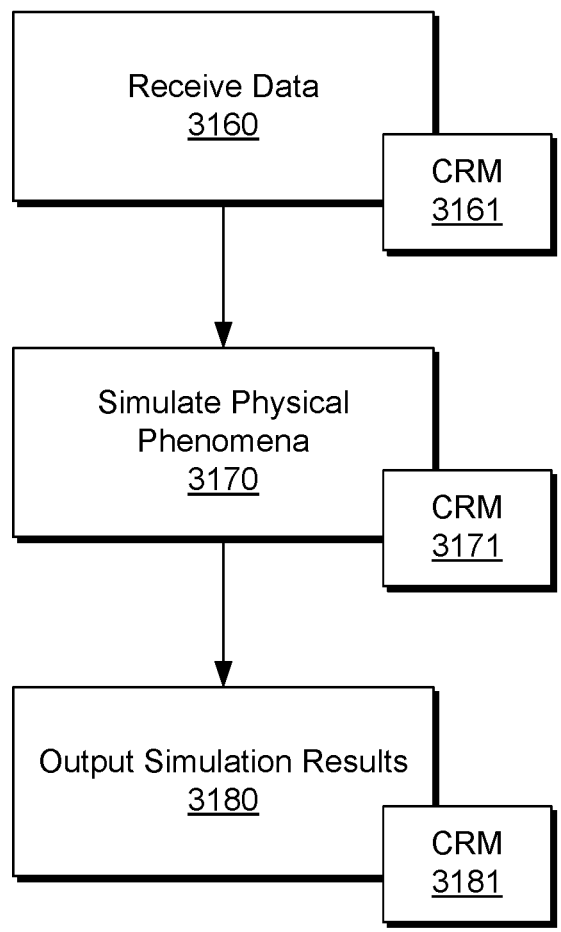
FIG. 31 illustrates an example of a method.

FIG. 31 shows an example of a method 3150 that includes a reception block 3160 for receiving data, a simulation block 3170 for simulating physical phenomena and an output block 3180 for outputting results.

The method 3100 is shown in FIG. 31 in association with various computer-readable media (CRM) blocks 3151, 3161 and 3171. Such blocks generally include instructions suitable for execution by one or more processors (or cores) to instruct a computing device or system to perform one or more actions. While various blocks are shown, a single medium may be configured with instructions to allow for, at least in part, performance of various actions of the method 3150. As an example, a computer-readable medium (CRM) may be a computer-readable storage medium that is non-transitory and that is not a carrier wave.

Figure 32:
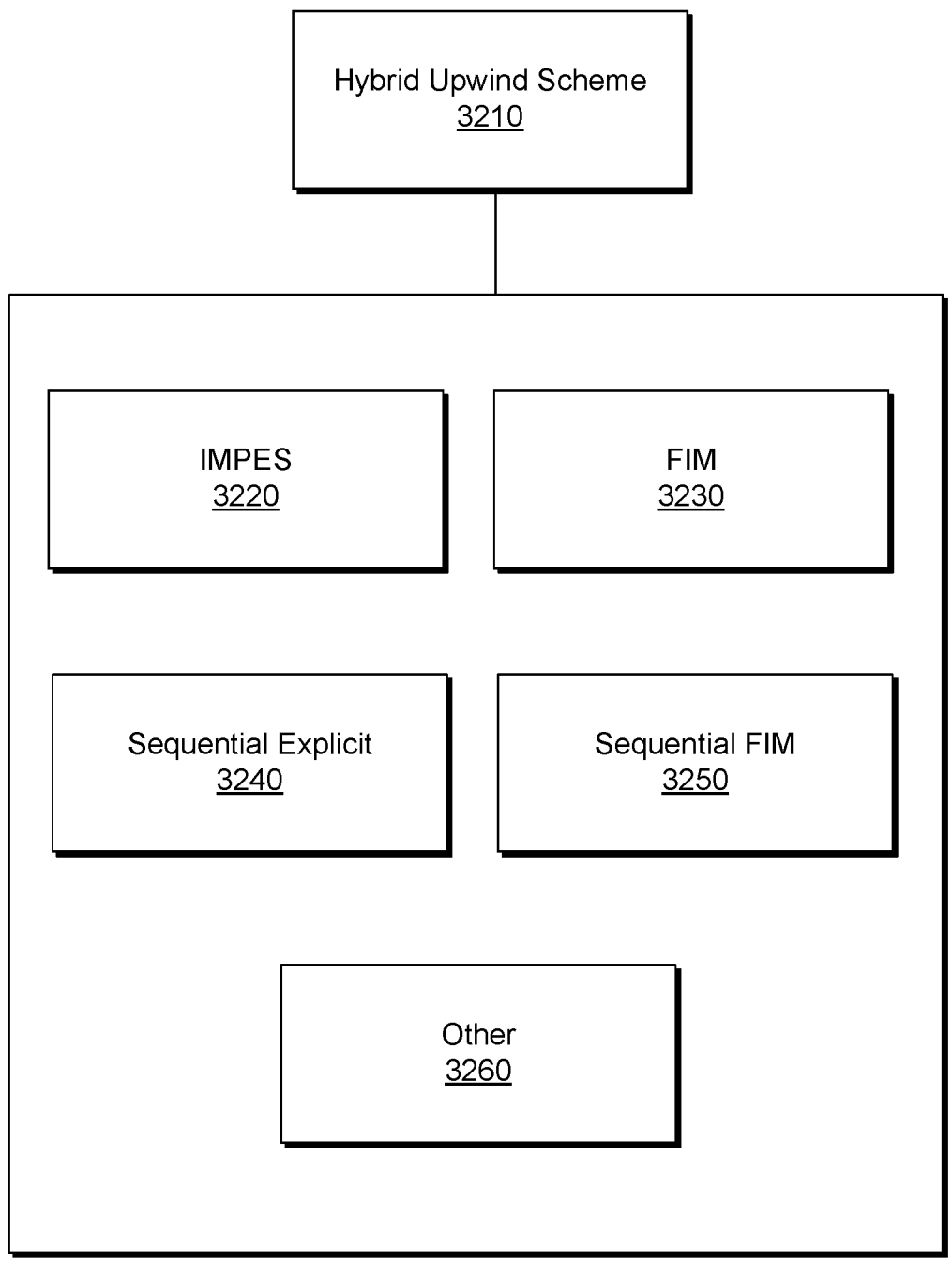
FIG. 32 illustrates example of blocks for solution techniques that may implement a hybrid upwind scheme.

FIG. 32 shows various blocks including a hybrid upwind scheme block 3210, which may be implemented as part of one or more solution techniques, such as, for example, IMPES 3220, FIM 3230, sequential explicit 3240, sequential FIM, and one or more other techniques 3260.

As an example, a method can include receiving information associated with a geologic environment; based at least in part on the information, computing values associated with multiphase fluid flow in the geologic environment using a viscous flow upwind scheme and a buoyancy flow upwind scheme; and outputting at least a portion of the computed values. In such an example, the viscous flow upwind scheme can include a total velocity direction and/or the buoyancy flow upwind scheme can include a gravity direction. As an example, a total velocity direction can be based at least in part on phase velocities of multiple phases of multiphase fluid flow.

As an example, computing can include discretizing a system of equations via a grid that defines grid cells. In such an example, an interface can exist between two adjacent grid cells where, for example, the interface includes an associated viscous flow equation and an associated buoyancy flow equation. In such an example, the viscous flow equation can include total velocity and/or the buoyancy flow equation can include gravity (e.g., a specified gravity direction, etc.).

As an example, multiphase flow can include multiphase flow in at least one porous medium.

As an example, a method can include computing viscous flux as being dependent on total velocity and buoyancy flux as being independent of total velocity.

As an example, a method can include computing that implements a viscous flux upwind scheme and a buoyancy flux upwind scheme as a hybrid upwind scheme for nonlinear three-phase flow in the presence of viscous forces and buoyancy forces.

As an example, a method can include computing co-current flow and counter-current flow. In such an example, one or more transitions may occur for such flow.

As an example, a method can include computing that utilizes relative permeabilities that are $C^1$ continuous.

As an example, a method can include computing that utilizes at least one three-phase relative permeability correlation that is a monotonically increasing function of phase saturation.

As an example, a method can include computing that implements an iterative solver for a nonlinear system of equations where the iterative solver includes at least one processor.

As an example, a system can include a processor; memory operatively coupled to the processor; and one or more modules stored in the memory that include processor-executable instructions to instruct the system to receive information associated with a geologic environment; based at least in part on the information, compute values associated with multiphase fluid flow in the geologic environment using a viscous flow upwind scheme and a buoyancy flow upwind scheme; and output at least a portion of the computed values. In such an example, the viscous flow upwind scheme can include a total velocity direction and/or the buoyancy flow upwind scheme can include a gravity direction.

As an example, one or more computer-readable storage media can include processor-executable instructions where the instructions include instructions to: receive information associated with a geologic environment; based at least in part on the information, compute values associated with multiphase fluid flow in the geologic environment using a viscous flow upwind scheme and a buoyancy flow upwind scheme; and output at least a portion of the computed values. In such an example, the viscous flow upwind scheme can include a total velocity direction and/or the buoyancy flow upwind scheme can include a gravity direction.

As an example, a method can include receiving data; simulating physical phenomena based at least in part on the data to generate simulation results; and outputting at least a portion of the simulation results. Such a method may include simulating multiphase flow in a porous medium (e.g., or porous media).

As an example, a method can include simulating viscous flux as being dependent on total-velocity and buoyancy flux as being independent of total-velocity. As an example, simulating can implement a hybrid upwinding scheme for nonlinear three-phase flow in the presence of viscous forces and buoyancy forces. As an example, simulating can simulate co-current flow and counter-current flow.

As an example, simulating can simulate viscous-driven fluxes and buoyancy-driven fluxes. For example, where viscous-driven fluxes are upwinded based on direction of total-velocity and, for example, where buoyancy-driven fluxes are represented as a sum of two buoyancy terms from two-phase flows. As an example, an upwind direction of buoyancy-driven fluxes in two-phase flows can be fixed such that a heavier fluid is downward and a lighter fluid is upward.

As an example, a method can include simulating where relative permeabilities are $C^1$ continuous. As an example, simulating can include at least one three-phase relative permeability correlation that is a monotonically increasing function of phase saturation.

As an example, simulating can include implementing an iterative solver for a nonlinear system of equations, for example, where the iterative solver implements an iterative Newton method.

As an example, a system can include a processor; memory operatively coupled to the processor; and one or more modules stored in the memory that include processor-executable instructions to instruct the system to receive data; simulate physical phenomena based at least in part on the data to generate simulation results; and output at least a portion of the simulation results.

As an example, one or more computer-readable storage media can include processor-executable instructions where the instructions include instructions to: receive data; simulate physical phenomena based at least in part on the data to generate simulation results; and output at least a portion of the simulation results.

As an example, $C^0$ may correspond to a connection without tangency (e.g., an edge), $C^1$ may correspond to a tangent connection and $C^2$ may correspond to a curve continuous connection. As an example: $C^0$ may represent just touching; $C^1$ may represent tangent, which could possibly include a sudden change in curvature; and $C^2$ may represent continuous curvature.

As an example, one or more computer-readable media may include computer-executable instructions to instruct a computing system to output information for controlling a process. For example, such instructions may provide for output to a sensing process, an injection process, a drilling process, an extraction process, etc. Such instructions may be communicated via one or more networks (e.g., cellular, satellite, Internet, etc.).

Figure 33:
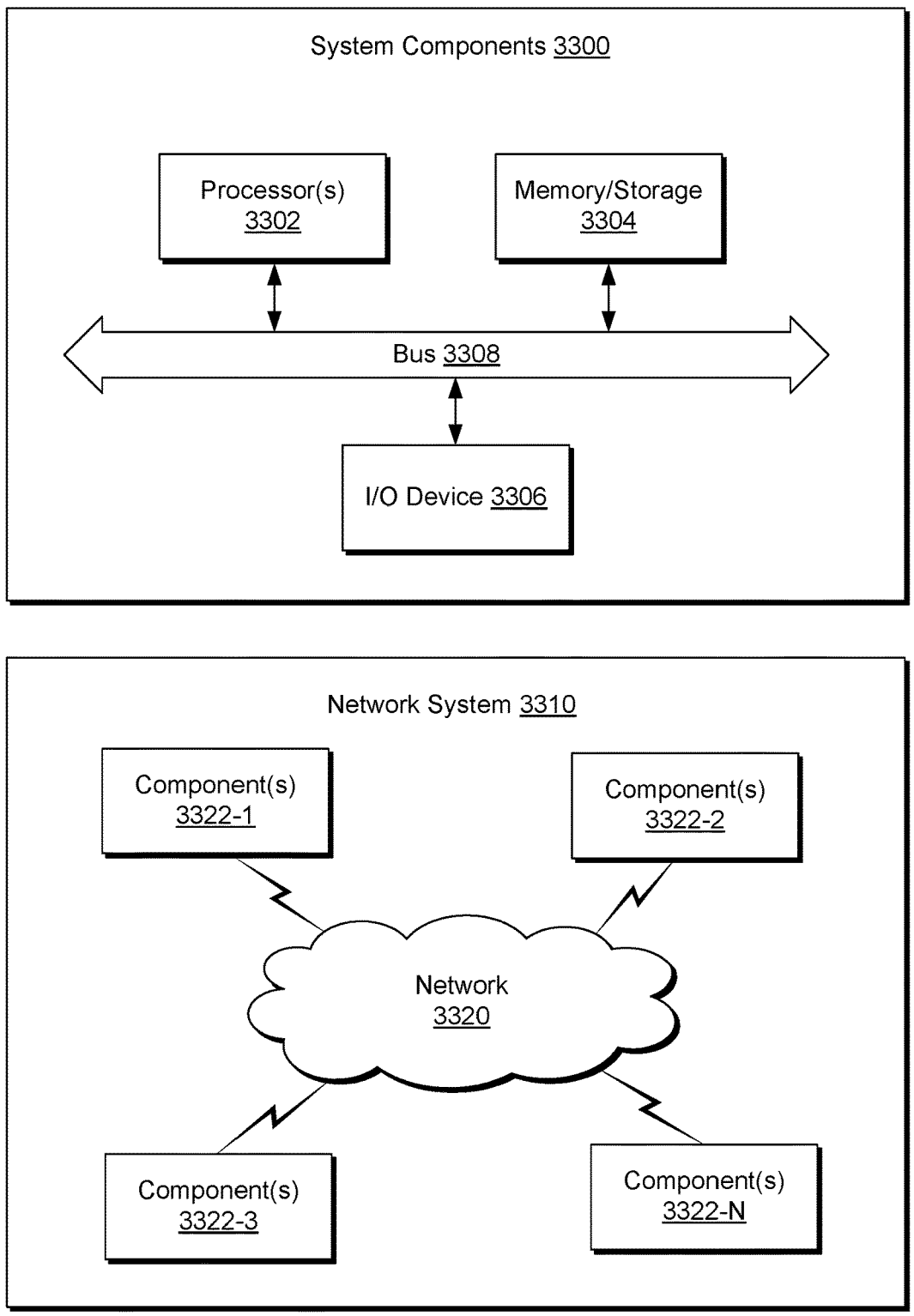
FIG. 33 illustrates example components of a system and a networked system.

FIG. 33 shows components of a computing system 3300 and a networked system 3310. The system 3300 includes one or more processors 3302, memory and/or storage components 3304, one or more input and/or output devices 3306 and a bus 3308. As an example, instructions may be stored in one or more computer-readable media (e.g., memory/storage components 3304). Such instructions may be read by one or more processors (e.g., the processor(s) 3302) via a communication bus (e.g., the bus 3308), which may be wired or wireless. The one or more processors may execute such instructions to implement (wholly or in part) one or more attributes (e.g., as part of a method). A user may view output from and interact with a process via an I/O device (e.g., the device 3306). As an example, a computer-readable medium may be a storage component such as a physical memory storage device, for example, a chip, a chip on a package, a memory card, etc. (e.g., a computer-readable storage medium).

As an example, components may be distributed, such as in the network system 3310. The network system 3310 includes components 3322-1, 3322-2, 3322-3, . . . 3322-N. For example, the components 3322-1 may include the processor(s) 3302 while the component(s) 3322-3 may include memory accessible by the processor(s) 3302. Further, the component(s) 3302-2 may include an I/O device for display and optionally interaction with a method. The network may be or include the Internet, an intranet, a cellular network, a satellite network, etc.

Although a few example embodiments have been described in detail above, those skilled in the art will readily appreciate that many modifications are possible in the example embodiments without materially departing from the embodiments of the present disclosure. Accordingly, such modifications are intended to be included within the scope of this disclosure as defined in the following claims. In the claims, means-plus-function clauses are intended to cover the structures described herein as performing the recited function and not just structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

BIBLIOGRAPHY

The following documents are incorporated by reference herein:
1. K. Aziz and A. Settari. Petroleum Reservoir Simulation. Elsevier Sci. Pub., London, 1979.
2. L. E. Baker. Three-phase relative permeability correlations. In Proceedings of the SPE/DOE Enhanced Oil Recovery Symposium: SPE/DOE 17369, pages 539-553, Tulsa, Okla., 1988.
3. J. B. Bell, J. A. Trangenstein, and G. R. Shubin. Conservation laws of mixed type describing three-phase flow in porous media. SIAM J. Appl. Math., 46:1000-1017, 1986.
4. Y. Brenier and J. Jaffre. Upstream differencing for multiphase flow in reservoir simulation. SIAM J. Numer. Anal., 28:685-696, 1991.
5. M. G. Crandall and A. Majda. Monotone difference approximations for scalar conservative laws. Math. of Computation, 34:1-21, 1980.
6. J. K. Dietrich and P. L. Bondor. Three-phase oil relative permeability models. In Proceedings of the 1976 SPE Annual Technical Conference and Exhibitions: SPE 6044, New Orleans, La., October 1976.
7. L. J. Durlofsky. A triangle based mixed finite element-finite volume technique for modeling two phase flow through porous media. J. Comp. Phys., 105:252-266, 1993.
8. G. Enchery, R. Masson, S. Wolf, and R. Eymard. Mathematical and numerical study of an industrial scheme for two-phase flows in porous media under gravity. Computational Methods in Applied Mathematics, 2(4):325-353, 2002.

9. R. E. Guzm'an and F. J. Fayers. Mathematical properties of three-phase flow equations. SPEJ, 2:291-300, 1997.
10. F. P. Hamon and H. A. Tchelepi. Analysis of hybrid upwinding for fully-implicit simulations of multiphase flow with gravity. SIAM J. Numer. Anal., in preparation, 2015.
11. A. Heiba. Three-phase relative permeability. Chevron Oil Field Research Company Technical Memorandum, 1987.
12. A. Heiba, H. T. Davis, and L. E. Scriven. Statistical network theory of three-phase relative permeabilities. In Proceedings of the SPE/DOE Fourth Symposium on Enhanced Oil Recovery: SPE/DOE 12690, pages 121-134, Tulsa, Okla., 1984.
13. A. Hossin. Three-phase relative permeability measurements. MS. Thesis, Chem. Eng. Dept., University of Birmingham, UK, 1961.
14. M. D. Jackson and M. J. Blunt. Elliptic regions and stable solutions for three-phase flow in porous media. Transport in Porous Media, 48:249-269, 2002.
15. J. Jaffre. Flux calculation at the interface between two rock types for two phase flow in porous media. Transport in Porous Media, 21:195-207, 1995.
16. P. Jenny, H. A. Tchelepi, and S. H. Lee. Unconditionally convergent nonlinear solver for hyperbolic conservation laws with s-shaped flux functions. J. Comp. Phys, 228: 7497-7512, 2009.
17. R. Juanes and T. Patzek. Relative permeabilities for strictly hyperbolic models of three-phase flow in porous media. Transport in Porous Media, 57:125-152, 2004.
18. F. Kwok and H. A. Tchelepi. Convergence of implicit monotone schemes with applications in multiphase flow in porous media. SIAM J. Num. Anal., 46:2662-2687, 2008.
19. S. H. Lee, Y. Efendiev, and H. A. Tchelepi. Hybrid upwind discretization of nonlinear multiphase flow with gravity. Adv. Water Resources, accepted for publication, 2015.
20. B. Li and H. A. Tchelepi. Nonlinear analysis of newton-based solvers for multiphase transport in porous media with viscous and buoyancy forces. JCP, accepted for publication, 2015.
21. M. J. Oak, L. E. Baker, and D. C. Thomas. Three-phase relative permeability of brea sandstone. J. Pet. Tech., pages 1057-1061, 1990.
22. D. W. Peaceman. Fundamentals of Numerical Reservoir Simulation. Elsevier Sci. Pub., New York, 1977.
23. P. Sammon. An analysis of upstream differencing. SPE Res. Eng., pages 1053-1056, 1988.
24. R. Sanders. On convergence of monotone finite difference schemes with variable differencing. Methods of Computation, 40(161):91-106, 1983.
25. H. L. Stone. Estimation of three-phase relative permeability and residual oil data. J. Can. Pet. Tech., 12:53-61, 1973.
26. J. A. Trangenstein. Three-phase flow with gravity. Contemp. Math., 100:147-159, 1989.
27. X. Wang and H. A. Tchelepi. Trust-region based solver for nonlinear transport in heterogeneous porous media. JCP, 253:114-137, 2013.
28. R. Younis, H. A. Tchelepi, and K. Aziz. Adaptively localized continuation Newton: Nonlinear solvers that converges all the time. SPEJ, pages 526-544, 2010.
29. Adimuthi, J. Jaffre, and G. D. Veerappa Gowda. Godunov m-type methods for conservative laws with a flux function discontinuous in space. SIAM J. Numer. Anal., 42:179-208, 2004.
30. K. H. Coats. A note on impes and some impes-based simulation models. SPEJ, pages 245-251, 2000.
31. S. Godunov. A finite difference method for the numerical computation of discontinuous solutions of the equations of fluid dynamics. Math. Sbornik, 47:271-306, 1959.
32. P. Jenny, S. H. Lee, and H. A. Tchelepi. An adaptive fully implicit multi-scale finite-volume algorithm for multiphase flow in porous media. J. Comp. Phys., 217:627-641, 2006.
33. R. J. LeVeque. Numerical Methods for Conservation Laws. Birkhauser Verlag, Basel, 1992.
34. S. Mishra and J. Ja.re. On the upstream mobility scheme for two-phase flow in porous media. Comp. Geosciences, 14:105-124, 2010.
35. H. A. Tchelepi, P. Jenny, S. H. Lee, and C. Wolfsteiner. Adaptive multiscale finite volume framework for reservoir simulation. SPEJ, 12:188-195, 2007.
36. S. Tveit and I. Aavatsmark. Errors in the upstream mobility scheme for countercurrent two-phase flow in heterogeneous porous media. Comp. Geosciences, 16:809-825, 2012.

The invention claimed is:

1. A method of operating a reservoir simulator comprising:
receiving information associated with a geologic environment that comprises a reservoir;
based at least in part on the information, simulating multiphase fluid flow in a digital representation of the reservoir of the geologic environment using a viscous flow upwind scheme that comprises a total velocity direction of a total velocity based on individual phase velocities and a buoyancy flow upwind scheme that comprises a gravity direction, wherein utilization of the schemes stabilizes iterative convergence to a solution of simulated values; and
outputting at least a portion of the simulated values of the solution.

2. The method of claim 1 wherein the simulating comprises discretizing a system of equations via a grid that defines grid cells.

3. The method of claim 2 wherein an interface exists between two adjacent grid cells.

4. The method of claim 3 wherein the interface comprises an associated viscous flow equation and an associated buoyancy flow equation.

5. The method of claim 1 where the multiphase flow comprises multiphase flow in at least one porous medium.

6. The method of claim 1 wherein the simulating comprises computing viscous flux of the viscous flow as being dependent on the total velocity based on the individual phase velocities and buoyancy flux of the buoyancy flow as being independent of the total velocity.

7. The method of claim 1 wherein the simulating implements the viscous flow upwind scheme and the buoyancy flow upwind scheme as a hybrid upwind scheme for nonlinear three-phase flow in the presence of viscous forces and buoyancy forces.

8. The method of claim 1 wherein the simulating comprises computing co-current flow and counter-current flow.

9. The method of claim 1 wherein the simulating comprises utilizing relative permeabilities that are C1 continuous.

10. The method of claim 1 wherein the simulating comprises utilizing at least one three-phase relative permeability correlation that is a monotonically increasing function of phase saturation.

11. The method of claim 1 wherein the simulating comprises implementing an iterative solver of the reservoir simulator for a nonlinear system of equations wherein the reservoir simulator comprises at least one processor.

12. The method of claim 1 comprising, based at least in part on one or more of the simulated values of the solution, issuing an instruction for controlling a fluid flow process in the geologic environment.

13. A system comprising:
a processor;
a memory operatively coupled to the processor; and
one or more modules stored in the memory that comprise processor-executable instructions to instruct the system to:
  receive information associated with a geologic environment that comprises a reservoir;
  based at least in part on the information, simulate multiphase fluid flow in a digital representation of the reservoir of the geologic environment using a viscous flow upwind scheme that comprises a total velocity direction of a total velocity based on individual phase velocities and a buoyancy flow upwind scheme that comprises a gravity direction, wherein utilization of the schemes stabilizes iterative convergence to a solution of simulated values; and
  output at least a portion of the simulated values of the solution.

14. One or more computer-readable storage media that comprise processor-executable instructions wherein the instructions comprise instructions to:
  receive information associated with a geologic environment that comprises a reservoir;
  based at least in part on the information, simulate multiphase fluid flow in a digital representation of the reservoir of the geologic environment using a viscous flow upwind scheme that comprises a total velocity direction of a total velocity based on individual phase velocities and a buoyancy flow upwind scheme that comprises a gravity direction, wherein utilization of the schemes stabilizes iterative convergence to a solution of simulated values; and
  output at least a portion of the simulated values of the solution.

* * * * *